(12) United States Patent
Ganti et al.

(10) Patent No.: US 11,532,536 B2
(45) Date of Patent: **\*Dec. 20, 2022**

(54) MOBILE PHONE AND OTHER COMPUTE DEVICE COOLING ARCHITECTURE

(71) Applicant: Frore Systems Inc., San Jose, CA (US)

(72) Inventors: Suryaprakash Ganti, Los Altos, CA (US); Seshagiri Rao Madhavapeddy, La Jolla, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/999,771

(22) Filed: Aug. 21, 2020

(65) Prior Publication Data

US 2020/0381339 A1    Dec. 3, 2020

Related U.S. Application Data

(63) Continuation of application No. 16/369,835, filed on Mar. 29, 2019, now Pat. No. 10,788,034.

(Continued)

(51) Int. Cl.
*H01L 23/42*    (2006.01)
*H01L 23/473*   (2006.01)
(Continued)

(52) U.S. Cl.
CPC ............ *H01L 23/4735* (2013.01); *B06B 1/06* (2013.01); *F04B 17/003* (2013.01);
(Continued)

(58) Field of Classification Search
CPC .................................................. H01L 21/0243
See application file for complete search history.

(56) References Cited

U.S. PATENT DOCUMENTS

| 4,251,031 A | 2/1981 | Martin |
| 4,450,505 A | 5/1984 | Mittal |

(Continued)

FOREIGN PATENT DOCUMENTS

| CN | 101032718 | 9/2007 |
| CN | 101718235 | 6/2010 |

(Continued)

OTHER PUBLICATIONS

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

(Continued)

*Primary Examiner* — Kiet M Doan
(74) *Attorney, Agent, or Firm* — Van Pelt, Yi & James LLP

(57) ABSTRACT

A system for cooling a mobile phone and method for using the system are described. The system includes an active piezoelectric cooling system, a controller and an interface. The active piezoelectric cooling system is configured to be disposed in a rear portion of the mobile phone distal from a front screen of the mobile phone. The controller is configured to activate the active piezoelectric cooling system in response to heat generated by heat-generating structures of the mobile phone. The interface is configured to receive power from a mobile phone power source when the active piezoelectric cooling system is activated.

19 Claims, 21 Drawing Sheets

Related U.S. Application Data

(60) Provisional application No. 62/717,474, filed on Aug. 10, 2018.

(51) Int. Cl.

| | | |
|---|---|---|
| *B06B 1/06* | (2006.01) | |
| *H05K 7/20* | (2006.01) | |
| *F04B 43/04* | (2006.01) | |
| *F04B 43/09* | (2006.01) | |
| *F04B 45/04* | (2006.01) | |
| *F04B 45/047* | (2006.01) | |
| *F04B 53/10* | (2006.01) | |
| *F04D 33/00* | (2006.01) | |
| *F25B 21/02* | (2006.01) | |
| *H01L 23/427* | (2006.01) | |
| *H01L 23/433* | (2006.01) | |
| *H01L 23/46* | (2006.01) | |
| *F04B 17/00* | (2006.01) | |
| *H01L 41/00* | (2013.01) | |
| *H01L 41/02* | (2006.01) | |
| *H01L 41/08* | (2006.01) | |
| *H01L 41/09* | (2006.01) | |
| *H04M 1/02* | (2006.01) | |

(52) U.S. Cl.
CPC .......... *F04B 43/046* (2013.01); *F04B 43/095* (2013.01); *F04B 45/043* (2013.01); *F04B 45/047* (2013.01); *F04B 53/1077* (2013.01); *F04D 33/00* (2013.01); *F25B 21/02* (2013.01); *H01L 23/42* (2013.01); *H01L 23/427* (2013.01); *H01L 23/433* (2013.01); *H01L 23/4336* (2013.01); *H01L 23/46* (2013.01); *H01L 23/473* (2013.01); *H01L 41/00* (2013.01); *H01L 41/02* (2013.01); *H01L 41/08* (2013.01); *H01L 41/09* (2013.01); *H01L 41/0926* (2013.01); *H01L 41/0973* (2013.01); *H04M 1/0202* (2013.01); *H05K 7/20* (2013.01); *H05K 7/20009* (2013.01); *H05K 7/2039* (2013.01); *H05K 7/20272* (2013.01); *H05K 7/20281* (2013.01); *F25B 2321/023* (2013.01); *F25B 2321/025* (2013.01); *F25B 2321/0212* (2013.01); *F25B 2321/0252* (2013.01)

(56) References Cited

U.S. PATENT DOCUMENTS

| | | |
|---|---|---|
| 4,595,338 A | 6/1986 | Kolm |
| 4,667,877 A | 5/1987 | Yao |
| 4,751,713 A | 6/1988 | Affleck |
| 4,780,062 A | 10/1988 | Yamada |
| 4,834,619 A | 5/1989 | Walton |
| 4,923,000 A | 5/1990 | Nelson |
| 5,008,582 A | 4/1991 | Tanuma |
| 5,673,171 A | 9/1997 | Varghese |
| 5,758,823 A | 6/1998 | Glezer |
| 5,796,152 A | 8/1998 | Carr |
| 5,821,962 A | 10/1998 | Kudo |
| 5,861,703 A | 1/1999 | Losinski |
| 6,211,598 B1 | 4/2001 | Dhuler |
| 6,232,680 B1 | 5/2001 | Bae |
| 6,450,773 B1 | 9/2002 | Upton |
| 6,483,419 B1 | 11/2002 | Weaver |
| 6,498,725 B2 | 12/2002 | Cole |
| 6,531,947 B1 | 3/2003 | Weaver |
| 6,570,750 B1 | 5/2003 | Calcatera |
| 6,588,497 B1 | 7/2003 | Glezer |
| 6,598,960 B1 | 7/2003 | Cabal |
| 6,612,816 B1 | 9/2003 | Vanden Brande |
| 6,650,542 B1 | 11/2003 | Chrysler |
| 6,713,942 B2 | 3/2004 | Raman |
| 6,771,158 B2 | 8/2004 | Lee |
| 6,853,068 B1 | 2/2005 | Djekic |
| 6,876,047 B2 | 4/2005 | Cunningham |
| 6,996,441 B1 | 2/2006 | Tobias |
| 7,023,697 B2 | 4/2006 | Pokharna |
| 7,031,155 B2 | 4/2006 | Sauciuc |
| 7,081,699 B2 | 7/2006 | Keolian |
| 7,258,464 B2 | 8/2007 | Morris |
| 7,282,837 B2 | 10/2007 | Scher |
| 7,321,184 B2 | 1/2008 | Lee |
| 7,324,323 B2 | 1/2008 | Aksyuk |
| 7,420,807 B2 | 9/2008 | Mikubo |
| 7,492,076 B2 | 2/2009 | Heim |
| 7,516,776 B2 | 4/2009 | Bezama |
| 7,553,135 B2 | 6/2009 | Cho |
| 7,714,433 B2 | 5/2010 | Campini |
| 7,742,299 B2 | 6/2010 | Sauciuc |
| 7,972,124 B2 | 7/2011 | Hirata |
| 8,051,905 B2 | 11/2011 | Arik |
| 8,289,701 B2 | 10/2012 | Suzuki |
| 8,297,947 B2 | 10/2012 | Van Rensburg |
| 8,308,453 B2 | 11/2012 | Yamamoto |
| 8,308,454 B2 | 11/2012 | Kamitani |
| 8,520,383 B2 | 8/2013 | Park |
| 8,520,384 B2 | 8/2013 | Park |
| 8,659,896 B2 | 2/2014 | Dede |
| 8,678,787 B2 | 3/2014 | Hirata |
| 8,684,707 B2 | 4/2014 | Kanai |
| 8,736,139 B2 | 5/2014 | Lee |
| 8,899,944 B2 | 12/2014 | Kanai |
| 8,934,240 B2 | 1/2015 | Yu |
| 9,179,575 B2 | 11/2015 | Yao |
| 9,215,520 B2 | 12/2015 | De Bock |
| 9,252,069 B2 | 2/2016 | Bhunia |
| 9,466,452 B1 | 10/2016 | Liu |
| 9,523,367 B2 | 12/2016 | Lucas |
| 9,846,461 B2 | 12/2017 | Tang |
| 9,976,547 B2 | 5/2018 | Tanaka |
| 10,480,502 B2 | 11/2019 | Hirata |
| 10,943,850 B2 | 3/2021 | Ganti |
| 11,043,444 B2 | 6/2021 | Ganti |
| 11,242,241 B2 | 2/2022 | Menon |
| 2002/0163782 A1 | 11/2002 | Cole |
| 2002/0184907 A1 | 12/2002 | Vaiyapuri |
| 2004/0023614 A1 | 2/2004 | Koplin |
| 2004/0190251 A1 | 9/2004 | Prasher |
| 2004/0218362 A1 | 11/2004 | Amaro |
| 2004/0244405 A1 | 12/2004 | Kim |
| 2004/0253130 A1 | 12/2004 | Sauciuc |
| 2005/0074662 A1 | 4/2005 | Cho |
| 2005/0089415 A1 | 4/2005 | Cho |
| 2005/0110841 A1 | 5/2005 | Silverbrook |
| 2005/0178529 A1 | 8/2005 | Suzuki |
| 2005/0211418 A1 | 9/2005 | Kenny |
| 2005/0225213 A1 | 10/2005 | Richards |
| 2005/0266286 A1 | 12/2005 | Sato |
| 2005/0280994 A1 | 12/2005 | Yazawa |
| 2006/0147324 A1 | 7/2006 | Tanner |
| 2006/0164805 A1 | 7/2006 | Meinders |
| 2006/0181848 A1 | 8/2006 | Kiley |
| 2006/0208613 A1 | 9/2006 | Scher |
| 2006/0232167 A1 | 10/2006 | Jordan |
| 2006/0236710 A1 | 10/2006 | Vaiyapuri |
| 2006/0250773 A1 | 11/2006 | Campbell |
| 2006/0250774 A1 | 11/2006 | Campbell |
| 2006/0260784 A1 | 11/2006 | Bezama |
| 2007/0020124 A1 | 1/2007 | Singhal |
| 2007/0048154 A1 | 3/2007 | Sapir |
| 2007/0076375 A1 | 4/2007 | Mongia |
| 2007/0235180 A1 | 10/2007 | Ouyang |
| 2007/0274045 A1 | 11/2007 | Campbell |
| 2008/0041574 A1 | 2/2008 | Arik |
| 2008/0101965 A1 | 5/2008 | Zhang |
| 2008/0111866 A1 | 5/2008 | Silverbrook |
| 2008/0218972 A1 | 9/2008 | Sauciuc |
| 2008/0304979 A1 | 12/2008 | Lucas |
| 2009/0021908 A1 | 1/2009 | Patel |

(56) References Cited

U.S. PATENT DOCUMENTS

| | | |
|---|---|---|
| 2009/0050294 A1 | 2/2009 | Fedorov |
| 2009/0120621 A1 | 5/2009 | Sheinman |
| 2009/0167109 A1 | 7/2009 | Tomita |
| 2009/0174999 A1 | 7/2009 | Sauciuc |
| 2009/0232685 A1 | 9/2009 | Kamitani |
| 2010/0067191 A1 | 3/2010 | Arik |
| 2010/0074775 A1 | 3/2010 | Yamamoto |
| 2011/0063800 A1 | 3/2011 | Park |
| 2011/0068799 A1* | 3/2011 | Wolf ............... H01M 10/617 324/426 |
| 2011/0122582 A1 | 5/2011 | Park |
| 2011/0211020 A1 | 9/2011 | Silverbrook |
| 2011/0259557 A1 | 10/2011 | Chao |
| 2011/0277491 A1 | 11/2011 | Wu |
| 2011/0304240 A1* | 12/2011 | Meitav ............... H02N 2/181 310/319 |
| 2012/0063091 A1 | 3/2012 | Dede |
| 2012/0171062 A1 | 7/2012 | Kodama |
| 2013/0157729 A1 | 6/2013 | Tabe |
| 2013/0233523 A1 | 9/2013 | Parida |
| 2014/0052429 A1 | 2/2014 | Kelkar |
| 2014/0192485 A1 | 7/2014 | Rau |
| 2014/0216696 A1 | 8/2014 | Donnelly |
| 2015/0007965 A1 | 1/2015 | Joshi |
| 2015/0009631 A1 | 1/2015 | Joshi |
| 2015/0043164 A1 | 2/2015 | Joshi |
| 2015/0173237 A1 | 6/2015 | Lin |
| 2015/0308377 A1* | 10/2015 | Packard ............... F02K 3/00 60/230 |
| 2016/0358841 A1 | 12/2016 | Eid |
| 2016/0377072 A1 | 12/2016 | Wu |
| 2016/0377073 A1 | 12/2016 | Tanaka |
| 2017/0146039 A1 | 5/2017 | Lin |
| 2017/0276149 A1 | 9/2017 | Dusseau |
| 2017/0292537 A1 | 10/2017 | Barak |
| 2017/0363076 A1 | 12/2017 | Najafi |
| 2018/0061737 A1 | 3/2018 | Arik |
| 2018/0145010 A1 | 5/2018 | Fukuoka |
| 2018/0146573 A1 | 5/2018 | Chen |
| 2018/0146574 A1 | 5/2018 | Chen |
| 2018/0187672 A1 | 7/2018 | Tanaka |
| 2019/0067550 A1 | 2/2019 | Mou |
| 2019/0101938 A1 | 4/2019 | Mou |
| 2020/0049386 A1 | 2/2020 | Ganti |
| 2020/0229320 A1 | 7/2020 | Mou |
| 2021/0144884 A1 | 5/2021 | Mou |
| 2021/0176895 A1 | 6/2021 | Mukundan |
| 2021/0180723 A1 | 6/2021 | Mukundan |
| 2021/0183739 A1 | 6/2021 | Sathyamurthy |

FOREIGN PATENT DOCUMENTS

| | | |
|---|---|---|
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| TW | 20065493 | 10/2006 |
| TW | 201638469 | 11/2016 |
| TW | 542326 | 5/2017 |
| TW | 201814772 | 4/2018 |

OTHER PUBLICATIONS

H.Q. Li, "A High Frequency High Flow Rate Piezoelectrically Driven Mems Micropump", Solid-Slate Sensors, Acluators, and Microsyslems Workshop, Jun. 4-8, 2000, pp. 69-72.

Liu et al., Application Prospects of Microfluidics Technology in Electronic Chip Cooling Research, Cryo & Supercond, vol. 37, No. 9, Sep. 16, 2009.

* cited by examiner

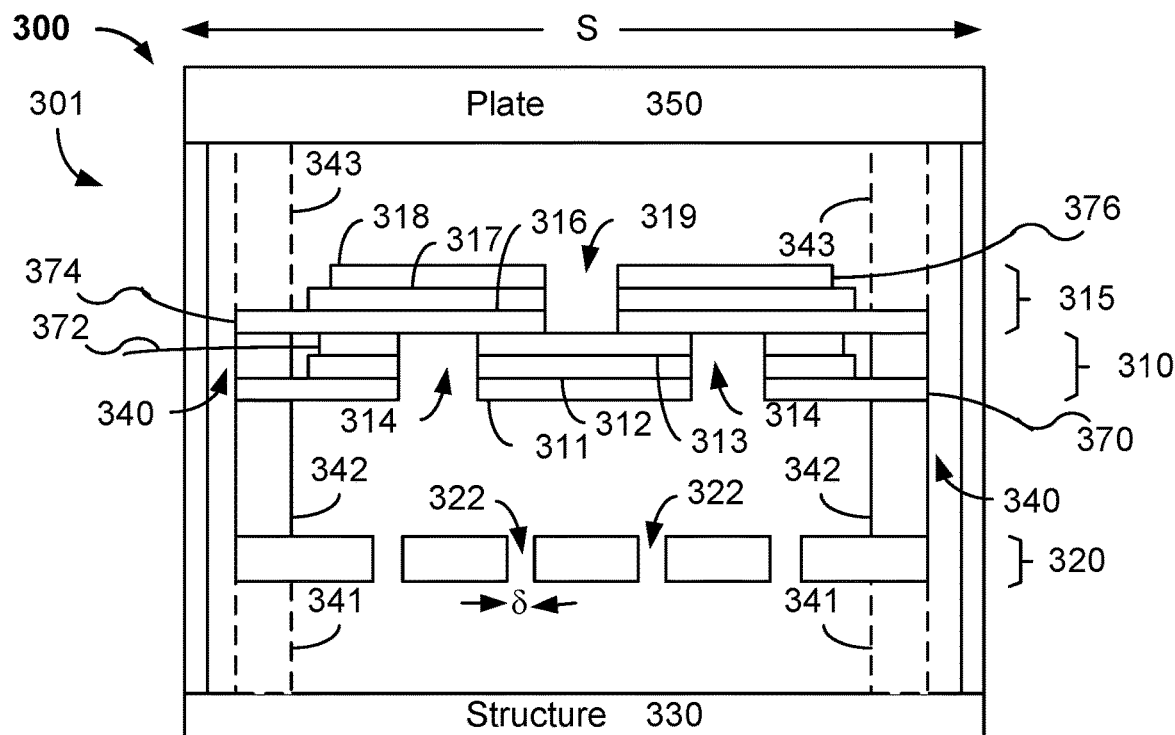
FIG. 3
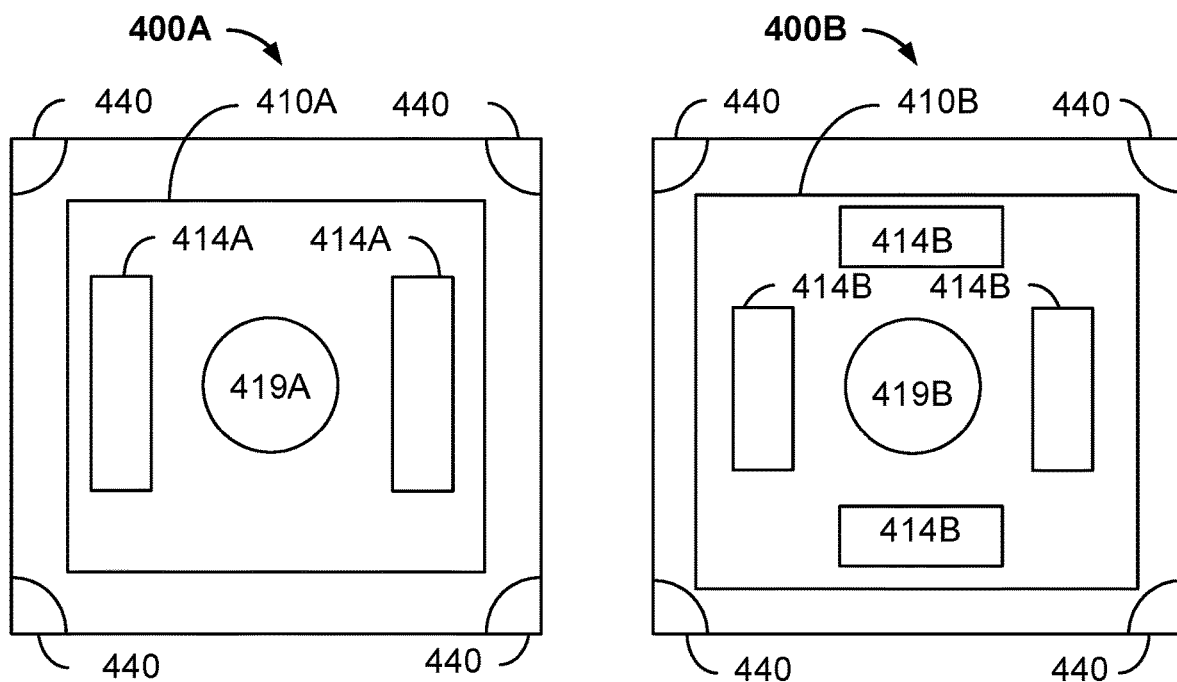
FIG. 4A
FIG. 4B

MOBILE PHONE AND OTHER COMPUTE DEVICE COOLING ARCHITECTURE

CROSS REFERENCE TO OTHER APPLICATIONS

This application is a continuation of U.S. patent application Ser. No. 16/369,835 entitled MOBILE PHONE AND OTHER COMPUTE DEVICE COOLING ARCHITECTURE filed Mar. 29, 2019, which claims priority to U.S. Provisional Patent Application No. 62/717,474 entitled PIEZO ELECTRIC MEMS-BASED ACTIVE COOLING FOR HEAT DISSIPATION IN COMPUTE DEVICES filed Aug. 10, 2018, both of which are incorporated herein by reference for all purposes.

BACKGROUND OF THE INVENTION

As semiconductor devices become increasingly powerful, the heat generated during operations also grows. For example, processors for mobile devices such as smartphones, tablets and notebooks can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed. As a result, performance of devices using the processors suffers. As technology moves to 5G and beyond, this issue is expected to be exacerbated.

Various mechanisms to address the generation of heat are known. Larger devices, such as laptop or desktop computers include an electric fan that can be energized in response to an increase in temperature of internal components. However, such fans are typically too large for mobile devices such as smartphones, may have limited efficacy because of the boundary layer of air existing at the surface of the components, provide a limited airspeed for air flow across the surface of the devices and may generate an excessive amount of noise. Passive cooling solutions may include a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to address excessive heat generated. Accordingly, additional cooling solutions are desired.

BRIEF DESCRIPTION OF THE DRAWINGS

Various embodiments of the invention are disclosed in the following detailed description and the accompanying drawings.

FIG. 3 is a diagram depicting an exemplary embodiment of a piezoelectric cooling system usable with a structure.

FIGS. 4A-4D are diagrams depicting exemplary embodiments of apertures, orifices and piezoelectric/chamber shapes in a piezoelectric cooling system usable with a structure.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system for cooling a mobile phone and method for using the system are described. The system includes an active piezoelectric cooling system, a controller and an interface. The active piezoelectric cooling system is configured to be disposed in a rear portion of a mobile phone distal from a front screen of the mobile phone. The controller is configured to activate the active piezoelectric cooling system in response to heat generated by heat-generating structures of the mobile phone. The interface is configured to receive power from a mobile phone power source when the active piezoelectric cooling system is activated.

Figure 1A:
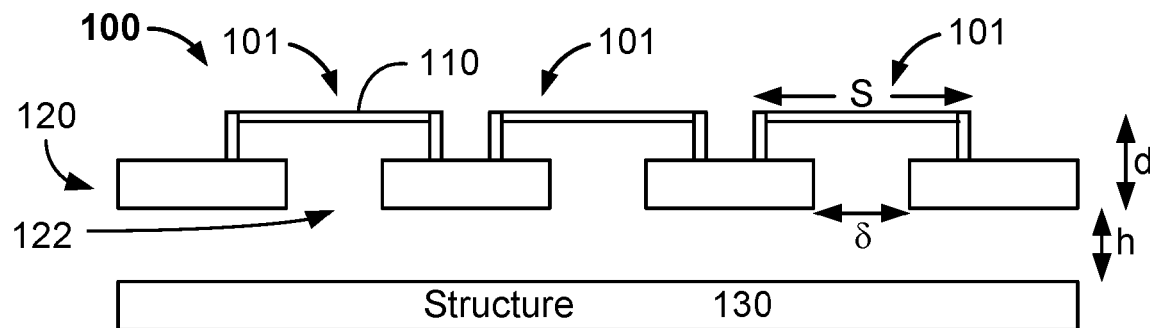
FIGS. 1A-1D are diagrams depicting exemplary embodiments of a cooling system usable with a structure.
Figure 1B:
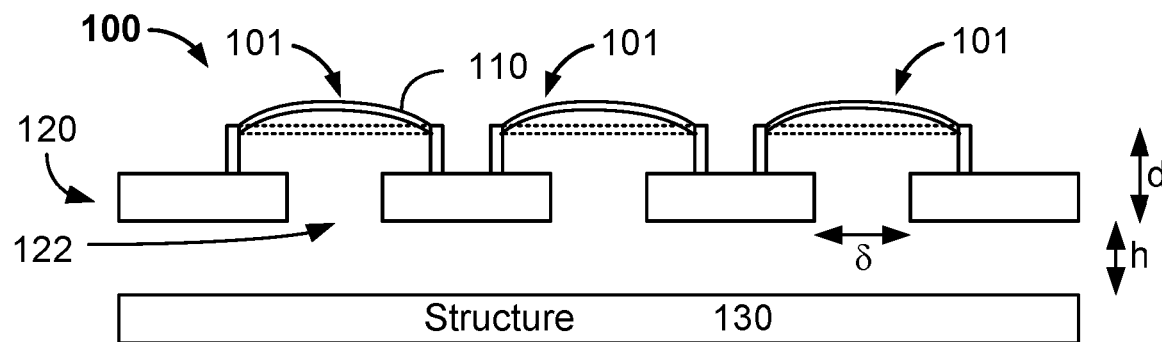
Figure 1C:
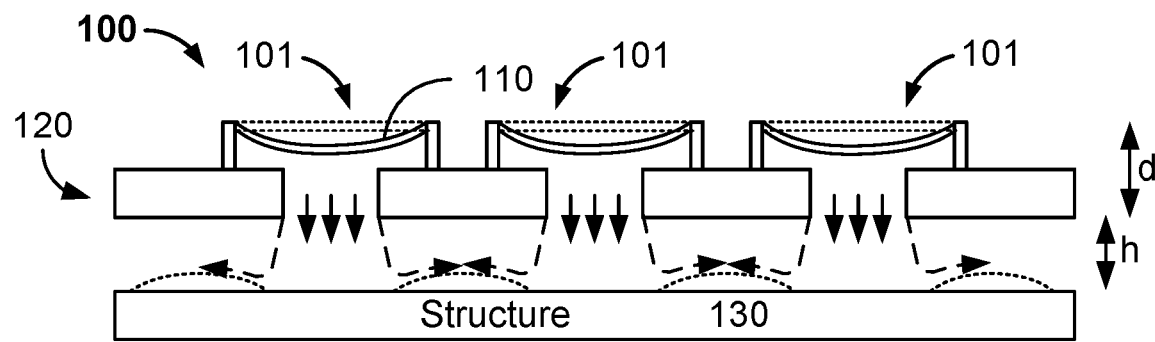
Figure 1D:
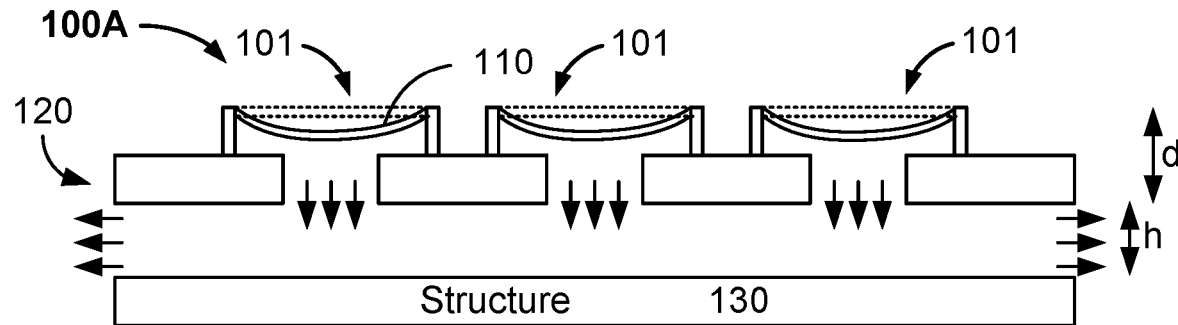

FIGS. 1A-1D are diagrams depicting exemplary embodiments of cooling systems 100 and 100A usable with a structure. For clarity, only certain components are shown and FIGS. 1A-1D are not to scale. FIGS. 1A-1C depict operation of cooling system 100, while FIG. 1D depicts cooling system 100A. Referring to FIGS. 1A-1C, the cooling system 100 is used in connection with a structure 130. Structure 130 generates or conducts heat from a nearby heat-generating object during operation and is desired to be cooled. Structure 130 may include semiconductor components(s) including individual integrated circuit components such as processors, other integrated circuit(s) and/or chip package(s); sensor(s); optical device(s); one or more batteries; or other component(s) of an electronic device such as a computing device; other electronic component(s) and/or other device(s) desired to be cooled and which may have limited space in which to place a cooling system. Such computing devices may include but are not limited to smartphones, tablet computers, laptop computers, hand held gaming systems, digital cameras, virtual reality headsets, augmented reality headsets, mixed reality headsets and other devices. Thus, cooling system 100 may be a micro-electro-mechanical system (MEMS) cooling system capable of residing within mobile computing devices. For example, the total height, d, of cooling system 100 may be less than one millimeter and in some embodiments does not exceed two hundred and fifty microns.

Cooling system 100 includes three cooling cells 101 in the embodiment shown. In other embodiments, another number of cooling cells 101 may be included and/or the cooling cells 101 may be arranged in another manner. For example, cooling cells 101 may be arranged in groups in order to cool selected portions of the structure 130. In some embodiments, cooling cells 101 may be included in one or more two-dimensional cooling arrays for a computing device. Cooling system 100 is also in communication with a fluid used to cool structure 130. In some embodiments, the fluid substantially surrounds cooling cells 101. The fluid may be a gas or a liquid. For example, in some embodiments, the fluid is air.

Each cooling cell 101 includes cooling element 110 that is in contact with a fluid. For clarity, only one cooling element 110 is labeled. Cooling element 110 has a first side distal from the structure 130 and a second side proximate to the structure 130. In some embodiments, cooling element 110 is substantially solid and flat. In the embodiment shown in FIGS. 1A-1C, the first side of cooling element 110 is the top of cooling element 110 and the second side is the bottom of cooling element 110. Cooling element 110 is actuated to vibrate as shown in FIGS. 1A-1C. For example, cooling element 110 may include a piezoelectric structure (not separately shown in FIGS. 1A-1D) residing on a substrate (not separately shown in FIGS. 1A-1D). Cooling element 110 may thus be a piezoelectric cooling element. Consequently, cooling element 110 and analogous cooling elements are referred to hereinafter as piezoelectric cooling element though it is possible that a mechanism other than a piezoelectric might be used to drive the cooling element in some embodiments. In some embodiments, piezoelectric cooling element 110 includes a piezoelectric layer on a stainless steel and/or Hastelloy substrate. In addition to the piezoelectric structure, piezoelectric cooling element 110 may also include one or more electrodes (not shown in FIGS. 1A-1D) used to drive the piezoelectric structure. Other layers (not shown) including but not limited to seed, capping, passivation or other layers might be included in piezoelectric cooling element 110 in some embodiments. Further, in some embodiments, cooling element 110 is "breathable", or capable of driving fluid from one side of the cooling element to the other using a vibrational motion (in contrast to a rotating motion of a fan blade). For example, cooling element 110 may vibrate closer to and further from structure 130 to drive fluid from the first (distal) side to the second (proximal) side. Such a capability is generally desired when cooling element 110 is used to cool structure 130. In such embodiments, cooling element 110 may have valve(s) and/or aperture(s) therein. In other embodiments, cooling element 110 may be used to macroscopically drive the fluid. In such embodiments, cooling element 110 may be further from surrounding structures and may not include a valve and/or aperture therein. However, for clarity, such structures are not shown in FIGS. 1A-1D.

Also shown in cooling cell 101 is orifice plate 120 having orifices 122 therein. Although one orifice 122 is shown for each cooling cell, in other embodiments, multiple orifices may be provided for each cooling cell 101. Further, the orifice 122 is shown as being centrally located in cooling cell 101. In other embodiments, orifice(s) 122 may be located elsewhere. Although symmetry may be desired, cooling cells 101 are not required to be symmetric. A single orifice plate 120 for multiple cooling cells 101 is shown in FIGS. 1A-1D. In other embodiments, multiple orifice plates may be used. For example, in some embodiments, each cooling cell 101 may have a separate orifice plate 120. In another embodiment, orifice plate 120 may be removed or orifices 122 may be considered to occupy substantially all of the region between piezoelectric cooling element 110 and structure 130.

As discussed above, cooling system 100 may be a MEMS device. Thus, the dimensions of cooling system 100 may be small. For example, cooling cells 101 may have a rectangular footprint with sides having a length, S, of not more than seven millimeters. In some such embodiments, S may be at least three millimeters. In some embodiments, cooling cells 101 are square. Orifice plate 120 may be located a distance, h, from the closest surface of structure 130 that is generating heat. In some embodiments, h is at least fifty microns and not more than five hundred microns. In some embodiments, h is not more than two hundred microns. In some embodiments, h is at least one hundred microns. Orifice plate 120 may have a thickness of at least ten and not more than twenty-five microns in some embodiments. The depth, d, of cooling cells 101 may be at least forty microns and not more than five hundred microns. In some embodiments, d is at least fifty microns and not more than three hundred microns. Thus, piezoelectric cooling elements 110 may be at least forty and not more than five hundred microns from orifice plate 120. Piezoelectric cooling elements 110 may be at least fifty and not more than five hundred microns from structure 130. In some embodiments, orifice plate 120 is at least fifty and not more than one hundred fifty microns thick. For example, orifice plate 120 may be nominally one hundred microns thick. In some embodiments, the entire thickness of cooling system 100 (e.g. h added to d) is not more than five hundred microns. In some embodiments, the entire thickness of cooling system 100 is at least two hundred fifty microns. In some embodiments, the diameters, δ, of orifices 122 are at least fifty microns and not more than two hundred microns. In some embodiments, orifices 122 occupy at least two percent and not more than five percent of the portion of the orifice plate 120 below cooling element 110. Thus, cooling element 110 and orifice plate 120 may be viewed as forming a chamber for each cooling cell 101. Such a chamber has an orifice 122 proximate to structure 130 that is generating heat. Although each cooling cell 101 is shown as identical (e.g. to within manufacturing tolerances), in other embodiments, different cooling cells 101 in a single array may be configured differently. For example, the diameter of the orifices, δ, the size S of the cell, and the depth, d, might differ. Further, as described below, cells 101 need not be driven in the same manner. For example, the amplitude of deflection and/or phase of cooling elements 110 may differ. In some embodiments, some cooling cells 101 are driven, while others are dormant.

FIG. 1A depicts piezoelectric cooling element 110 in a neutral position. Thus, cooling elements 110 are shown as substantially solid and flat. In operation, piezoelectric cooling elements 110 are actuated to vibrate between positions shown in FIGS. 1B and 1C. Referring to FIG. 1B, piezoelectric cooling element 110 in each cell 101 has been actuated to move away from (deform to be convex) structure 130. The neutral position of piezoelectric cooling elements 110 are shown by dotted lines. In some embodiments, cooling elements 110 include a fluid entry path (not shown in FIGS. 1A-1D) that allows the fluid to move from the distal side to the proximal side of cooling element 110, increasing the volume of fluid in the chambers formed by orifice plate 120 and piezoelectric cooling elements 110. For example, cooling elements 110 may include one or more apertures that are opened when actuated in a manner analogous to that shown in FIG. 1B. Such a fluid entry path would be substantially or completely closed in the situation shown in FIG. 1C. For example, cooling elements 110 may include active or passive valve(s) or analogous structure(s). In other embodiments, the fluid entry path may be formed in another region. For example, a valve may be included in the sides of cooling cells 101 or at the edges of piezoelectric cooling elements 110 in location(s) that allow fluid to be drawn from the distal to the proximal side of piezoelectric cooling elements 110. In some embodiments, aperture(s) may be located near the edges of cooling elements 110. In some embodiments, each cell 101 also includes one or more valves (not shown in FIGS. 1A-1D) for orifice plate 120. Such a valve substantially or completely closes orifices 122 when cooling element 110 draws fluid from the distal to the proximal side as shown in FIG. 1B. Such a valve improves the efficiency of the movement of fluid from the distal to the proximal side of cooling element 110. However, in alternate embodiments, such a valve might be omitted.

In the situation shown in FIG. 1C, piezoelectric cooling element 110 in each cell 101 has been actuated to move toward (deform to be concave) structure 130. The neutral position of piezoelectric cooling elements 110 are shown by dotted lines. Thus, the volume of fluid in the chambers formed by orifice plate 120 and piezoelectric cooling elements 110 has decreased. The volume of the chamber for each cooling cell 101 formed by orifice plate 120 and cooling element 110 may vary between one hundred twenty-five percent (FIG. 1B) and seventy-five percent (FIG. 1C) of the neutral volume (FIG. 1A). For example, in some embodiments, cells 101 having a depth, d, of at least one hundred microns, the peak-to-peak deflection (distance between the top of cooling element 110 in FIG. 1B and the top cooling element 110 in FIG. 1C) may be up to fifty microns. In some embodiments, the deflection of cooling element 110 is desired to be large in order to increase the volume of flow and/or speed of fluid through orifices 122. In such embodiments, the peak-to-peak deflection may be at least one hundred microns for a cell having a longest side (e.g. length S) of three through five millimeters. Other deflections are possible for other cell sizes. However, in some embodiments, the percentage change in volume is less than ten percent and greater than 0.1 percent. In some such embodiments, the percentage change in volume is less than five percent and greater than 0.1 percent. For example, the deflection of piezoelectric cooling element 110 may be ten microns or less for a height d of three hundred microns. In the embodiments above, cooling elements 110 may also be driven at resonance for reduced power operation, as described below. Cooling cells 101 are capable of moving fluid through orifices 122 to cool structure 130 in both cases.

Due to the vibrational motion of cooling elements 110 (and the attendant decrease in volume of the chamber from FIG. 1B to FIG. 1C), the fluid is pushed by cooling elements 110 through orifices 122 (not labeled in FIG. 1C for clarity). The motion of the fluid is shown by arrows through orifices 122. The fluid may spread as it travels away from orifice plate 120, as shown by dashed arrows in FIG. 1C. The fluid deflects off of the surface of structure 130 and travels along the channel between semiconductor structure 130 and orifice plate 120. Although all cooling cells 101 are shown in FIGS. 1A-1C as operating in phase, in other embodiments, cooling elements 110 may be out of phase or some cooling elements 110 are selectively actuated while other cooling elements 110 remain in the neutral position.

The motion between the positions shown in FIGS. 1B and 1C may be repeated. Thus, piezoelectric cooling elements 110 vibrate, drawing fluid from the distal to the proximal side of cooling elements 110 and pushing the fluid through orifices 122 and toward semiconductor structure 120. In some embodiments the frequency of vibration of piezoelectric cooling element(s) 110 during operation is at least 15 kHz. In some embodiments, the frequency is at least 20 kHz. Thus, piezoelectric cooling elements 110 may operate in the ultrasonic range. In some embodiments, the speed at which the fluid impinges on the surface of structure 130 is at least thirty meters per second. In some embodiments, the fluid is driven by piezoelectric cooling elements 110 at a speed of at least forty meters per second. In some such embodiments, the fluid has a speed of at least forty-five meters per second. In some embodiments, the fluid has a speed of at least fifty-five meters per second. Further, in some embodiments, fluid speeds of at least sixty meters per section and/or seventy-five meters per second may be achieved. However, higher speeds may be possible in some embodiments. Fluid speeds in the range of thirty meters per second or more may be achievable in part due to judicious selection of the diameters, δ, of orifices 122.

As indicated in FIG. 1C, the fluid driven toward structure 130 may move substantially normal (perpendicular) to the surface of structure 130. In other embodiments, the fluid motion may have a nonzero acute angle with respect to the normal to the surface of structure 130. In either case, the fluid may thin and/or form apertures in the boundary layer of fluid at the surface of structure 130. The boundary layer in one case is indicated by the curved dotted lines at the surface of structure 130 in FIG. 1C. As a result, transfer of heat from structure 130 may be improved. The fluid deflects off of the surface of structure 130, traveling along the surface of semiconductor structure 130. In some embodiments, the fluid moves in a direction substantially parallel to the surface of structure 130. Thus, heat from structure 130 may be extracted by the fluid. The fluid may exit the region between orifice plate 120 and semiconductor structure 130 at the edges of cooling cells 101. In other embodiments, chimneys (not shown in FIGS. 1A-1D) between cooling cells 101 allow fluid to be carried away from semiconductor structure 130 between cooling cells 101. In either case, the fluid may return to the distal side of cooling elements 110 where the fluid may exchange the heat transferred from structure 130 to another structure or to the ambient environment. The fluid may then be circulated through cooling cells 101 to extract additional heat. As a result, structure 130 may be cooled.

FIG. 1D depicts cooling system 100A analogous to cooling system 100. Cooling system 100A may be MEMS systems having dimensions in the ranges described above. Piezoelectric cooling system 100A operates in a manner analogous to piezoelectric cooling system 100. In the embodiment shown, an additional fluid flow substantially parallel to the surface of structure 130 is provided. This is depicted by arrows substantially parallel to the surface of structure 130. Although shown in opposite direction, in other embodiments, the fluid flow may be in the same direction. Consequently, motion of fluid along the surface of structure 130 may be increased, allowing for improved heat transfer.

Cooling systems 100 and 100A may more efficiently dissipate heat from structure 130. Because fluid impinges upon structure 130 with sufficient speed and in some embodiments substantially normal to the surface of structure 130, the boundary layer of fluid at the surface of structure 130 may be thinned and/or partially removed. Consequently, heat transfer between structure 130 and the moving fluid is improved. In some embodiments, the heat transfer may be at least three through six times the heat transfer if an electric fan were to blow air of equivalent mass flow parallel or orthogonal to the surface of structure 130. Because structure 130 is more efficiently cooled, structure 130 may be run at higher speed and/or power for longer times. For example, if structure 130 includes a high-speed processor, such a processor may be run for longer times before throttling. Thus, performance of a device utilizing structure 130 may be improved. Further, cooling systems 100 and 100A are MEMS devices. Thus, cooling systems 100 and 100A are small-having a total height not exceeding five hundred microns in some embodiments. Consequently, cooling systems 100 and 100A are suitable for use in mobile devices, such as smart phones, other mobile phones, virtual reality headsets, wearables and handheld games, in which limited space is available. Performance of mobile devices may thus be improved. Cooling systems 100 and 100A may also be used in other compute devices-both mobile (such as those discussed above and laptop computers) and non-mobile (such as desktop computers or smart televisions). Because piezoelectric cooling elements 110 may be vibrated at frequencies of 15 kHz or more, users may not hear any noise associated with actuation of cooling elements 110. If driven at or near resonance frequency for the piezoelectric cooling elements 110, the power used in operating cooling systems 100 and 100A may be significantly reduced. Thus, the benefits of improved, quiet cooling may be achieved with limited additional power. The cooling power of system 100 and/or 100A may be further tuned by engineering the number of cells 101 used and/or the voltage at which each cell is driven. Consequently, performance of devices incorporating cooling systems 100 and/or 100A may be improved.

Figure 2A:
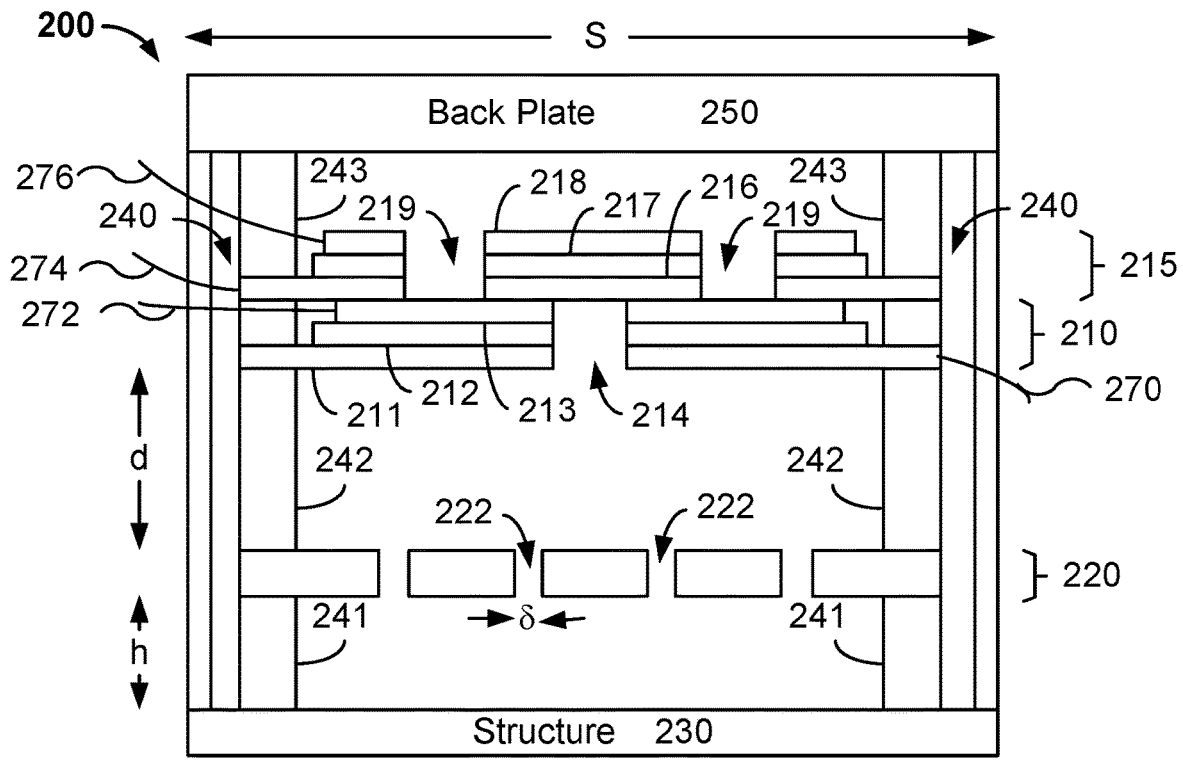
FIGS. 2A-2B are diagrams depicting an exemplary embodiment of a piezoelectric cooling system usable with a structure.
Figure 2B:
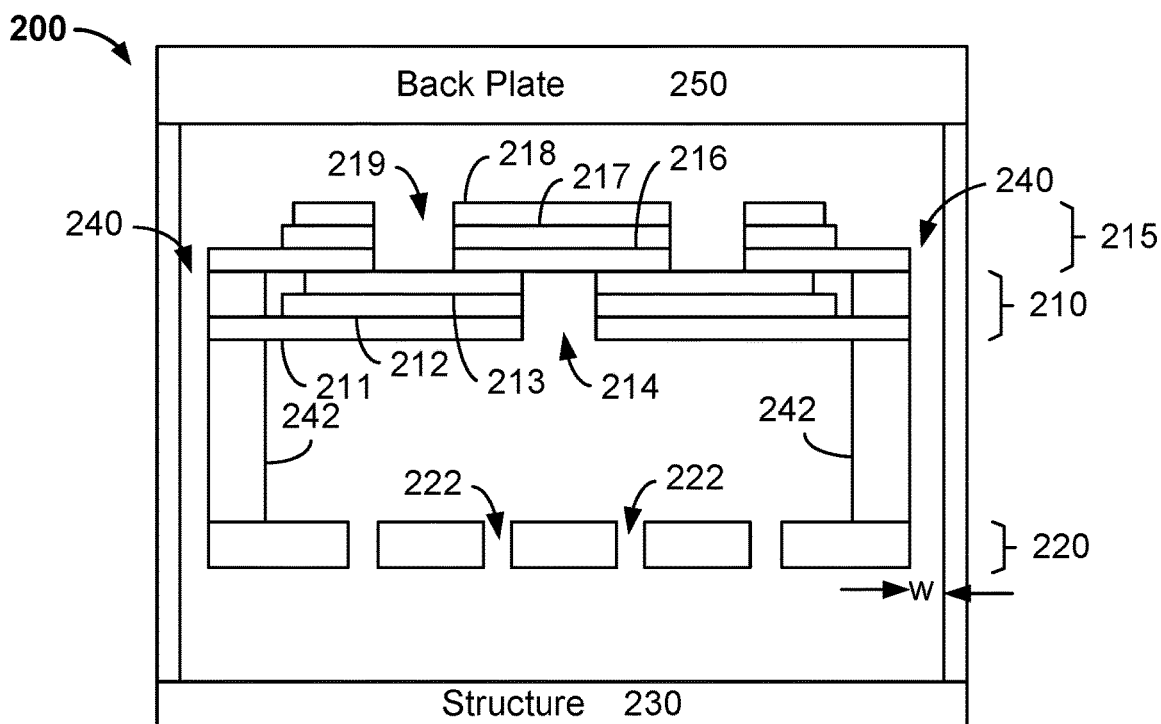

FIGS. 2A-2B are diagrams depicting an exemplary embodiment of a piezoelectric cooling system 200 usable with a semiconductor structure. FIGS. 2A and 2B are cross-sectional views taken at an angle from each other. For clarity, only certain components are shown and FIGS. 2A-2B are not to scale. Piezoelectric cooling system 200 is used in connection with a structure 230. Structure 230 generates heat during operation and is desired to be cooled. Structure 230 is analogous to structure 130. Piezoelectric cooling system 200 may fit within mobile computing devices and is a MEMS cooling device. Piezoelectric cooling system 200 may also be viewed as a single cell in a larger cooling system that may include multiple cells/piezoelectric cooling systems 200. Also shown in FIGS. 2A-2B is back plate 250 which may be part of the device, such as a smart phone or other mobile phone, in which piezoelectric cooling system 200 resides.

Piezoelectric cooling system 200 includes piezoelectric cooling element 210 that is analogous to piezoelectric cooling elements 110 and orifice plate 220 that is analogous to orifice plate 120. Orifice plate 220 thus includes multiple apertures 222 (of which only two are labeled) analogous to apertures 122. Also shown are valve 215, chimneys 240, spacers 241, 242 and 243 and leads 270, 272, 274 and 276. Spacers 241 separate orifice plate 220 from structure 230.

Piezoelectric cooling system 200 may be a MEMS device and thus may have dimensions analogous to those described above. Piezoelectric cooling system/cell 200 may have a rectangular footprint with sides having a length, S, of at least three millimeters and not more than seven millimeters. In the embodiment shown, piezoelectric cooling system 200 is square. Other footprints are, however, possible. Spacer 241 has a height, h, of at least than fifty microns and not more than two hundred microns. In some embodiments, h is at least one hundred microns. Spacers 242 have a depth, d, of at least fifty microns and not more than three hundred microns. In some embodiments, spacers 242 are at least seventy-five microns and not more than two hundred microns in height. Cooling element 210 may be at least thirty microns thick and not more than fifty microns thick. In some embodiments, orifice plate 220 is at least fifty and not more than one hundred fifty microns thick. In some embodiments, the entire thickness of piezoelectric cooling system 200 is at least two hundred and fifty microns and not more than five hundred microns. In some embodiments, the diameter, δ, of orifices 222 are at least fifty microns and not more than two hundred microns. In some embodiments, orifices 222 are at least one hundred microns and not more than two hundred microns wide. In other embodiments, other widths are possible. In some embodiments, orifices 222 occupy at least two percent and not more than five percent of the portion of the orifice plate 220 below cooling element 210. Spacers 243 are standoffs to the back plate 250. Spacers 243 protect piezoelectric cooling element 210 and valve 215 from physically contacting back plate 250 (or other structure) during operation.

Also shown are chimneys 240. As indicated more clearly in FIG. 2B, chimneys 240 provide a return path for fluid from near structure 230 (on the proximal side of piezoelectric cooling element 210) to the distal side of piezoelectric cooling element 210. In the embodiment shown, chimneys 240 have a width, w, of at least 0.75 mm to not more than 1.5 mm. The pressure differential between the center of piezoelectric cooling system 200 and edges/chimneys 240 is desired to be small to promote the free flow of the fluid through the system. In some embodiments the area of each chimney 240 exceeds the total area of all of the orifices 222. In the embodiment shown, there are four chimneys for each piezoelectric cooling system/cell 200. Consequently, chimneys 240 have greater than four times the total area of orifices 222. In another embodiment, a different number of chimneys may be used.

Piezoelectric cooling element 210 is a multilayer structure. Three layers 211, 212 and 213 are shown. In some embodiments, piezoelectric cooling element 210 may include additional layers such as seed and passivation layers (not shown). In some embodiments, piezoelectric cooling element 210 is at least ten microns thick and not more than twenty-five microns thick. Piezoelectric cooling element 210 includes a substrate 211, piezoelectric layer 212 and actuator electrode 213. In some embodiments, substrate 211 is stainless steel and/or Hastelloy. Stainless steel and/or Hastelloy may be selected because of its relatively low coefficient of thermal expansion, stiffness characteristics, high fatigue life and ability to undergo high temperature processing in formation of piezoelectric cooling element 210. As can be seen in FIG. 2A, substrate 211 and actuator electrode 213 are connected to leads 270 and 272, respectively. By driving a voltage difference between leads 270 and 272, and thus between actuator electrode 213 and substrate 211, piezoelectric layer 212 can be induced to move. Consequently, piezoelectric cooling element 210 vibrates, as described above. In the embodiment shown, piezoelectric cooling element 210 also includes an aperture 214. In the embodiment shown, piezoelectric cooling element 210 includes a single aperture 214 that is centrally located. In other embodiments, piezoelectric cooling element 210 may include another number of apertures and/or include aperture(s) that are not centrally located.

Valve 215 includes a substrate 216, piezoelectric layer 217 and electrode 218. In some embodiments, valve 215 is at least ten microns thick and not more than twenty-five microns thick. Thus, valve 215 may be analogous to piezoelectric cooling element 210 and can be considered to be a piezoelectric valve element. In the embodiment shown, substrate 216 and electrode 217 are coupled with leads 274 and 276, respectively. Although four leads are shown for valve 215 and piezoelectric cooling element 210, in another embodiment, fewer leads may be used. For example, a three lead configuration including a ground lead and leads to electrodes 213 and 218 may be present. Valve 215 also includes apertures 219. In the embodiment shown, valve 215 includes four apertures 219. In other embodiments, another number of apertures orifices may be present. For example, two apertures might be used instead of four. Apertures 219 are, however, offset from aperture 214 in piezoelectric cooling element 210. Thus, when valve 215 and piezoelectric cooling element 210 are in contact, as shown in FIGS. 2A-2B, fluid is prevented from moving through piezoelectric cooling element 210, from the distal to proximal side or vice versa. If valve 215 and piezoelectric cooling element 210 are not in physical contact, cooling fluid may move through apertures 219 and 214.

In operation, piezoelectric cooling system 200 functions in a manner analogous to cooling system 100. Valve 215 and piezoelectric cooling element 210 are actuated to move away from structure 230. Further, valve 215 may be driven to move faster and/or further than piezoelectric cooling element 210. Thus, fluid is drawn from the distal side of piezoelectric cooling element 210 to the proximal side. Valve 215 and piezoelectric cooling element 210 are actuated to move toward from structure 230. Further, valve 215 is driven to move faster and/or further than piezoelectric cooling element 210. Consequently, valve 215 contacts piezoelectric cooling element 210, preventing the flow of fluid through piezoelectric cooling element 210. Piezoelectric cooling element 210 also pushes fluid in the chamber between element 210 and orifice plate 220 toward structure 230. The fluid moves through orifices 220 and toward structure 230, in a manner analogous to that described above. As discussed above, piezoelectric cooling element may be driven at or near resonance and at frequencies of 15 kHz or more.

Piezoelectric cooling system 200 may more efficiently dissipate heat from structure 230. Because fluid impinges upon structure 230 with sufficient speed and in some embodiments substantially normal to the surface of structure 230, the boundary layer of fluid at the surface of structure 230 may be thinned and/or partially removed. Consequently, heat transfer between structure 230 and the moving fluid is improved. Because structure 230 is more efficiently cooled, structure 230 may be run at higher speed and/or power for longer times. Thus, performance of a device utilizing structure 230 may be improved. Further, cooling system 200 is a MEMS device having the dimensions described above. Thus, piezoelectric cooling system 200 is suitable for use in mobile devices, such as smart phones, in which limited space is available. Piezoelectric cooling system 200 may also be used in other compute devices-both mobile and non-mobile. Performance of such devices may thus be improved. Because piezoelectric cooling elements 210 may be vibrated at ultrasonic frequencies and/or at or near resonance, piezoelectric cooling system 200 may be quieter and consume less power. Thus, the benefits of improved, quiet cooling may be achieved with limited additional power. Consequently, performance of devices incorporating cooling system 200 may be improved.

FIG. 3 is a diagram depicting an exemplary embodiment of piezoelectric cooling system 300. For clarity, only certain components are shown and FIG. 3 is not to scale. Piezoelectric cooling system 300 is used in connection with a structure 330 and includes a cell 301. Structure 330 generates heat during operation and is desired to be cooled. Structure 330 is analogous to structure 130. Piezoelectric cooling system 300 may fit within mobile computing devices and is a MEMS cooling device. Piezoelectric cooling system 300 may also be viewed as a single cell in a larger cooling system that may include multiple cells/piezoelectric cooling systems 300. Also shown in FIG. 3 is plate 350 which may be part of the device, such as a smart phone, in which piezoelectric cooling system 300 resides. However, plate 350 might be replaced with another component.

Piezoelectric cooling system 300 includes piezoelectric cooling element 310 that is analogous to piezoelectric cooling elements 110 and 210 and orifice plate 320 that is analogous to orifice plate(s) 120 and 220. Orifice plate 320 thus includes multiple apertures 322 (of which only two are labeled) analogous to apertures 122 and 222. Also shown are valve 315, chimneys 340, spacers 341, 342 and 343 and leads 370, 372, 374 and 376. Spacers 341 separate orifice plate 320 from structure 330. Leads 370, 372, 374 and 376 are used to drive cooling element 310 and valve 315.

Piezoelectric cooling system 300 may be a MEMS device and thus may have dimensions analogous to those described above. Piezoelectric cooling system 300 is similar to piezoelectric cooling system 200. However, the apertures in cooling element 310 and valve 315 have been changed. In particular, valve 315 having substrate 316, piezoelectric 316 and electrode 318 has a central aperture 319. Cooling element 310 having substrate 311, piezoelectric 312 and electrode 313 has apertures 314 that are offset from the center. Active valve 315 still functions in an analogous manner to valve 215.

In operation, piezoelectric cooling system 300 functions in a manner analogous to cooling systems 100 and 200. Valve 315 and piezoelectric cooling element 310 are actuated to move away from structure 330. Valve 315 may be driven to move faster and/or further than piezoelectric cooling element 310. Thus, fluid is drawn from the distal side of piezoelectric cooling element 310 to the proximal side. Piezoelectric cooling element 310 also pushes fluid in the chamber between element 310 and orifice plate 320 toward structure 330. The fluid moves through orifices 320 and toward structure 330, in a manner analogous to that described above.

Piezoelectric cooling system 300 may more efficiently dissipate heat from structure 330. Because structure 330 is more efficiently cooled, structure 330 may be run at higher speed and/or power for longer times. Thus, performance of a device utilizing structure 330 may be improved. Further, cooling system 300 is a MEMS device having the dimensions described above. Thus, piezoelectric cooling system 300 is suitable for use in mobile devices, such as smart phones, in which limited space is available. Piezoelectric cooling system 300 may also be used in other compute devices-both mobile and non-mobile. Performance of such devices may thus be improved. Because piezoelectric cooling elements 310 may be vibrated at ultrasonic frequencies and/or at or near resonance, piezoelectric cooling system 300 may be quieter and consume less power. Thus, the benefits of improved, quiet cooling may be achieved with limited additional power. Consequently, performance of devices incorporating cooling system 300 may be improved.

Figure 4C:
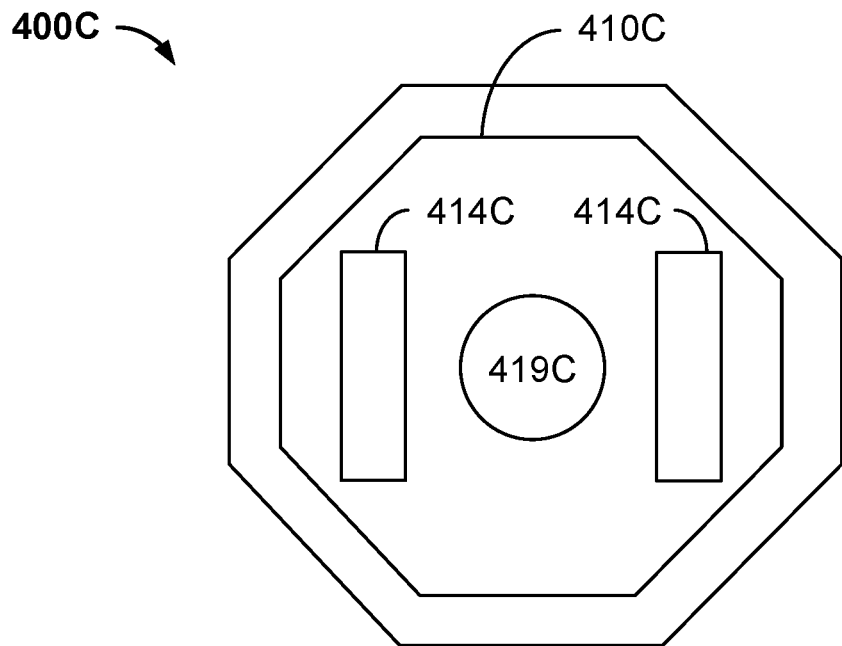

FIGS. 4A-4D are diagrams depicting exemplary embodiments of apertures, orifices and piezoelectric/chamber shapes in piezoelectric cooling systems 400A, 400B, 400C and 400D, respectively. For clarity, only certain components are shown and FIGS. 4A-4D are not to scale. Other configurations of apertures are possible. FIG. 4A depicts piezoelectric cooling system 400A including aperture 414A for a corresponding cooling element 410A and apertures 419A for a corresponding valve. Thus, the configuration shown in FIG. 4A may be used in a cooling cell such as the cooling cell 200. In an alternate embodiment, apertures 419A might be used for a cooling element and aperture 414A for a valve. Because of their alignment, apertures 414A and 419A may allow fluid to flow freely from the distal to the proximal side of the cooling element when the valve and cooling element are not in contact. When the valve and cooling element are in contact, apertures 414A and 419A are closed, preventing such a movement of fluid. Thus, the cooling element can push fluid through the orifices such that the fluid reaches higher speeds as described above. Also shown are the locations of portions of chimneys 440 corresponding to chimneys 240. In the embodiments, only a single cell that may be present in a multiple-cell system is shown. Consequently, the portion of chimneys 440 may be one-fourth of the chimneys used.

FIG. 4B depicts piezoelectric cooling system 400B including apertures 414B for a corresponding cooling element 410B and aperture 419B for a corresponding valve. Thus, the configuration shown in FIG. 4B may be used in a cooling cell such as the cooling cell 300. In an alternate embodiment, aperture 419B might be used for a cooling element and aperture 414B for a valve. Because of their alignment, apertures 414B and 419B may allow fluid to flow freely from the distal to the proximal side of the cooling element when the valve and cooling element are not in contact. Apertures 414B and 419B preventing such a movement of fluid When the valve and cooling element are in contact. Thus, the cooling element can push fluid through the orifices such that the fluid reaches higher speeds as described above. Also shown are the locations of portions of chimneys 440 corresponding to chimneys 340.

Using the configurations of apertures in cooling systems 400A and 400B, the apertures can function as a valve. Thus, movement of fluid from the distal to proximal side of the cooling element when desired may be improved. When fluid is desired to be prevented from moving from one side to the other of the cooling element when such a flow is undesirable. Thus, performance of a cooling element and valve incorporating an analogous configuration of apertures may be enhanced.

Figure 4D:
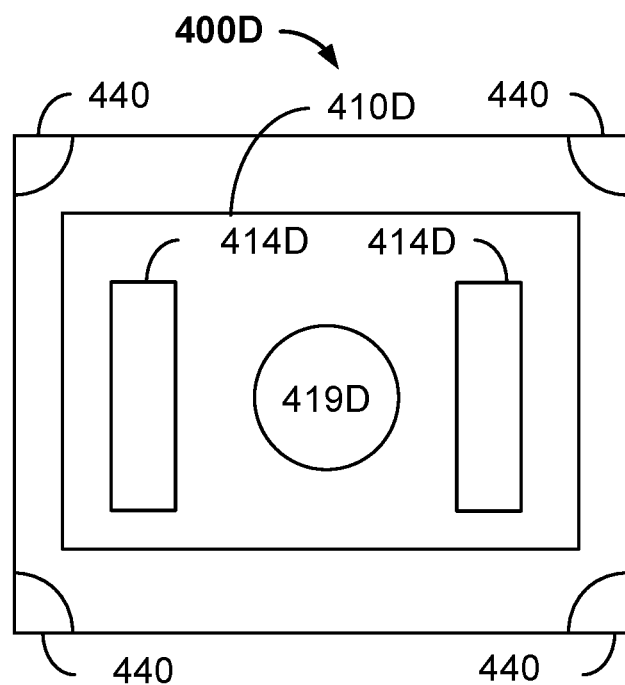

FIGS. 4C and 4D depict piezoelectric cooling systems 400C and 400D having piezoelectric cooling elements 410C and 410D, respectively. For simplicity, the configuration of apertures 414C/414D for piezoelectric cooling elements 410C/410D and apertures 419C/419D for the corresponding valve remains unchanged from that shown in FIG. 4A. For simplicity, the chimneys are not shown in FIG. 4C. Piezoelectric cooling elements 410A, 410C and 410D corresponding chamber shapes differ. Chamber and piezoelectric cooling element 410A are square. Chamber and piezoelectric cooling element 410C are octagonal. Chamber and piezoelectric cooling element 410D are rectangular. As discussed above, a piezoelectric cooling element may be driven at resonance and this resonance may be at a frequency of 15 kHz or higher. Chambers and/or piezoelectric cooling elements 410A, 410C and/or 410D have different shapes and, therefore, may have different resonance frequencies. This and other mechanisms may be used to modify the resonant frequency of the chamber and piezoelectric cooling elements 410A, 410C and 410D. Thus, the resonant frequencies of piezoelectric cooling system 400A, 400B, 400C and 400D may be engineered to be in the desired, target range.

Figure 5A:
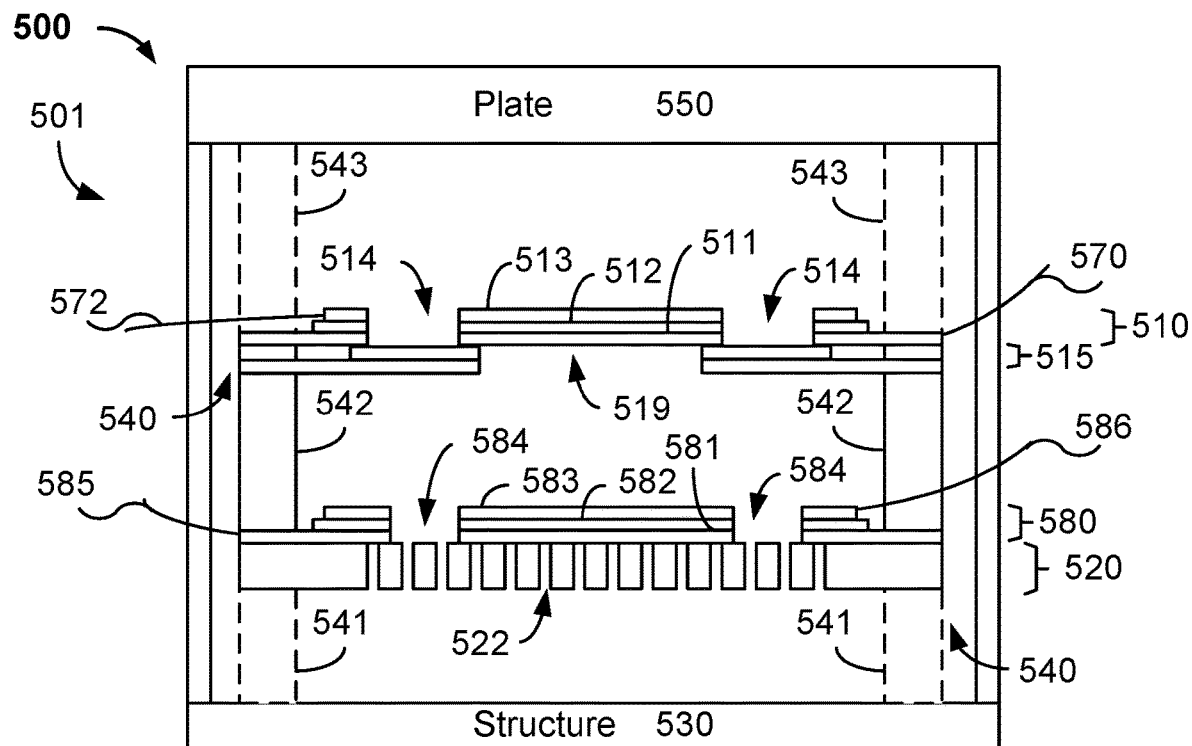
FIGS. 5A-5C is a diagram depicting an exemplary embodiment of a piezoelectric cooling system and diagrams depicting an exemplary embodiment of the movement of the actuator and orifice plate valve.
Figure 5B:
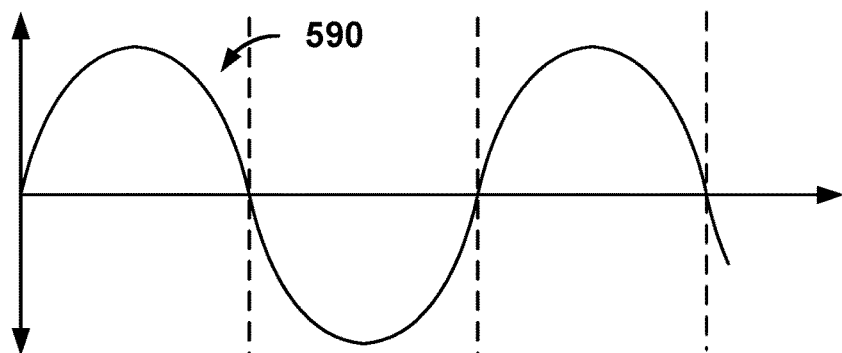
Figure 5C:
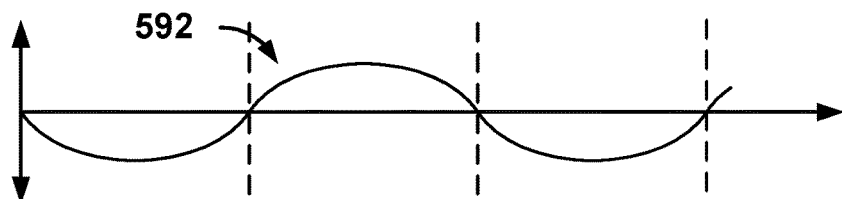

FIGS. 5A-5C is a diagram depicting an exemplary embodiment of a piezoelectric cooling system 500 and diagrams depicting an exemplary embodiment of the movement of the actuator and orifice plate valve. For clarity, only certain components are shown and FIG. 5A is not to scale. Piezoelectric cooling system 500 is used in connection with a structure 530 and includes a cell 501. Structure 530 generates heat during operation and is desired to be cooled. Structure 530 is analogous to structure 130. Piezoelectric cooling system 500 may fit within mobile computing devices and is a MEMS cooling device. Piezoelectric cooling system 500 may also be viewed as a single cell in a larger cooling system that may include multiple cells 501/piezoelectric cooling systems 500. Also shown in FIG. 5 is plate 550 which may be part of the device, such as a smart phone, in which piezoelectric cooling system 500 resides. However, plate 550 might be replaced with another component.

Piezoelectric cooling system 500 includes piezoelectric cooling element 510 that is analogous to previously discussed piezoelectric cooling elements and orifice plate 520 that is analogous to previously described orifice plate(s). Piezoelectric cooling element 510 includes substrate 511, piezoelectric layer 512 and electrode 513 having apertures 514 that are offset from the center. Orifice plate 520 thus includes multiple apertures 522 (of which only one is labeled). Also shown are passive valve 515, chimneys 540, spacers 541, 542 and 543 and leads 570 and 572. Spacers 541 separate orifice plate 520 from structure 530. Leads 570 and 572 are used to energize cooling element 510 to vibrate.

Piezoelectric cooling system 500 may be a MEMS device and thus may have dimensions analogous to those described above. Piezoelectric cooling system 500 is similar to piezoelectric cooling systems 200 and 300. However, valve 515 is a passive valve. Thus, when cooling element 510 is actuated to move away from structure 530, cooling element 510 move away from valve 515. Apertures 514 open and fluid flows from the distal to the proximal side of cooling element 510. In some embodiments, passive valve 515 is at least twenty five microns thick and not more than fifty microns thick. In an alternate embodiment, valve 515 might be an active valve, for example analogous to valve 315.

In addition, cooling cell 510 includes valve 580 for orifice plate 520. Valve 580 is an active valve. In the embodiment shown, valve 580 is a piezoelectric valve element including substrate 581, piezoelectric 583 and electrode 582 having apertures 584 therein. Thus, valve 580 may be analogous to piezoelectric cooling element 510 and/or valve 515. In some embodiments, valve 580 is at least fifty and not more than fifty microns thick. Valve 580 may be affixed to orifice plate 520, for example via an adhesive such as epoxy applied near the perimeter. Leads 585 and 586 are used to actuate valve 580. Valve 580 selectively allows fluid to flow through orifices 522 in orifice plate.

In operation, piezoelectric cooling system 500 functions in a manner analogous to cooling systems 100, 200 and 300. Piezoelectric cooling element 510 is actuated to move away from structure 530 and, therefore, valve 515. Fluid flows through apertures 514. During this time, valve 580 is actuated to remain in contact with orifice plate 520. Thus, the flow fluid from the region between orifice plate 520 and structure 530 into the chamber formed between orifice plate 520 and cooling element 510 may be reduced or prevented. In the embodiment shown, apertures 584 are aligned with some orifices 522 when valve 580 is in contact with orifice plate 520. In such an embodiment, some fluid may return to the chamber when piezoelectric cooling element 510 is actuated to move (e.g. deform) away from orifice plate 520. In other embodiments, apertures 584 are aligned with sections of orifice plate 520 that are free of orifices when valve 580 is in contact with orifice plate 520. In such embodiments, fluid may be substantially prevented from returning via orifices 522 when piezoelectric cooling element 510 is actuated to deform away from orifice plate 520 and structure 530. Piezoelectric cooling element 510 is activated to move toward structure 530. Piezoelectric cooling element 510 thus pushes fluid in the chamber between element 510 and orifice plate 520 toward structure 530. During this motion, valve 580 is actuated to move away from orifice plate 520, allowing fluid pass more readily through apertures 584 to reach orifices 522. The fluid moves through orifices 522 and in jets toward structure 530, in a manner analogous to that described above for other cooling systems. FIG. 5B is a graph 590 depicting an exemplary embodiment of the motion of cooling element 510, while FIG. 5C is a graph 592 depicting an exemplary embodiment of the motion of valve 580. Thus, components 580 and 510 are out of phase. Both components 510 and 580 may be vibrated at the same ultrasonic frequency described above. In addition, both components 510 and 580 may be vibrated at or near resonance frequencies. Further, the amplitude of motion of cooling element 510 is generally desired to be larger in amplitude than the motion of valve 580.

Piezoelectric cooling system 500 may more efficiently dissipate heat from structure 530. Because structure 530 is more efficiently cooled, structure 530 may be run at higher speed and/or power for longer times. Thus, performance of a device utilizing structure 530 may be improved. Further, cooling system 500 is a MEMS device having the dimensions described above. Thus, piezoelectric cooling system 500 is suitable for use in mobile devices, such as smart phones, in which limited space is available. Piezoelectric cooling system 500 may also be used in other compute devices-both mobile and non-mobile. Performance of such devices may thus be improved. Because piezoelectric cooling elements 510 may be vibrated at ultrasonic frequencies and/or at or near resonance, piezoelectric cooling system 500 may be quieter and consume less power. Further, use of valve 580 may prevent or reduce the back flow of heated fluid from the region close to structure 530 through the orifices 522. This fluid may instead move through chimneys 540 to be cooled. Efficiency of the cooling system 500 may thereby be enhanced. Thus, the benefits of improved, quiet cooling may be achieved with limited additional power. Consequently, performance of devices incorporating cooling system 500 may be improved.

Figure 6:
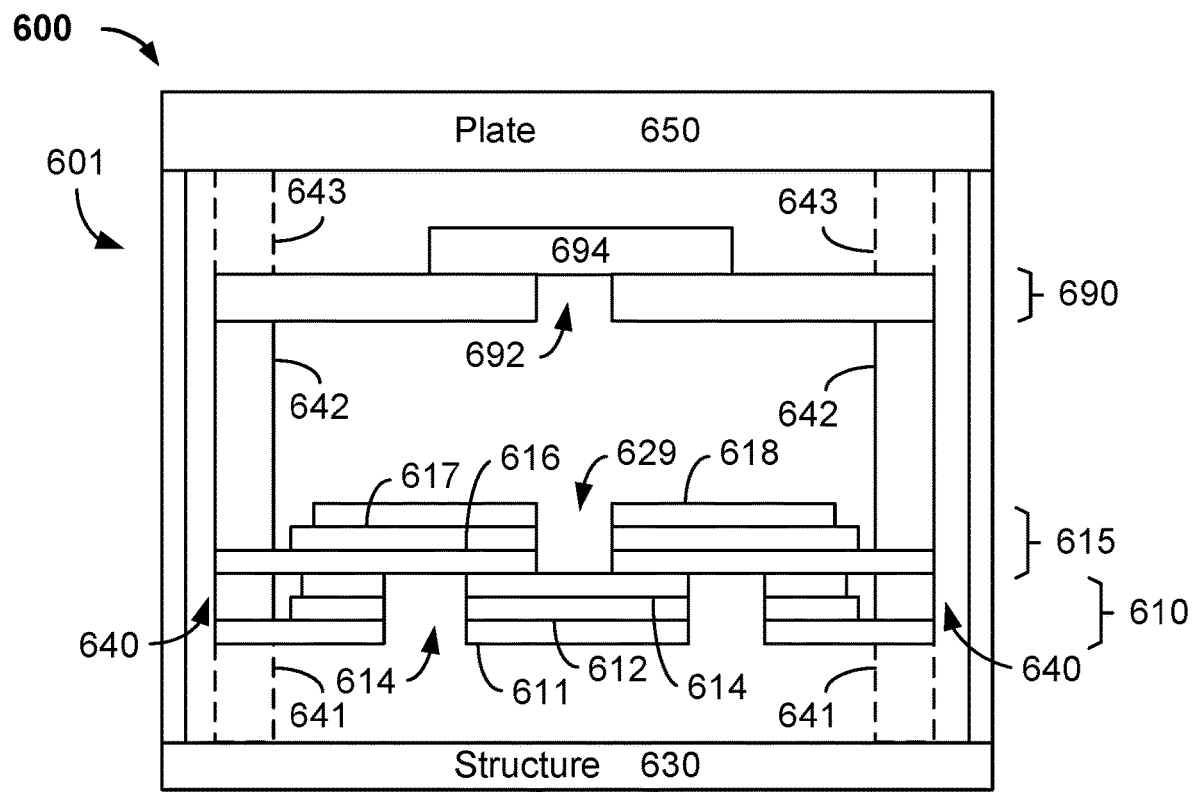
FIG. 6 is a diagram depicting an exemplary embodiment of a piezoelectric cooling system.

FIG. 6 is a diagram depicting an exemplary embodiment of a piezoelectric cooling system 600. For clarity, only certain components are shown and FIG. 6 is not to scale. Piezoelectric cooling system 600 is used in connection with a structure 630 and includes a cell 601. Structure 630 generates heat during operation and is desired to be cooled. Structure 630 is analogous to structure 130. Piezoelectric cooling system 600 may fit within mobile computing devices and is a MEMS cooling device. Piezoelectric cooling system 600 may also be viewed as a single cell in a larger cooling system that may include multiple cells/piezoelectric cooling systems 600. Also shown in FIG. 6 is plate 650 which may be part of the device, such as a smart phone, in which piezoelectric cooling system 600 resides. However, plate 650 might be replaced with another component.

Piezoelectric cooling system 600 includes piezoelectric cooling element 610 that is analogous to previously discussed piezoelectric cooling elements and valve 615 that is analogous to valve 215. Piezoelectric cooling element 610 thus includes substrate 611, piezoelectric layer 612 and electrode 613 having apertures 614 that are offset from the center. Also shown are chimneys 640, spacers 641, 642 and 643. Similarly, valve 615 includes substrate 616, piezoelectric layer 617 and electrode 618. For simplicity, leads to cooling element 610 are not shown.

Although piezoelectric cooling element 610 is present, it is closer to structure 630. In some embodiments, piezoelectric cooling element 610 is at or near the location where the orifice plate would otherwise be. Similarly, top plate 690 is at or near the location where the cooling element, such as cooling element 210, would be in other embodiments. Top plate 690 includes aperture 692. Also shown is valve 694. In another embodiment, valve 694 may be omitted and/or aperture 692 may be located near the edges of plate 690. In some embodiments, plate 690 may be replaced by a piezoelectric cooling element and valve such as components 210 and 215 or 310 and 315.

Piezoelectric cooling system 600 may be a MEMS device and thus may have dimensions analogous to those described above. Piezoelectric cooling system 600 is similar to other piezoelectric cooling systems described herein. However, cooling element 610 has replaced an orifice plate and top plate 690 has replaced cooling element 610.

In operation, cooling element 610 is actuated to move away from structure 630 and valve 615 is actuated to open apertures 614. Fluid flows from the distal to the proximal side of cooling element 610 and moves toward structure 630 in jets. When cooling elements 610 is driven to move toward structure 630, valve 615 is actuated so that apertures 614 remain closed. However, valve 694 opens aperture 692. Fluid flows through plate 690 into the chamber formed by plate 690 and cooling element 610.

Piezoelectric cooling system 600 may share the benefits of other piezoelectric cooling systems described herein. Piezoelectric cooling system may more efficiently dissipate heat from structure 630, allowing structure 630 to be run at higher speed and/or power for longer times. Thus, performance of a device utilizing structure 630 may be improved. Further, cooling system 600 is a MEMS device having the dimensions described above. Thus, piezoelectric cooling system 600 is suitable for use in mobile devices, such as smart phones, in which limited space is available. Piezoelectric cooling system 600 may also be used in other compute devices-both mobile and non-mobile. Performance of such devices may thus be improved. Because piezoelectric cooling elements 610 may be vibrated at ultrasonic frequencies and/or at or near resonance, piezoelectric cooling system 600 may be quieter and consume less power. Thus, the benefits of improved, quiet cooling may be achieved with limited additional power. Consequently, performance of devices incorporating cooling system 600 may be improved.

Figure 7:
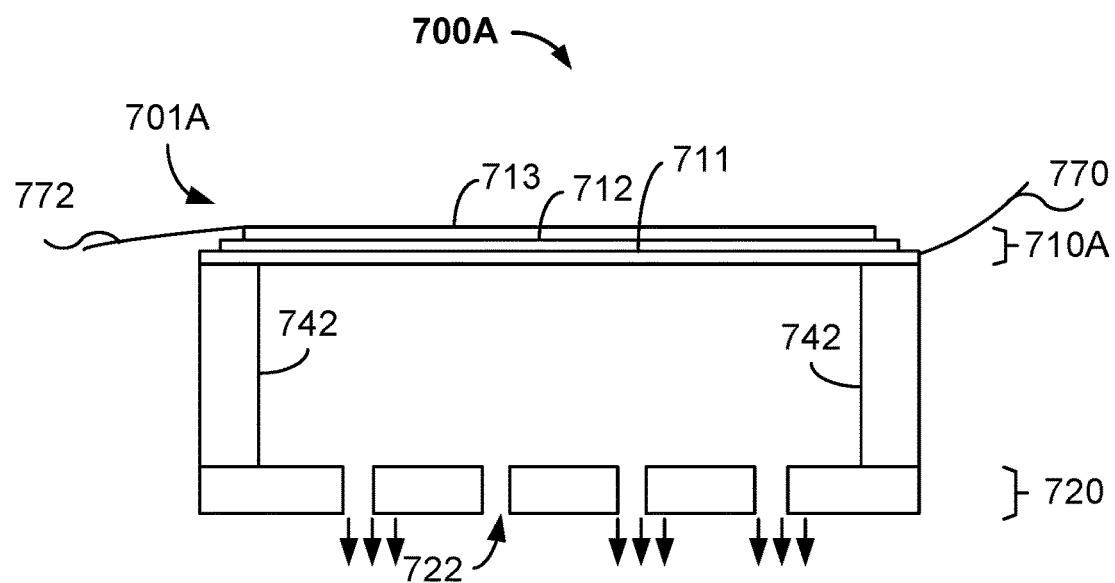
FIG. 7 is a diagram depicting an exemplary embodiment of a piezoelectric cooling system.

FIG. 7 is a diagram depicting an exemplary embodiment of a piezoelectric cooling system 700A. For clarity, only certain components are shown and FIG. 7 is not to scale. Piezoelectric cooling system 700 is used in connection with a structure (not shown) and includes a cell 701A. Piezoelectric cooling system 700A may fit within mobile computing devices and is a MEMS cooling device. Piezoelectric cooling system 700A might also be used in non-mobile devices. Although rear spacers and front spacers to the structure are not shown, such components are generally present. Piezoelectric cooling system 700A may also be viewed as a single cell in a larger cooling system that may include multiple cells/piezoelectric cooling systems 700A.

Piezoelectric cooling system 700A includes piezoelectric cooling element 710A that is generally analogous to previously discussed piezoelectric cooling elements but does not have an entry path to allow fluid to pass through cooling element 710A. Thus, piezoelectric cooling element 710A includes substrate 711, piezoelectric layer 712 and electrode 713. For simplicity, leads to cooling element 710A and are not shown. Also shown is orifice plate 720 having orifices 722. Piezoelectric cooling system 700A may be a MEMS device and thus may have dimensions analogous to those described above. Piezoelectric cooling system 700A is similar to other piezoelectric cooling systems described herein. However, cooling element 710A does not move fluid through cooling element 710A. Thus, no apertures are present in cooling element 710A and no valve is used.

In operation, cooling element 710A is actuated to move away from orifice plate 720. Fluid flows in through apertures 722 or other orifice in the chamber formed by cooling element 710A and orifice plate 720. When cooling elements 710A is driven to move toward orifice plate 620, fluid is moved toward orifice plate 720 and through apertures 722 at speeds described above. Piezoelectric cooling element 700A thus macroscopically moves fluid, such as a gas (e.g. air). For example, piezoelectric cooling element 700 may be capable of generating fluid speeds in excess of thirty meters per second. Arrows in FIG. 7 depict the direction of motion of fluid from orifices 722. In the embodiment shown, any structures (not shown) proximate to orifice plate 720 are generally spaced further away than fifty microns to prevent movement hot fluid adjacent to the structure from being drawn back through orifices 722. In some embodiments, structures may be adjacent to spacers 742. A channel substantially parallel to the direction of fluid flow may be present. In such embodiments, fluid may be more effectively moved by cooling system 700.

Piezoelectric cooling system 700A may share the benefits of other piezoelectric cooling systems described herein. Piezoelectric cooling system 700A may move fluid at speeds of fifty meters per second or above. Further, cooling system 700A is a MEMS device having the dimensions described above. Thus, piezoelectric cooling system 700A is suitable for use in mobile devices, such as smart phones, in which limited space is available. Performance of such devices may thus be improved. Because piezoelectric cooling elements 710A may be vibrated at ultrasonic frequencies and/or at or near resonance, piezoelectric cooling system 700A may be quieter and consume less power. Thus, the benefits of improved, quiet cooling may be achieved with limited additional power. Consequently, performance of devices incorporating cooling system 700A may be improved.

FIGS. 8A-8E are diagrams depicting exemplary embodiments 700B and 700C of a piezoelectric cooling system usable with a structure. Piezoelectric cooling systems 700B and 700C utilize two stage movement. For clarity, only certain components are shown and FIGS. 8A-8E are not to scale. Piezoelectric cooling systems 700B and 700C are used in connection with a structure (not shown). Piezoelectric cooling systems 700B and 700C may fit within mobile computing devices and is a MEMS cooling device. Although rear spacers and front spacers to the structure are not shown, such components are generally present. Each piezoelectric cooling system 700B and 700C may also be viewed as a single cell in a larger cooling system that may include multiple cells/piezoelectric cooling systems 700B and 700C.

Figure 8A:
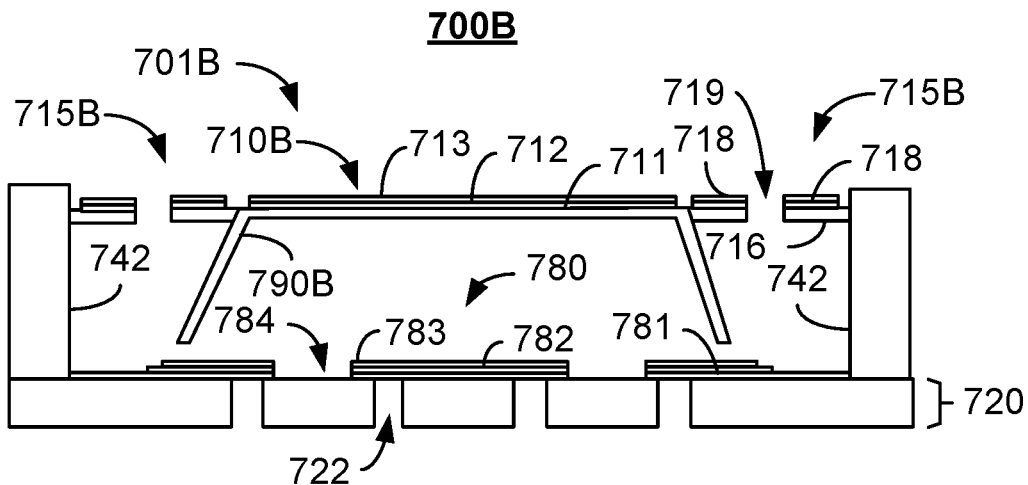
FIGS. 8A-8E are diagrams depicting exemplary embodiments of a piezoelectric cooling system usable with a structure.
Figure 8B:
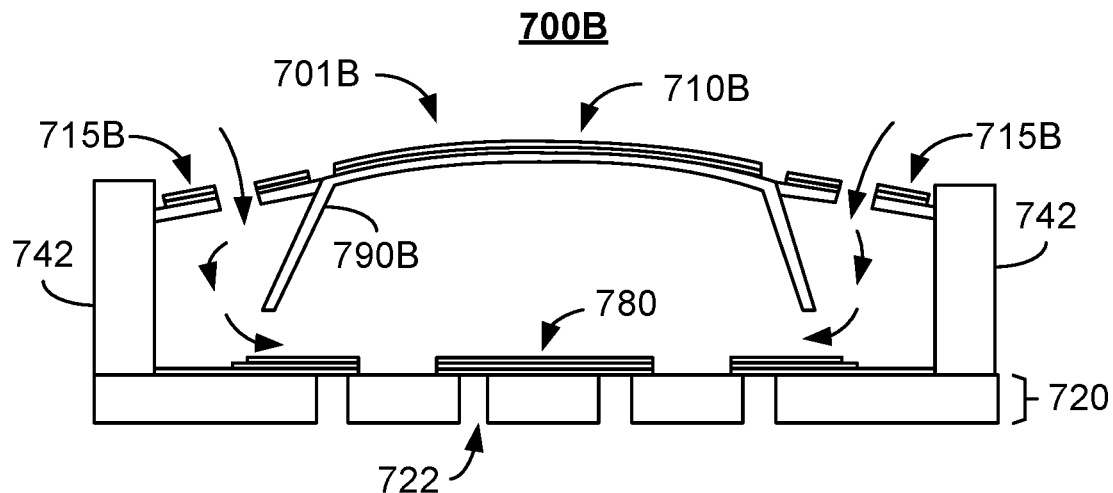
Figure 8C:
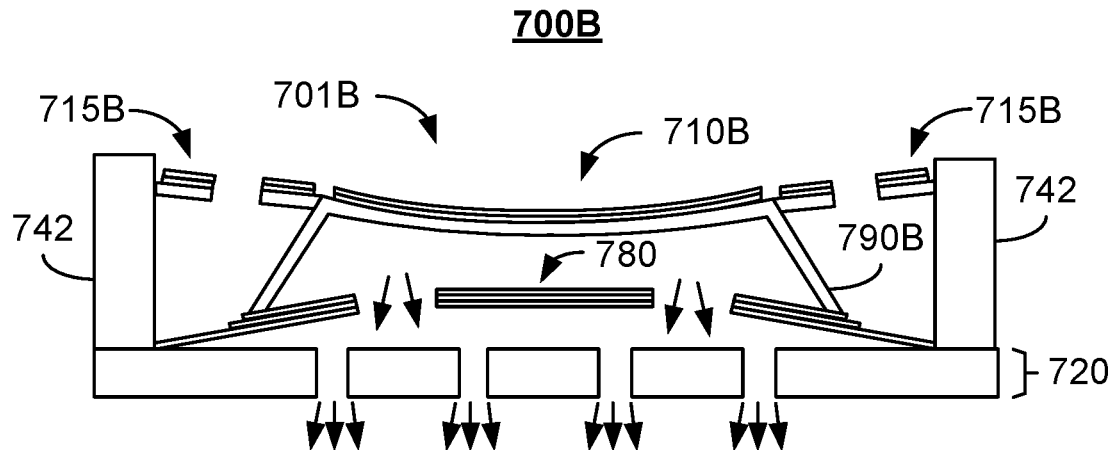

FIGS. 8A-8C depict one piezoelectric cooling system 700B including at least one cell 701B. Piezoelectric cooling system 700B includes piezoelectric cooling element 710B that is generally analogous to previously discussed piezoelectric cooling elements but does not have an entry path to allow fluid to pass through cooling element 710B in some embodiments. Thus, piezoelectric cooling element 710B includes substrate 711, piezoelectric layer 712 and electrode 713. For simplicity, leads to cooling element 710B and are not shown. Also shown is orifice plate 720 having orifices 722. Piezoelectric cooling system 700B may be a MEMS device and thus may have dimensions analogous to those described above. Piezoelectric cooling system 700B is similar to other piezoelectric cooling systems described herein. Also depicted is active valve 780 that is analogous to active vale 580. Active valve 780 includes substrate 781, piezoelectric 782 and electrode 783 that are analogous to substrate 581, piezoelectric 582 and electrode 583. However, additional piezoelectric elements 715B and chamber walls 790B are shown. In the embodiment shown, chamber walls 790B are connected to or part of the same piece as substrate 711. For example, chamber walls 790B may be stainless steel and/or Hastelloy. Piezoelectric elements 715B include substrate 716, piezoelectric 717 and electrode 718 that are analogous to substrate 711, piezoelectric 712 and electrode 713, respectively. Thus, piezoelectric elements 715B may be seen as forming cantilevered sections coupled between piezoelectric cooling element 710B/chamber walls 790B and spacers 742. Piezoelectric elements 715B also include apertures 719 therein. For simplicity, the components of only one piezoelectric element 715B are labeled. Further, for clarity, some components are not labeled in FIGS. 8B and 8C.

Piezoelectric cooling system 700B utilizes two-step motion for driving fluid. This may be seen in FIGS. 8B and 8C. In operation, piezoelectric elements 715B are actuated to vibrate toward and away from orifice plate 720. This moves piezoelectric cooling element 710B and chamber walls 790 be toward and away from orifice plate 720. Piezoelectric cooling element 710B is also actuated to vibrate toward and away from orifice plate 720. FIG. 8B depicts piezoelectric cooling system 700B after both piezoelectric elements 715B and piezoelectric cooling element 710B are driven. At the time shown in FIG. 8B, piezoelectric cooling element 710B is moved from orifice plate 720 by the piezoelectric elements 715B. In some embodiments, piezoelectric cooling element 710B is also deformed to flex away from orifice plate 720. Chamber walls 790B have thus moved away from orifice plate 720. Active valve 780 is also actuated such that fluid does not flow through orifices 722 from closer to the structure (not shown) being cooled. Fluid from the distal side of piezoelectric cooling element 710B (and the distal side of piezoelectric elements 715B) flows in through apertures 719 or other orifice(s) and between chamber walls 790B. This fluid flow is shown by arrows in FIG. 8B.

FIG. 8C depicts piezoelectric cooling cell 700B when piezoelectric elements 715 are actuated to move chamber walls 790B/element 710B toward orifice plate 720 and piezoelectric cooling element 710B is activated to vibrate towards orifice plate 720. In addition, valve 780 is actuated to move away from orifice plate 720. Consequently, fluid is moved toward orifice plate 720 and through apertures 722 at speeds described above. The fluid flow is shown by arrows in FIG. 8C. Because chamber walls 790B are in contact with valve 780, fluid does not move back through apertures 719. In some embodiments, a passive or active valve may be provided such that apertures 719 are closed by the valve in the situation shown in FIG. 8C. This may be used in addition to or in lieu of the chamber walls 790B contacting valve 780 to prevent back flow of fluid through apertures 719. Thus, piezoelectric cooling element 710B in combination with piezoelectric elements 715B move fluid from the distal to the proximal side of piezoelectric cooling element 710B and drive the fluid through orifices in orifice plate 720. As such, piezoelectric cooling element 710B can be considered to be configured to direct the fluid from the distal side to the proximal side of piezoelectric cooling element 710B such that the fluid moves in a direction that is incident on a surface of a heat-generating structure (not shown in FIGS. 8A-8C) at a substantially perpendicular angle and then is deflected to move along the surface of the heat-generating structure to extract heat from the heat-generating structure.

Piezoelectric cooling system 700B may share the benefits of other piezoelectric cooling systems described herein. Piezoelectric cooling system 700B may more efficiently dissipate heat from a structure (not shown). Piezoelectric cooling system 700B may move fluid at speeds of at least thirty meters per second, at least fifty meters per second or above. Further, cooling system 700B is a MEMS device having the dimensions described above. Thus, piezoelectric cooling system 700B is suitable for use in mobile devices, such as smart phones, in which limited space is available. Piezoelectric cooling system 700B may also be used in other compute devices-both mobile and non-mobile. Performance of such devices may thus be improved. Because piezoelectric cooling elements 710B may be vibrated at ultrasonic frequencies and/or at or near resonance, piezoelectric cooling system 700B may be quieter and consume less power. Thus, the benefits of improved, quiet cooling may be achieved with limited additional power. Consequently, performance of devices incorporating cooling system 700B may be improved.

Figure 8D:
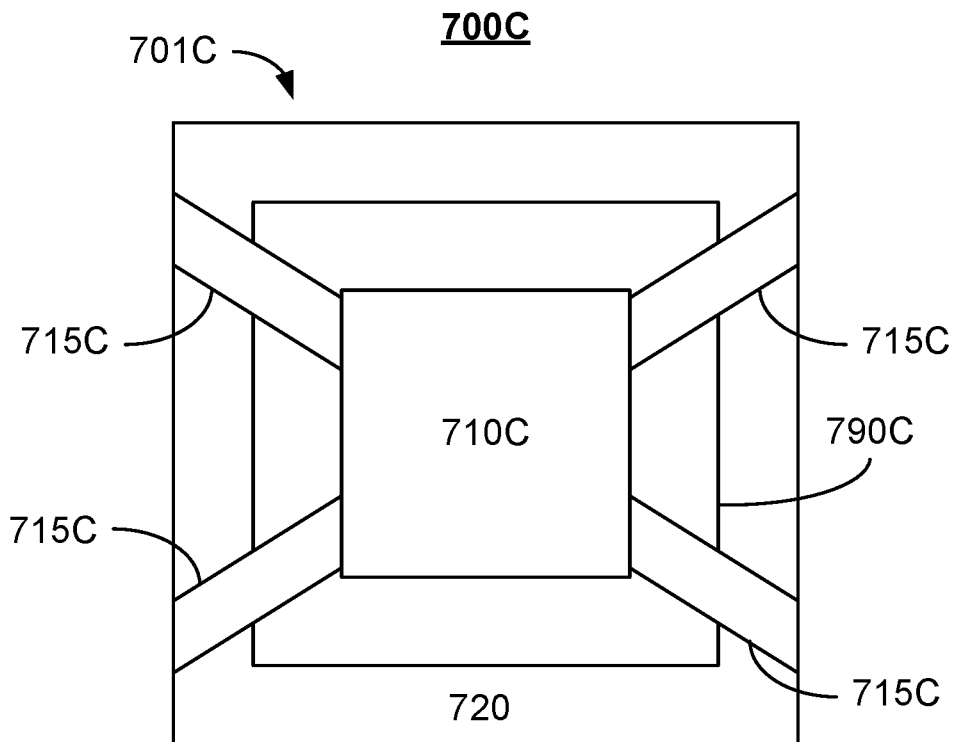
Figure 8E:
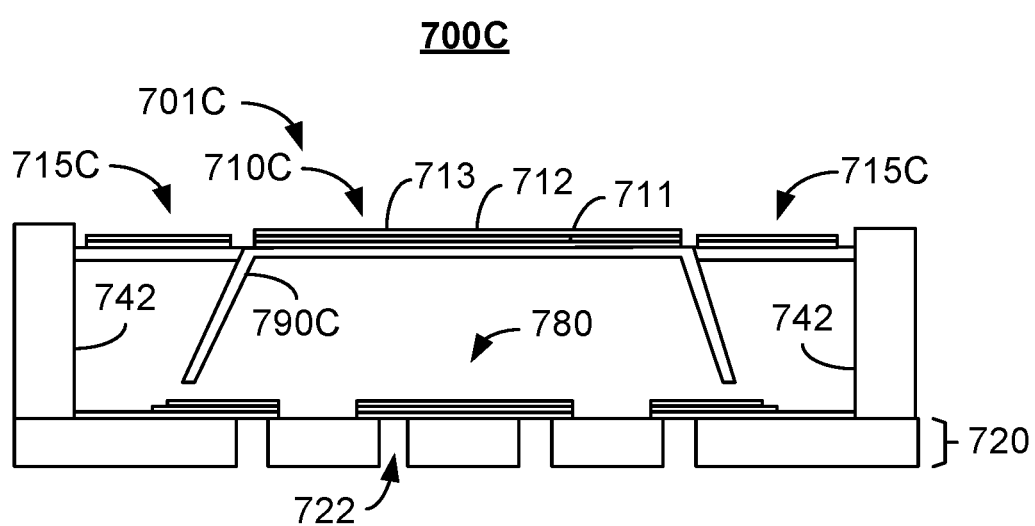

FIGS. 8D-8E depict another embodiment of piezoelectric cooling system 700C including at least one cell 701C. Piezoelectric cooling system 700C includes piezoelectric cooling element 710C that is generally analogous to previously discussed piezoelectric cooling elements but does not have an entry path to allow fluid to pass through cooling element 710C in some embodiments. Thus, piezoelectric cooling element 710C includes substrate 711, piezoelectric layer 712 and electrode 713. For simplicity, leads to cooling element 710A and are not shown. Also shown is orifice plate 720 having orifices 722. Piezoelectric cooling system 700C may be a MEMS device and thus may have dimensions analogous to those described above. Piezoelectric cooling system 700C is similar to other piezoelectric cooling systems described herein. Also depicted is active valve 780 that is analogous to active vale 580. Active valve 780 includes substrate 781, piezoelectric 782 and electrode 783 that are analogous to substrate 581, piezoelectric 582 and electrode 583. Additional piezoelectric elements 715C and chamber walls 790C are shown. In the embodiment shown, chamber walls 790B are connected to but not part of the same piece as substrate 711. Chamber walls 790C may still be stainless steel and/or Hastelloy. Piezoelectric elements 715C include substrate 716, piezoelectric 717 and electrode 718 that are analogous to substrate 711, piezoelectric 712 and electrode 713, respectively. Thus, piezoelectric elements 715C may be seen as forming cantilevered sections coupled between piezoelectric cooling element 710C/chamber walls 790C and spacers 742. Although four piezoelectric elements 715C are shown, another number may be used in other embodiments. Piezoelectric elements 715C are not shown as including apertures. Instead, piezoelectric elements 715C are cantilevered strips separated by spaces.

Piezoelectric cooling system 700C operates in an analogous manner to piezoelectric cooling system 700B. Thus, piezoelectric elements 715C and 710C, as well as active valve 780 are driven. Thus, fluid from the distal side of piezoelectric elements 710C and 715C moves through spaces between piezoelectric elements 715C to the proximal side of piezoelectric cooling element 710C. Fluid is then driven through orifices 722 of orifice plate 720. Thus, piezoelectric cooling element 710C in combination with piezoelectric elements 715C move fluid from the distal to the proximal side of piezoelectric cooling element 710C and drive the fluid through orifices in orifice plate 720. As such, piezoelectric cooling element 710C can be considered to be configured to direct the fluid from the distal side to the proximal side of piezoelectric cooling element 710C such that the fluid moves in a direction that is incident on a surface of a heat-generating structure (not shown in FIGS. 8D-8E) at a substantially perpendicular angle and then is deflected to move along the surface of the heat-generating structure to extract heat from the heat-generating structure.

Piezoelectric cooling system 700C may share the benefits of other piezoelectric cooling systems described herein. Piezoelectric cooling system 700C may more efficiently dissipate heat from a structure (not shown). Piezoelectric cooling system 700C may move fluid at speeds of at least thirty meters per second, at least fifty meters per second or above. Further, cooling system 700C is a MEMS device having the dimensions described above. Thus, piezoelectric cooling system 700C is suitable for use in mobile devices, such as smart phones, in which limited space is available. Piezoelectric cooling system 700C may also be used in other compute devices-both mobile and non-mobile. Performance of such devices may thus be improved. Because piezoelectric cooling elements 700C may be vibrated at ultrasonic frequencies and/or at or near resonance, piezoelectric cooling system 700C may be quieter and consume less power. Thus, the benefits of improved, quiet cooling may be achieved with limited additional power. Consequently, performance of devices incorporating cooling system 700C may be improved.

Figure 9A:
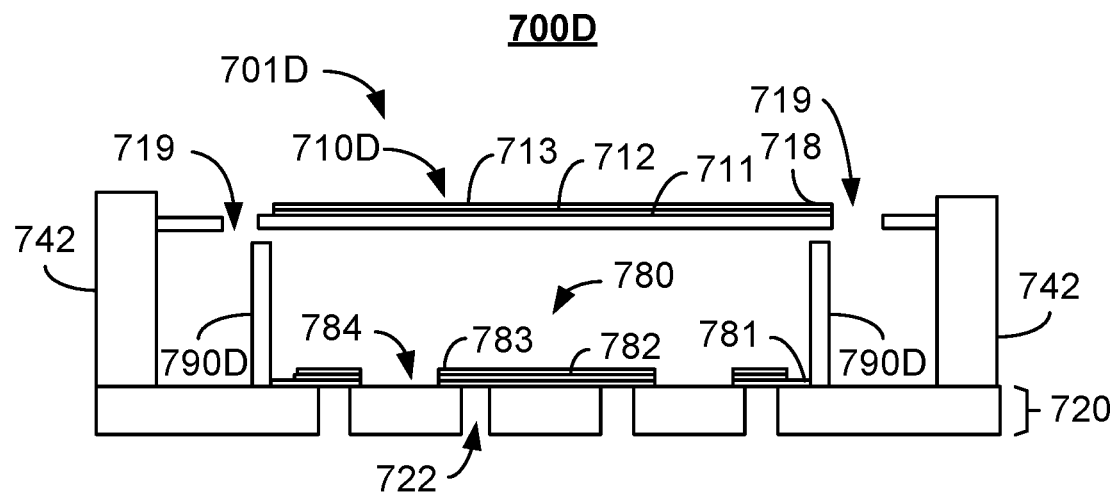
FIGS. 9A-9C are diagrams depicting an exemplary embodiment of a piezoelectric cooling system usable with a structure.
Figure 9B:
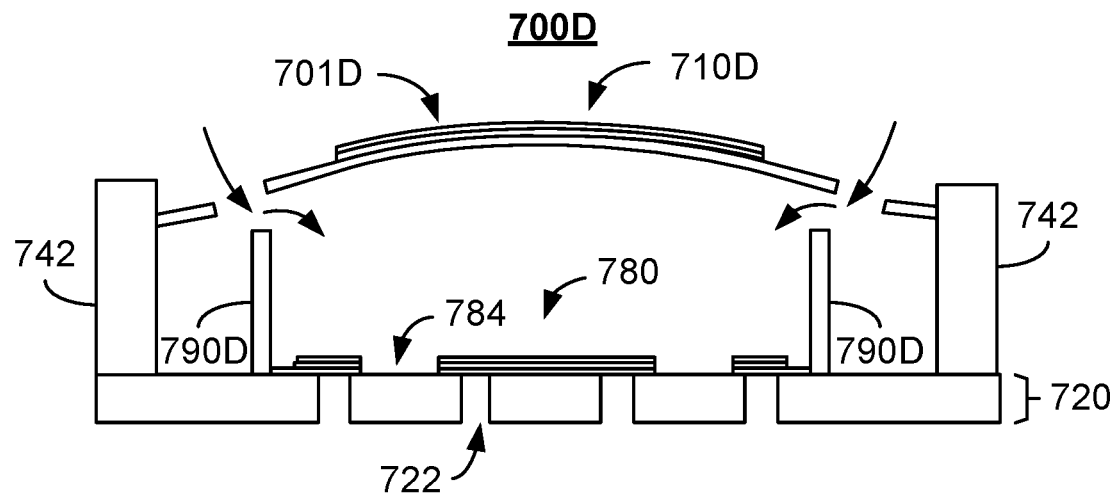
Figure 9C:
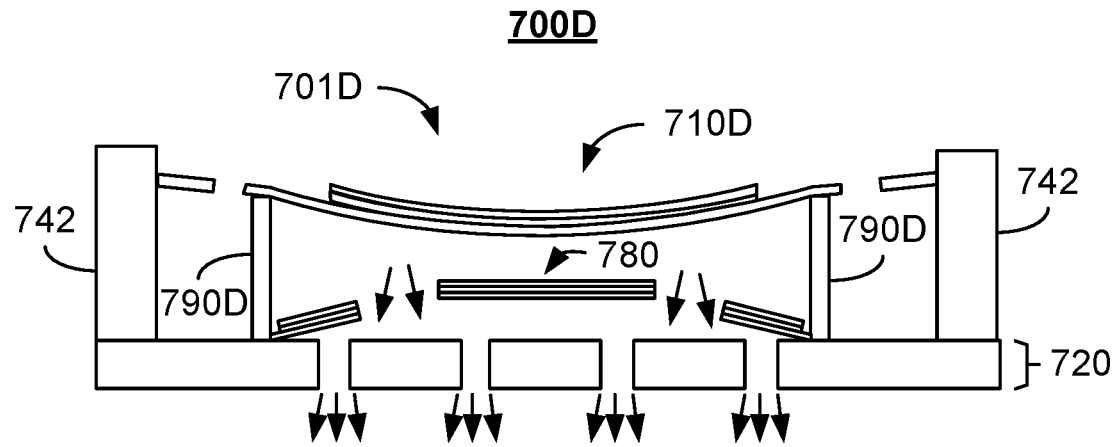

FIGS. 9A-9C depict another embodiment of a piezoelectric cooling system 700D including at least one cell 701D. For clarity, not all components are depicted and FIGS. 9A-9C are not to scale. Piezoelectric cooling system 700D includes piezoelectric cooling element 710D that is generally analogous to previously discussed piezoelectric cooling elements but does not have an entry path to allow fluid to pass through cooling element 710D in some embodiments. Thus, piezoelectric cooling element 710D includes substrate 711, piezoelectric layer 712 and electrode 713. For simplicity, leads to cooling element 710D and are not shown. Also shown is orifice plate 720 having orifices 722. Piezoelectric cooling system 700D may be a MEMS device and thus may have dimensions analogous to those described above. Piezoelectric cooling system 700D is similar to other piezoelectric cooling systems described herein. Also depicted is active valve 780 that is analogous to active vale 580. Active valve 780 includes substrate 781, piezoelectric 782 and electrode 783 that are analogous to substrate 581, piezoelectric 582 and electrode 583. However, additional piezoelectric elements 715B and chamber walls 790D are shown. In the embodiment shown, chamber walls 790B are connected to orifice plate 720. Thus, chamber walls 790C are substantially stationary. In the embodiment shown, piezoelectric element components 712 and 713 are not shown as extending to spacers 742 or apertures 719. In other embodiments, components 712 and/or 713 may extend to/past apertures 719 and/or to spacer 742.

Piezoelectric cooling system 700D operates in an analogous manner to piezoelectric cooling system 700B and 700C. However, in the embodiment shown, one-step motion may be used. Thus, piezoelectric elements 715B and/or 715C may be omitted in some embodiments. Thus, piezoelectric element 710D, as well as active valve 780 are driven. This can be seen in FIGS. 9B and 9C. For clarity, not all components are labeled in FIGS. 9B and 9C. Piezoelectric cooling element 710D is also actuated to vibrate toward and away from orifice plate 720. FIG. 9B depicts piezoelectric cooling system 700D after piezoelectric cooling element 710D is driven. At the time shown in FIG. 9B, piezoelectric cooling element 710D is deformed to flex away from orifice plate 720 and chamber walls 790D. Active valve 780 is also actuated such that fluid does not flow through orifices 722 from closer to the structure (not shown) being cooled. Fluid from the distal side of piezoelectric cooling element 710D flows in through apertures 719 or other orifice(s) and between chamber walls 790D. This fluid flow is shown by arrows in FIG. 9B.

FIG. 9C depicts piezoelectric cooling cell 700D when activated to vibrate towards orifice plate 720. In addition, valve 780 is actuated to move away from orifice plate 720. Consequently, fluid is moved toward orifice plate 720 and through apertures 722 at speeds described above. The fluid flow is shown by arrows in FIG. 9C. Because chamber walls 790D are in contact with piezoelectric cooling element 720D, fluid does not move back through apertures 719.

Piezoelectric cooling system 700D may share the benefits of other piezoelectric cooling systems described herein. Piezoelectric cooling system 700D may more efficiently dissipate heat from a structure (not shown). Piezoelectric cooling system 700D may move fluid at speeds of at least thirty meters per second, at least fifty meters per second or above. Further, cooling system 700D is a MEMS device having the dimensions described above. Thus, piezoelectric cooling system 700D is suitable for use in mobile devices, such as smart phones, in which limited space is available. Piezoelectric cooling system 700D may also be used in other compute devices-both mobile and non-mobile. Performance of such devices may thus be improved. Because piezoelectric cooling elements 700D may be vibrated at ultrasonic frequencies and/or at or near resonance, piezoelectric cooling system 700D may be quieter and consume less power. Thus, the benefits of improved, quiet cooling may be achieved with limited additional power. Consequently, performance of devices incorporating cooling system 700D may be improved.

Figure 10A:
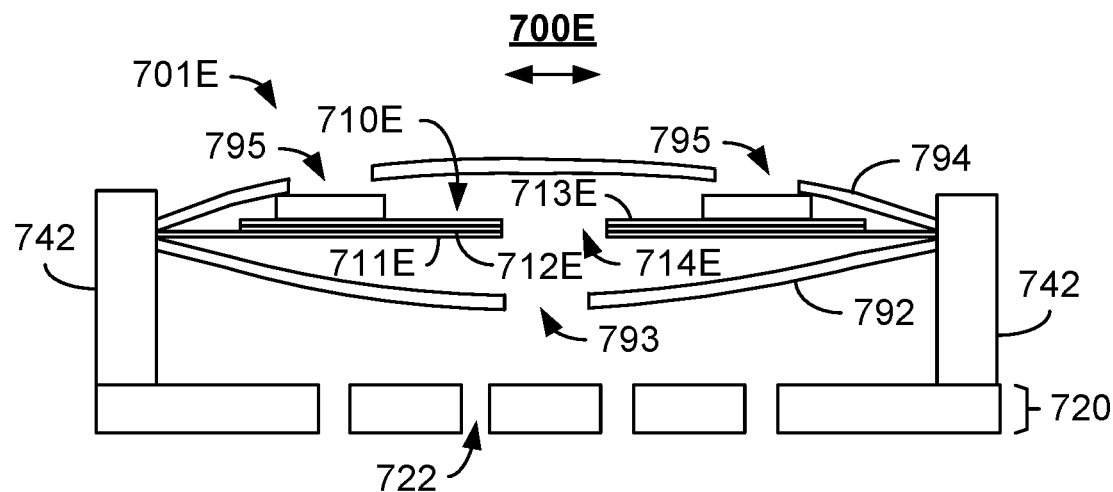
FIGS. 10A-10C are diagrams depicting an exemplary embodiment of a piezoelectric cooling system usable with a structure.
Figure 10B:
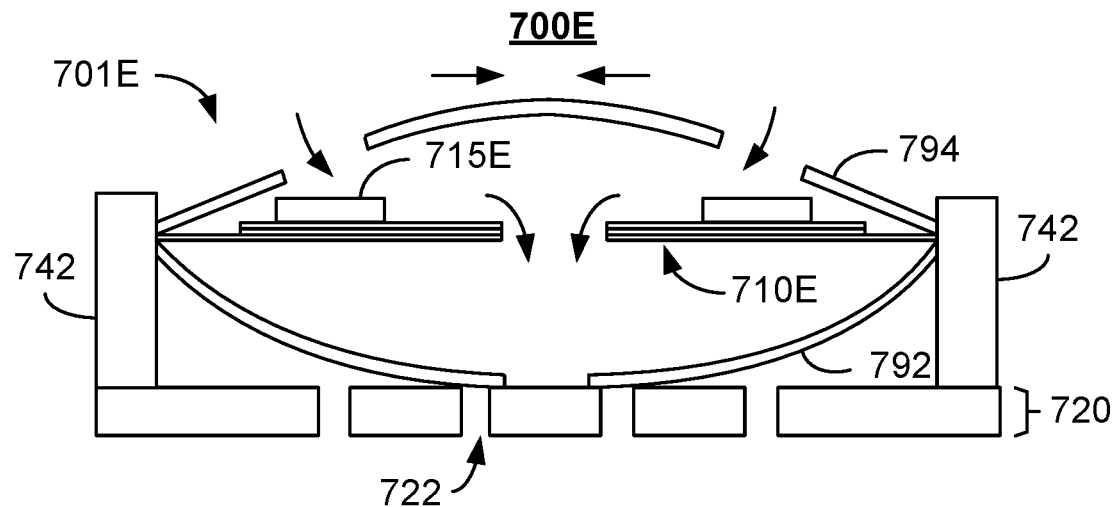
Figure 10C:
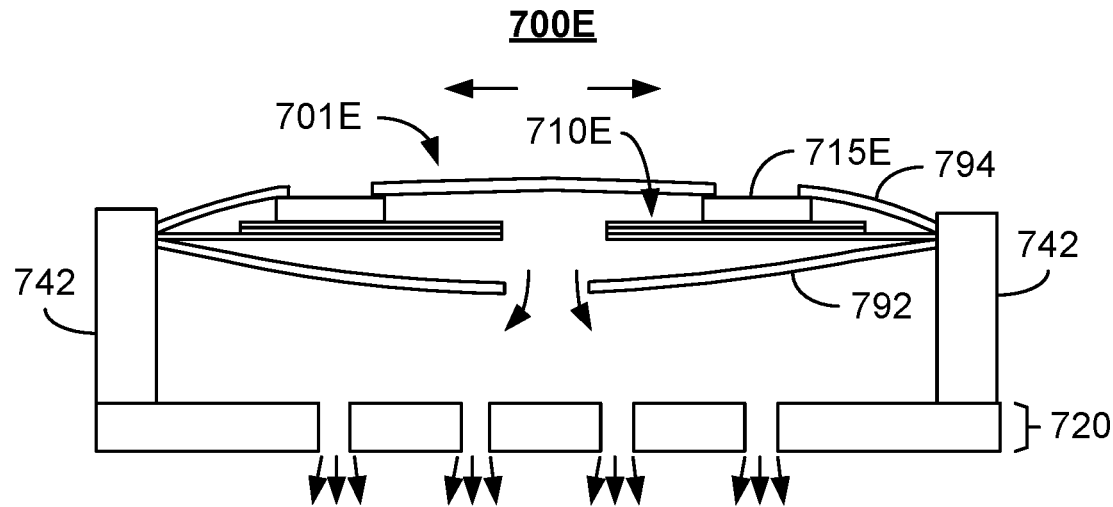

FIGS. 10A-10C are diagrams depicting another exemplary embodiment of a piezoelectric cooling system 700E usable with a structure and including at least one cell 701E. For clarity, only certain components are shown and FIGS. 10A-10C are not to scale. Piezoelectric cooling system 700E includes piezoelectric cooling element 710E that is generally analogous to previously discussed piezoelectric cooling elements but does not have an entry path to allow fluid to pass through cooling element 710E in some embodiments. Thus, piezoelectric cooling element 710E includes substrate 711E, piezoelectric layer 712E and electrode 713E. For simplicity, leads to cooling element 710E and are not shown. Also shown is orifice plate 720 having orifices 722. Piezoelectric cooling system 700E may be a MEMS device and thus may have dimensions analogous to those described above. Piezoelectric cooling system 700E is similar to other piezoelectric cooling systems described herein. Further, elements 792 and 794 are shown. Element 792 may be similar to substrate 711E and includes aperture 793 therein. Element 792 may be similar to substrate 711E and includes apertures 795 therein. In other embodiments, other numbers of apertures may be used in this and other embodiments. The chamber which drives fluid through orifices 722 is formed by elements 792 and 794. Also shown are plugs 715E on piezoelectric cooling element 710E, which are substantially aligned with apertures 795.

Piezoelectric cooling system 700E operates in an analogous manner to other piezoelectric cooling systems disclosed herein. However, piezoelectric cooling element 710E undergoes tensile and compressive motion. Thus, the direction(s) of vibration is substantially perpendicular to the vibration direction described previously. In operation, piezoelectric element 710E is driven. Piezoelectric cooling element 710E is actuated to compress and stretch substantially along the surface of orifice plate 720. This is shown by the two-headed arrow in FIG. 10A and the arrows in FIGS. 10B and 10C. FIG. 10B depicts piezoelectric cooling system 700E after piezoelectric cooling element 710E is driven to be compressed. Consequently, elements 792 and 794 deform away from piezoelectric cooling element 710E. Element 792 contacts orifice plate 720, preventing or reducing backflow of fluid through orifices 722. To this extent, element 792 also acts as a valve. Element 794 draws outside fluid through apertures 795. Fluid also flows through aperture 714, from the distal side to the proximal side of piezoelectric cooling element 710E. Thus, the chamber formed by elements 792 and 794 takes in fluid. Fluid flow is indicated by arrows in FIG. 10B.

FIG. 10C depicts piezoelectric cooling system 700E when piezoelectric cooling element 710E is under tensile strain. Thus, piezoelectric cooling element 710E stretches and elements 792 and 794 move toward piezoelectric cooling element 710E. Apertures 795 contact plugs 715E and/or piezoelectric cooling element 710E. Consequently, outflow of fluid from apertures 795 may be prevented or reduced. Thus, plugs 715E and/or piezoelectric cooling element 710E may also function as a valve. Fluid flows through aperture 793 and orifices 792. Fluid flow is indicated by arrows in FIG. 10C. Thus, piezoelectric cooling element 710E in combination with elements 792 and 794 move fluid from the distal to the proximal side of piezoelectric cooling element 710E and drive the fluid through orifices in orifice plate 720. As such, piezoelectric cooling element 710E can be considered to be configured to direct the fluid from the distal side to the proximal side of piezoelectric cooling element 710E such that the fluid moves in a direction that is incident on a surface of a heat-generating structure (not shown in FIGS. 10A-10C) at a substantially perpendicular angle and then is deflected to move along the surface of the heat-generating structure to extract heat from the heat-generating structure.

Piezoelectric cooling system 700E may share the benefits of other piezoelectric cooling systems described herein. Piezoelectric cooling system 700E may more efficiently dissipate heat from a structure (not shown). Piezoelectric cooling system 700D may move fluid at speeds of at least thirty meters per second, at least fifty meters per second or above. Further, cooling system 700E is a MEMS device having the dimensions described above. Thus, piezoelectric cooling system 700E is suitable for use in mobile devices, such as smart phones, in which limited space is available. Piezoelectric cooling system 700E may also be used in other compute devices-both mobile and non-mobile. Performance of such devices may thus be improved. Because piezoelectric cooling elements 700E may be vibrated at ultrasonic frequencies and/or at or near resonance, piezoelectric cooling system 700E may be quieter and consume less power. Thus, the benefits of improved, quiet cooling may be achieved with limited additional power. Further, an active valve near orifice plate 720 may be omitted. Consequently, performance of devices incorporating cooling system 700E may be improved.

Figure 11:
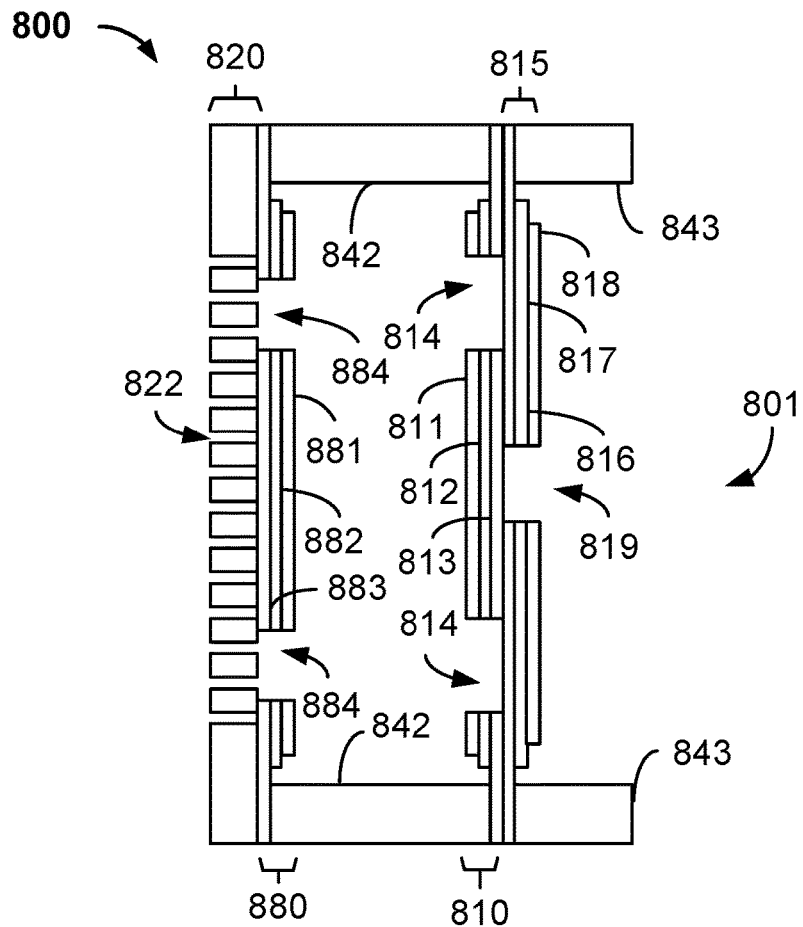
FIG. 11 is a diagram depicting an exemplary embodiment of a piezoelectric cooling system.

FIG. 11 is a diagram depicting an exemplary embodiment of piezoelectric cooling system 800. For clarity, only certain components are shown and FIG. 11 is not to scale. Piezoelectric cooling system 800 is used in connection with a structure (not shown) to be cooled and includes a cell 801. Piezoelectric cooling system 800 may fit within mobile computing devices and is a MEMS cooling device. Piezoelectric cooling system 800 may also be viewed as a single cell in a larger cooling system that may include multiple cells/piezoelectric cooling systems 800.

Piezoelectric cooling system 800 includes piezoelectric cooling element 810, orifice plate 820, active valve 815 and valve 880 that are analogous to previously described cooling elements, orifice plates, active valves and valve(s), respectively. Piezoelectric cooling element 810 thus includes substrate 811, piezoelectric layer 812 and electrode 813 having apertures 814 that are offset from the center. Similarly, valve 815 includes substrate 816, piezoelectric layer 817 and electrode 818. Active valve 880 includes substrate 881, piezoelectric layer 882 and electrode 883 having apertures 884 therein. For simplicity, leads are not shown. Also shown are spacers 842 and 843 that are analogous to previously described spacers that are similarly located. Although not shown, chimneys adjacent to cell 801 and that are analogous to previously described chimneys may be present. Thus, piezoelectric cooling system 800 is most analogous to piezoelectric cooling system 500. However, active valve 815 is present instead of passive valve 515. In other embodiments, a passive valve may be used instead of active valve 815.

Piezoelectric cooling system 800 may be a MEMS device and thus may have dimensions analogous to those described above. Piezoelectric cooling system 800 is similar to other piezoelectric cooling systems described herein. However, the orientation of piezoelectric cooling system 800 with respect to the top of the page has changed. This indicates that one or more of the piezoelectric cooling systems described herein may be oriented in other manners than shown in FIGS. 1A-20B. For example, in addition to piezoelectric cooling system 800, other piezoelectric cooling systems described herein may be used to drive macroscopic fluid flow through a device, across components of the device such that the flow is substantially parallel to a top surface of the device. Piezoelectric cooling system 800 may thus be used to cool vertical structures and/or provide macroscopic motion of a fluid, such as air.

In operation, cooling element 810 is actuated to vibrate. Valve 815 is actuated such that fluid flows through apertures 814 and 819 from the distal to the proximal side of cooling element 810 during motion of cooling element 810 away from orifice plate 820. Similarly valve 880 is actuated to close most or all of orifices 822 during motion of cooling element 810 away from orifice plate 820. Thus, drawing in of fluid through orifices 822 is reduced or eliminated. During motion of cooling element 810 toward orifice plate 820, valve 815 is actuated to close apertures 814. In contrast, valve 880 is actuated to move away from orifice plate 820 so that fluid has a path through apertures 884 and orifices 822. Thus, cooling element 810 pushes fluid through orifices in jets.

Piezoelectric cooling system 800 may share the benefits of other piezoelectric cooling systems described herein. Piezoelectric cooling system may more efficiently dissipate heat from a structure, allowing for higher clock speeds and/or power for longer times. Thus, performance of a device utilizing cooling system 800 may be improved. Further, piezoelectric cooling system 800 is a MEMS device having the dimensions described above. Thus, piezoelectric cooling system 800 is suitable for use in mobile devices, such as smart phones, in which limited space is available. Piezoelectric cooling system 800 may also be used in other compute devices-both mobile and non-mobile. Performance of such devices may thus be improved. Because piezoelectric cooling elements 810 may be vibrated at ultrasonic frequencies and/or at or near resonance, piezoelectric cooling system 800 may be quieter and consume less power. Thus, the benefits of improved, quiet cooling may be achieved with limited additional power. Consequently, performance of devices incorporating cooling system 800 may be improved.

FIGS. 12A, 12B, 12C and 12D are diagrams depicting exemplary embodiments of piezoelectric cooling systems 900A, 900B, 900C and 900D, respectively. For clarity, only certain components are shown and FIGS. 12A-12D are not to scale. Cooling systems 900A, 900B, 900C and 900D are used in connection with a structure (not shown) analogous to structures described above. Cooling systems 900A, 900B, 900C and 900D may be MEMS systems having dimensions in the ranges described above and in proximity to the structures desired to be cooled as described above.

Figure 12A:
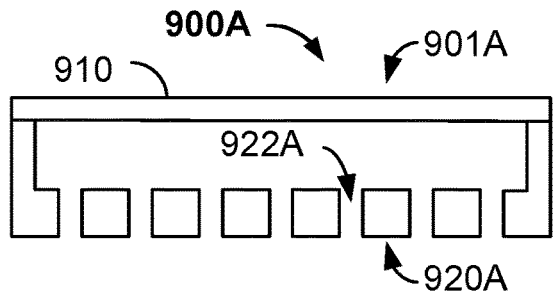
FIGS. 12A-12D are diagrams depicting exemplary embodiments of piezoelectric cooling systems.

FIG. 12A depicts piezoelectric cooling system 900A including cell 901A having cooling element 910 and orifice plate 920A having apertures 922A that are analogous to cells, piezoelectric cooling elements, and orifice plates having apertures described above. For simplicity, valve and apertures in cooling element 910 are not shown. A return path that may exist outside of cell 901A is not shown for simplicity. Piezoelectric cooling system 900A operates in an analogous manner to piezoelectric cooling systems described above. In the embodiment shown in FIG. 12A, orifices 922A are oriented substantially perpendicular to the surface of orifice plate 920A. Although shown as having constant diameter, orifices 922A may have a diameter or shape that changes through orifice plate 920A.

Figure 12B:
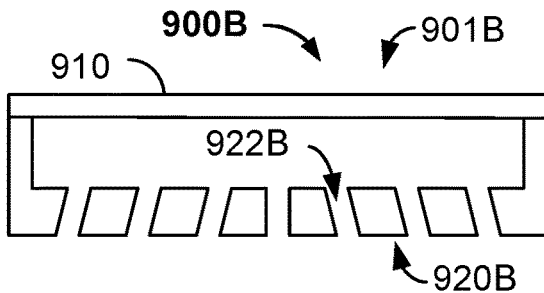

FIG. 12B depicts piezoelectric cooling system 900B including cell 901B having cooling element 910 and orifice plate 920B having apertures 922B that are analogous to cells, piezoelectric cooling elements, and orifice plates having apertures described above. For simplicity, valve and apertures in cooling element 910 are not shown. A return path that may exist outside of cell 901B is not shown for simplicity. Piezoelectric cooling system 900B operates in an analogous manner to piezoelectric cooling systems described above. In the embodiment shown in FIG. 12B, orifices 922B are oriented at either substantially perpendicular to the surface of orifice plate 920B (the central orifice) or at a nonzero acute angle from normal to the surface of orifice plate 920B. In particular, orifices 922B are generally oriented toward the edges of cell 901B. Although shown as having constant diameter, orifices 922B may have a diameter or shape that changes through orifice plate 920B.

Figure 12C:
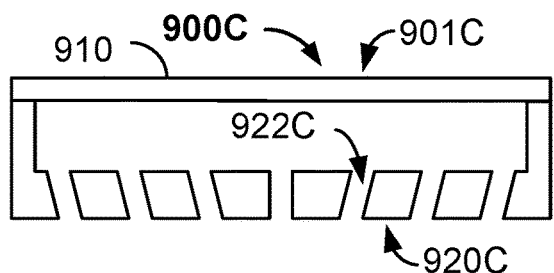

FIG. 12C depicts piezoelectric cooling system 900C including cell 901C having cooling element 910 and orifice plate 920C having apertures 922C that are analogous to cells, piezoelectric cooling elements, and orifice plates having apertures described above. For simplicity, valve and apertures in cooling element 910 are not shown. A return path that may exist outside of cell 901C is not shown for simplicity. Piezoelectric cooling system 900C operates in an analogous manner to piezoelectric cooling systems described above. In the embodiment shown in FIG. 12C, orifices 922C are oriented at either substantially perpendicular to the surface of orifice plate 920C (the central orifice) or at a nonzero acute angle from normal to the surface of orifice plate 920C. In particular, orifices 922C are generally oriented toward the center of cell 901C. Although shown as having constant diameter, orifices 922C may have a diameter or shape that changes through orifice plate 920C.

Figure 12D:
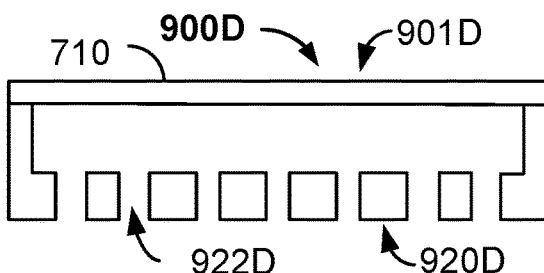
Figure 13A:
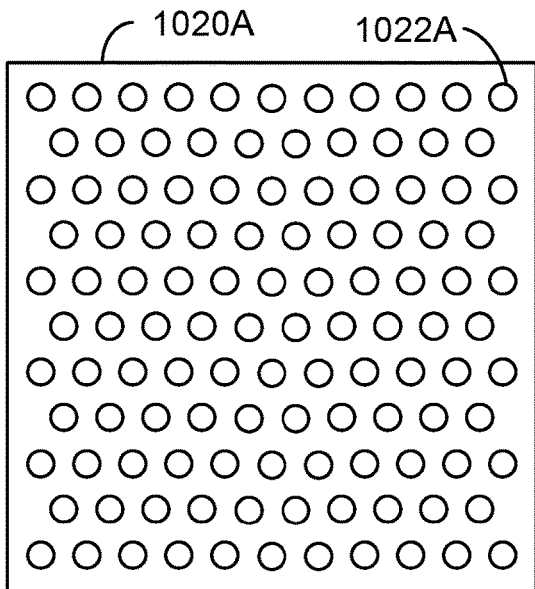
FIGS. 13A-13E are diagrams depicting exemplary embodiments of orifice plates for a piezoelectric cooling system.
Figure 13B:
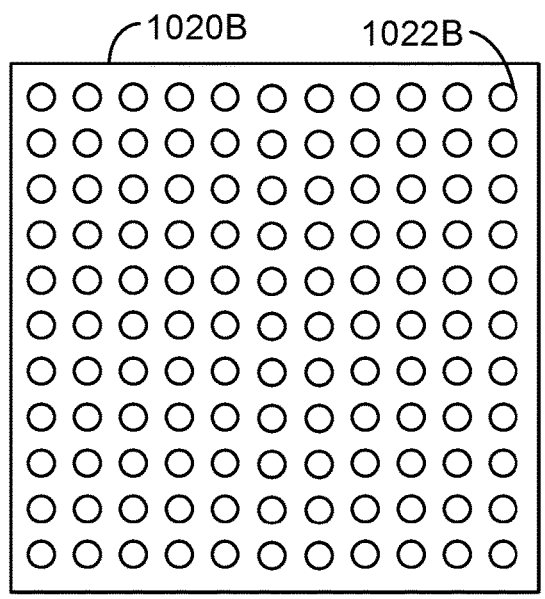
Figure 13C:
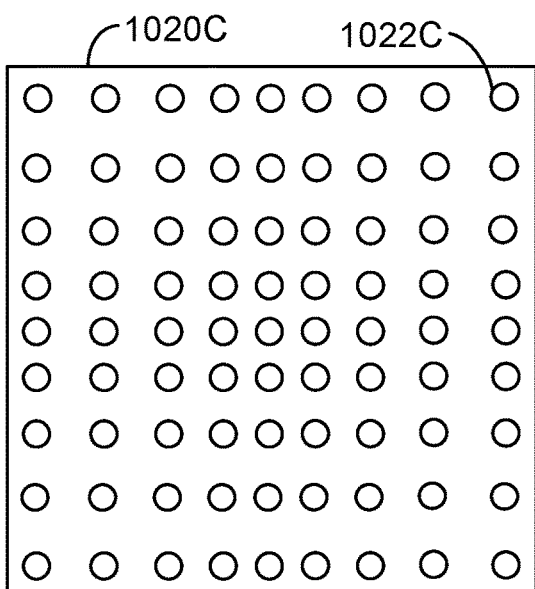
Figure 13D:
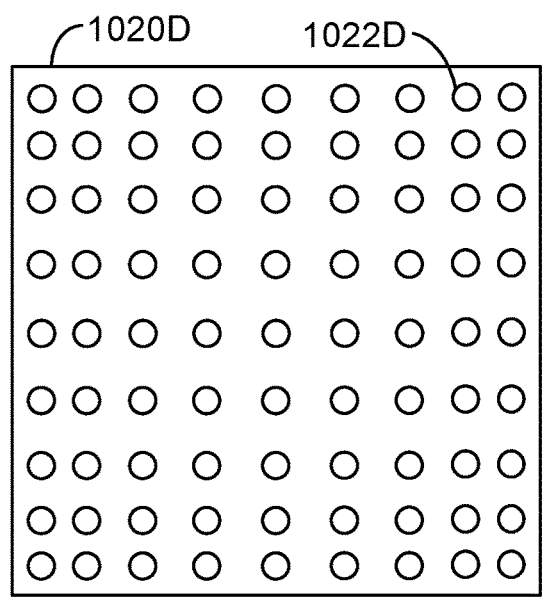
Figure 13E:
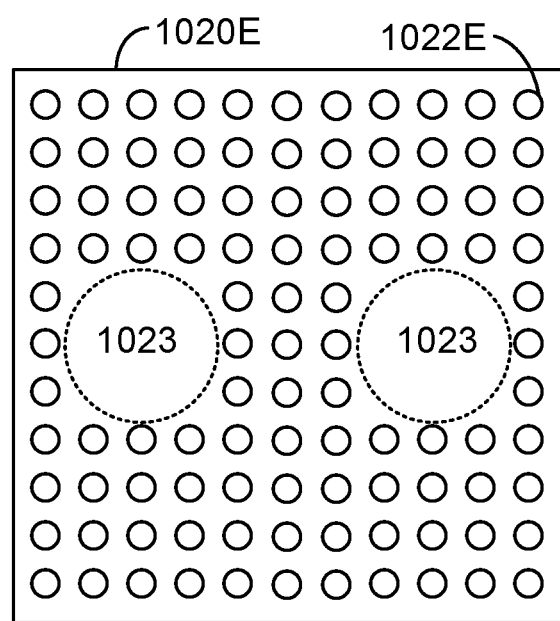

FIG. 12D depicts piezoelectric cooling system 900D including cell 901D having cooling element 910 and orifice plate 920D having apertures 922D that are analogous to cells, piezoelectric cooling elements, and orifice plates having apertures described above. For simplicity, valve and apertures in cooling element 910 are not shown. A return path that may exist outside of cell 901D is not shown for simplicity. Piezoelectric cooling system 900D operates in an analogous manner to piezoelectric cooling systems described above. In the embodiment shown in FIG. 12D, orifices 922D are oriented substantially perpendicular to the surface of orifice plate 920D, but have different diameters or shapes. For example, in some embodiments, the orifice diameter decreases with increasing distance from the center of orifice plate 920D (decreasing distance to the edge of orifice plate 920D). In other embodiments, orifice diameter increases with increasing distance from the center of orifice plate 920D. Other arrangements of diameters are possible.

Piezoelectric cooling systems 900A, 900B, 900C and 900D share the benefits of the piezoelectric cooling systems described herein. Thus, efficient, quite cooling using high speed fluid flows may be provided. In addition, because of the configurations of orifices 922A, 922B, 922C and 922D, the flow through orifices 922A, 922B, 922C and 922D, as well as the jets formed may be tailored. Consequently, performance may be further enhanced.

FIGS. 13A, 13B, 13C, 13D and 13E are diagrams depicting exemplary embodiments of orifice plates 1020A, 1020B, 1020C, 1020D and 1020E, respectively. For clarity, only certain components are shown and FIGS. 13A-13E are not to scale. Orifice plates 1020A, 1020B, 1020C, 1020D and 1020E include orifices 1022A, 1022B, 1022C, 1022D and 1022E, respectively. Orifice plates 1020A, 1020B, 1020C, 1020D and 1020E are used in connection with piezoelectric cooling systems analogous to those described above. Thus, orifice plates 1020A, 1020B, 1020C, 1020D and 1020E and orifices 1022A, 1022B, 1022C, 1022D and 1020E may be MEMS components having dimensions in the ranges described above. Orifice plate 1020A includes orifices arranged in a hexagonal close-packed array. Other close packed arrays may also be used. Orifice plate 1020B includes orifices 1022B arranged in a rectangular array. Orifice plate1020C include orifices 1022C arranged such that the orifice density is higher closer to the center of plate 1020C. Orifice plate 1020D includes orifices 1022D arranged such that the orifice density is higher closer to the edges of orifice plate 1020D. Orifice plate 1020E includes orifices 1022E and regions 1023 (indicated by dotted lines). Regions 1023 are configured to be aligned with apertures in a valve, such as apertures 584 in valve 580. Orifices 1022E are arranged such that regions 1023 are free of orifices. Consequently, orifice plate 1020E may more effectively prevent heated fluid from returning through orifices 1022E when piezoelectric cooling element (not shown in FIG. 13E) is driven to move (e.g. deform) away from orifice plate 1020E. Other arrangements are possible. Further, orifices 1022A, 1022B, 1022C, 1022D and 1022E are shown as having a constant diameter. In other embodiments, the diameter, shape and angle perpendicular to the page may vary. Thus, piezoelectric cooling systems using orifice plates 1020A, 1020B, 1020C and 1020D not only share the benefits of the piezoelectric cooling systems described herein, but also may tailor the jets formed using the configuration of orifices 1022A, 1022B, 1022C and 1022D, respectively. Consequently, performance may be further enhanced.

FIGS. 14A-14D are diagrams depicting exemplary embodiments of cooling systems 1100A, 1100B, 1100C and 1100D usable with a heat-generating structure. For clarity, only certain components are shown and FIGS. 14A-14D are not to scale. Cooling systems 1100A, 1100B, 1100C and 1100D are used in connection with a structure 1130 analogous to structure 130 and 230. Structure 1130 generates heat during operation and is desired to be cooled. Cooling systems 1100A, 1100B, 1100C and 1100D may be MEMS systems having dimensions in the ranges described above.

Figure 14A:
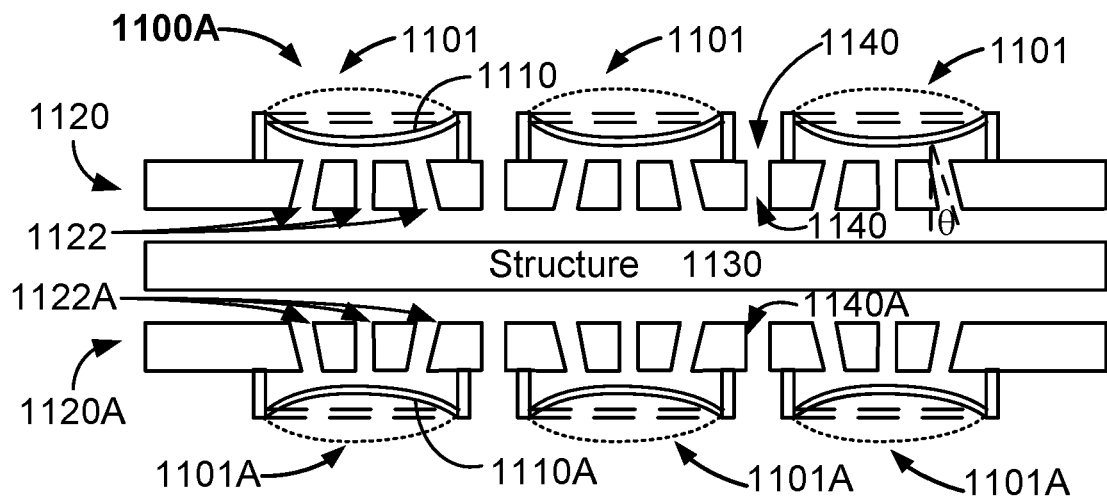
FIGS. 14A-14D are diagrams depicting exemplary embodiments of cooling systems usable with structures.

FIG. 14A depicts piezoelectric cooling system 1100A having cells on both side of structure 1130. Thus, piezoelectric cooling system 1100A includes cells 1101 and 1101A, cooling elements 1110 and 1110A, and orifice plates 1120 and 1120A having apertures 1122 and 1122A that are analogous to cells, piezoelectric cooling elements, and orifice plates having apertures described herein. Orifice plates 1120 and 1120A are also shown as including chimneys/return paths 1140 and 1140A, respectively, that are analogous to chimneys/return paths 240. Further, some of orifices 1122 and 1122A are at a nonzero acute angle, θ, with respect to normal to the surface of structure 1130. In the embodiment shown, orifices 1140 and 1140A are either vertical or angled toward the edges of each cell 1101 and 1101A, respectively.

Piezoelectric cooling system 1100A operates in a manner analogous to piezoelectric cooling systems described herein. Thus, piezoelectric cooling system 1100A may more efficiently and quietly cool structure 1130 at lower power. Further, piezoelectric cooling system cools structure 1130 at multiple surfaces. As a result, performance may be further improved.

Figure 14B:
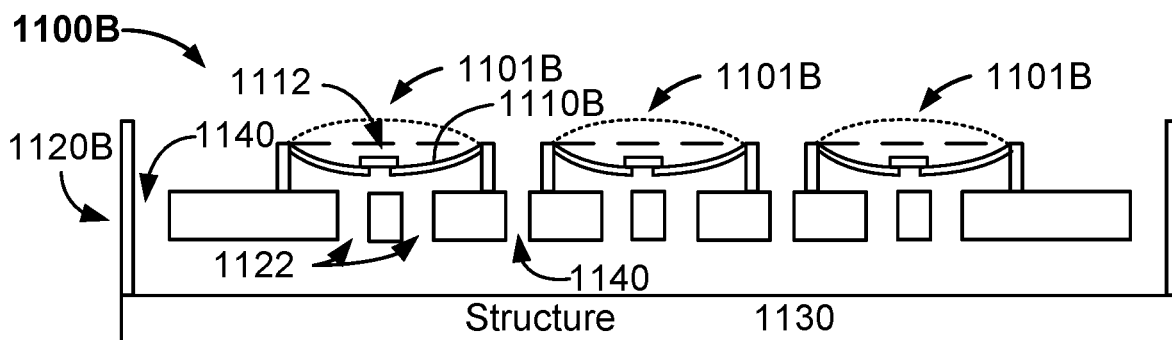

FIG. 14B depicts piezoelectric cooling system 1100B. Piezoelectric cooling system 1100B includes cells 1101B, cooling elements 1110B, and orifice plate 1120B having apertures 1122B that are analogous to cells and their components described herein. Piezoelectric cooling system 1100B operates in an analogous manner to piezoelectric cooling systems described herein. Also shown is return path 1140 for fluid to return from the proximal to the distal sides of piezoelectric cooling elements 1110B. Also shown is entry path 1112 that allows fluid to flow from the distal to the proximal side of piezoelectric cooling elements 1110B when fluid is not being pushed through apertures 1122. In some embodiments, entry path 1112 functions in a manner analogous to valve 215. For example, entry path 1112 may actively or passively control fluid flow from the distal to the proximal side of piezoelectric cooling element 1110B. In other embodiments, entry path may function in a different manner and/or be located at a different portion of piezoelectric cooling elements 1110B.

Piezoelectric cooling system 1100B operates in a manner analogous to piezoelectric cooling systems described herein. Thus, piezoelectric cooling system 1100B may more efficiently and quietly cool structure 1130 at lower power.

Figure 14C:
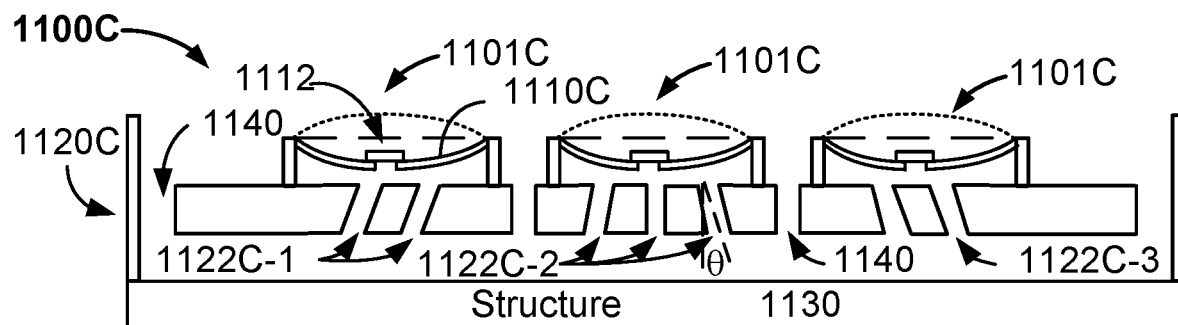

FIG. 14C depicts piezoelectric cooling system 1100C. Piezoelectric cooling system 1100C includes cells 1101C, cooling elements 2210C, and orifice plate 1120C having apertures 1122C-1, 1122C-2 and 1122C-3 that are analogous to cells and their components described herein. Also shown are return path 1140 and entry path 1112 analogous to chimneys 1140/return paths 1140/1140A and valve 215/entry path 1112, respectively. However, some of orifices 1122C-1, 1122C-2 and 1122C-3 are at a nonzero acute angle, θ, with respect to normal to the surface of structure 1130. Thus, in the embodiment shown, orifices 1122C-1, 1122C-2 and 1122C-3 are angled toward the edges of structure 1130. In another embodiment, each of the cells 1101C may have orifices analogous to orifices 1122C-2, which are angled away from the center of the corresponding cell 1101C and toward the return paths 1140.

Piezoelectric cooling system 1100C operates in a manner analogous to piezoelectric cooling systems described herein. Thus, piezoelectric cooling system 1100C may more efficiently and quietly cool structure 1130 at lower power.

Figure 14D:
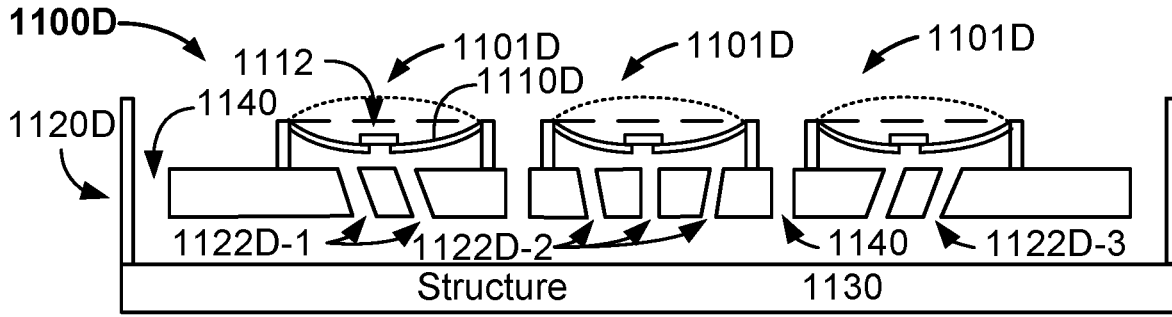

FIG. 14D depicts piezoelectric cooling system 1100D. Piezoelectric cooling system 1100D includes cells 1101D, cooling elements 1110D, and orifice plate 1120D having apertures 1122D-1, 1122D-2 and 1122D-3 that are analogous to cells and their components described herein. Also shown are return path 1140 and entry path 1112 analogous to chimneys 240/return paths 1140 and valve 215/entry path 1112, respectively. However, some of orifices 1122D-1, 1122D-2 and 1122D-3 are at a nonzero acute angle, θ, with respect to normal to the surface of structure 1130. Thus, in the embodiment shown, orifices 1122D-1, 1122D-2 and 1122D-3 are angled toward the center of structure 1130. In another embodiment, each of the cells 1101D may have orifices analogous to orifices 1122D-2, which are angled toward the center of the corresponding cell 1101D.

Piezoelectric cooling system 1100D operates in a manner analogous to piezoelectric cooling systems described herein. Thus, piezoelectric cooling system 1100D may more efficiently and quietly cool structure 1130 at lower power.

FIGS. 15A-15K are diagrams depicting exemplary embodiments of cooling systems 1200A, 1200B and 1200C usable with heat-generating structures. For clarity, only certain components are shown and FIGS. 15A-15G are not to scale. Cooling systems 1200A, 1200B, 1200C, 1200D, 122E, 1200F and 1200G are used in connection with a structure 1230 analogous to structure 130 and 230. Structure 1230 generates heat during operation and is desired to be cooled. Cooling systems 1200A, 1200B, 1200C, 1200D, 122E, 1200F and 1200G may be MEMS systems having dimensions in the ranges described above.

Figure 15A:
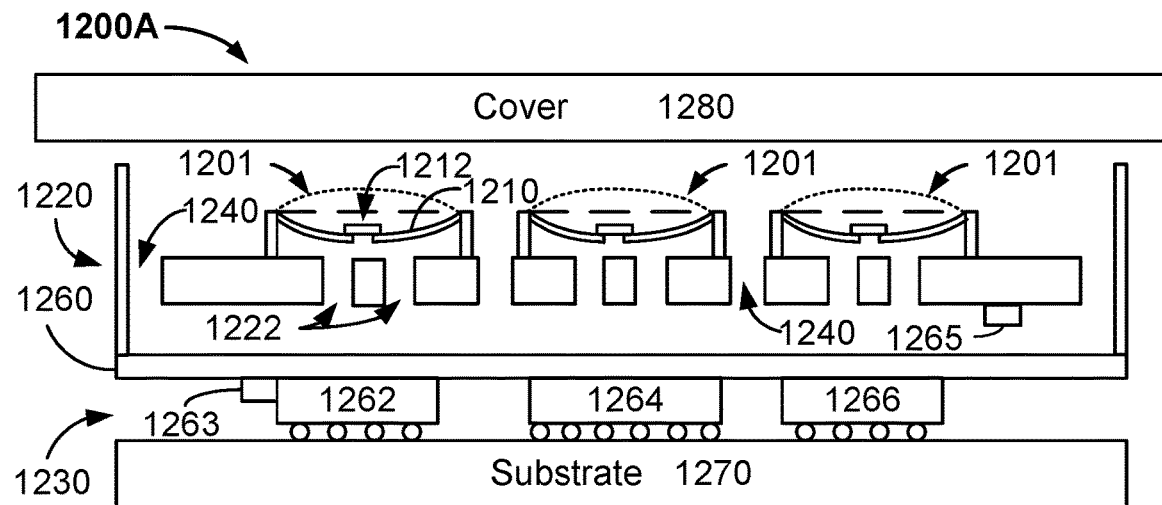
FIGS. 15A-15K are diagrams depicting exemplary embodiments of cooling systems usable with structures.

FIG. 15A depicts piezoelectric cooling system 1200A. Piezoelectric cooling system 1200A includes cells 1201, cooling elements 1210, orifice plate 1220 having apertures 422, entry path 1212 and return path 1240 that are analogous to cells and their components described herein. Piezoelectric cooling system 1200A operates in an analogous manner to piezoelectric cooling systems described herein.

Structure 1230 includes semiconductor devices 1262, 1264 and 1266. Semiconductor devices 1262, 1264 and 1266 may be integrated circuits 1262, 1264 and 1266 residing on substrate 1270. Integrated circuits 1262, 1264 and 1266 generate heat during operation and are desired to be cooled by piezoelectric cooling system 1200A. Structure 1230 also includes heat spreader 1260, which mitigates the increase in local temperature near the integrated circuits 1262, 1264 and 1266 by allowing heat to travel across heat spreader 1260. Heat spreader 1260 thus has a high thermal conductivity coefficient. Piezoelectric cooling system 1200A is used to transfer heat from heat spreader 1260, thereby aiding in cooling integrated circuits 1264, 1264 and 1266. Also shown is temperature sensor 1263 in proximity to integrated circuit 1262. In other embodiments, other and/or additional integrated circuits 164 and/or 1266 might include temperature sensor. Further, a temperature sensor such as temperature sensor 1265 coupled with orifice plate 1220 or analogous structure might be used in addition to or in lieu of sensors such as sensor 1263. Structure 1230 and piezoelectric cooling system 1200A reside within a device having cover 1280. Although indicated to be a cover, in other embodiments, structure 1280 may simply be another portion of the corresponding device in which system 1200A and structure 1230 reside.

Piezoelectric cooling system 1200A operates in a manner analogous to piezoelectric cooling systems described herein. Thus, piezoelectric cooling system 1200A may more efficiently and quietly cool heat spreader 1260, and thus integrated circuits 1262, 1264 and 1266 of structure 430 at lower power. Further, piezoelectric cooling system 1200A may utilizes temperature 1263 sensor 1263 to monitor the temperature of integrated circuit 1262. Thus, cooling system 1200A may be enabled in response to changes in temperature detected by temperature sensor 1263 or other temperature sensor internal to one or more of semiconductor device (s) 1262, 1264 and 1266.

Figure 15B:
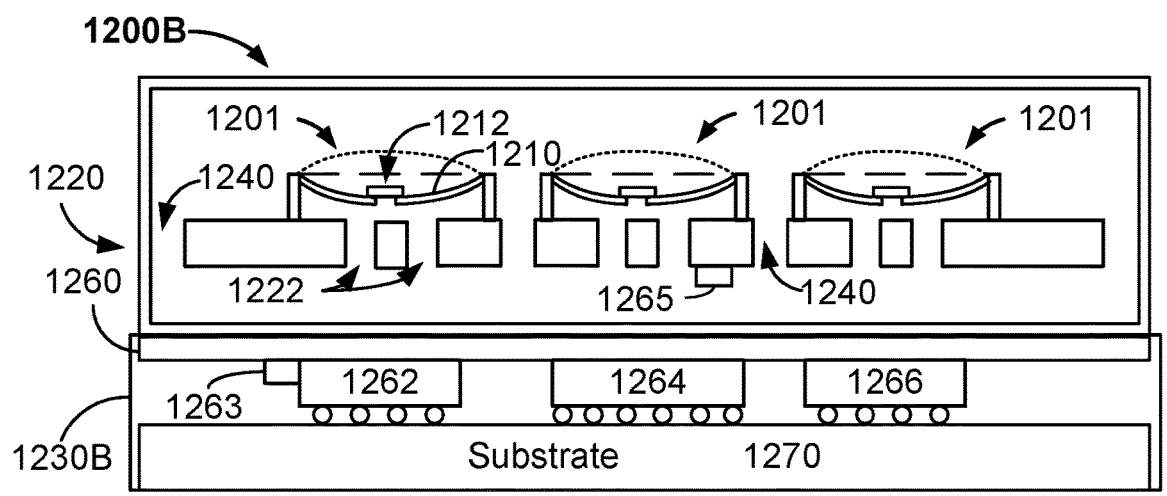

FIG. 15B depicts piezoelectric cooling system 1200B. Piezoelectric cooling system 1200B includes cells 1201, cooling elements 1210, orifice plate 1220 having apertures 1222, entry path 1212 and return path 1240 that are analogous to cells and their components described herein. Also shown is temperature sensor 1263 in proximity to integrated circuit 1262. Other and/or additional temperature sensors could be incorporated for other heat-generating components. Such sensors may be internal and/or external to the heat-generating components. A temperature sensor such as temperature sensor 1265 coupled with orifice plate 1220 or analogous structure might be used in addition to or in lieu of sensors such as sensor 1263.

Structure 1230B is analogous to structure 1230 and thus includes integrated circuits 1262, 1264 and 1266 residing on substrate 1270. Optional heat spreader 1260 and temperature sensor 1634 are also shown. However, structure 1230B is a packaged structure incorporating integrated circuits 1262, 1264 and 1266, which generate heat. Thus, piezoelectric cooling system 400B is mounted on packaged structure 430B.

Piezoelectric cooling system 1200B operates in a manner analogous to piezoelectric cooling systems described herein. Thus, piezoelectric cooling system 1200B may more efficiently and quietly cool structure 1230B, and thus integrated circuits 1262, 1264 and 1266 at lower power.

Figure 15C:
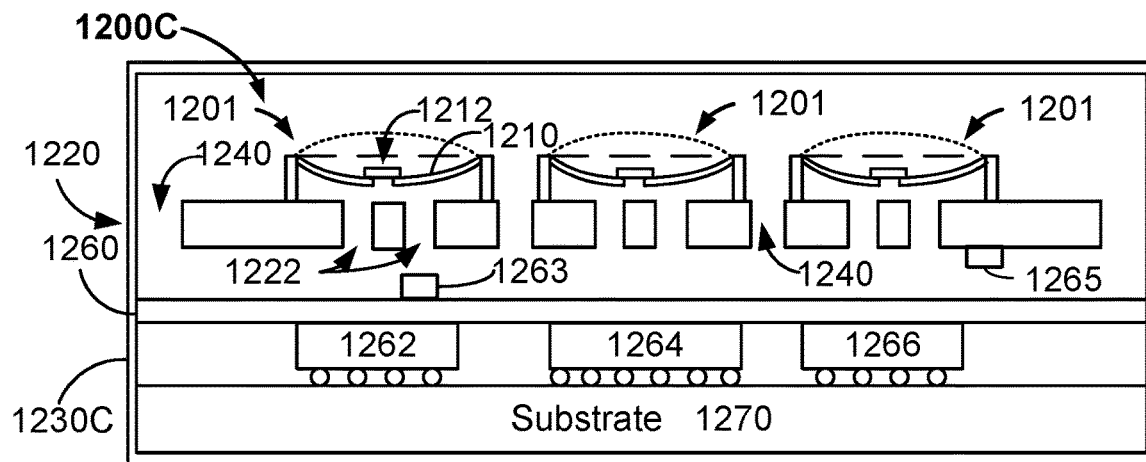

FIG. 15C depicts piezoelectric cooling system 1200C. Piezoelectric cooling system 1200C includes cells 1201, cooling elements 1210, orifice plate 1220 having apertures 1222, entry path 1212 and return path 1240 that are analogous to cells and their components described herein.

Structure 1230C is analogous to structures 1230 and 1230B. Consequently, semiconductor structure 1230C includes integrated circuits 1262, 1264 and 1266 residing on substrate 1270 and optional temperature sensor 1263. Although only one temperature sensor 1263 is shown, multiple temperature sensors might be employed internal or external to integrated circuits 1262, 1264 and/or 1266. Further, a temperature sensor such as temperature sensor 1265 coupled with orifice plate 1220 or analogous structure might be used in addition to or in lieu of sensors such as sensor 1263. Optional heat spreader 1260 is also shown. However, structure 1230B is a packaged structure incorporating not only integrated circuits 1262, 1264 and 1266 but also piezoelectric cooling system 1200B. Stated differently, piezoelectric cooling system is incorporated into packaged structure 1230C.

Piezoelectric cooling system 1200C operates in a manner analogous to piezoelectric cooling systems described herein. Thus, piezoelectric cooling system 1200C may more efficiently and quietly cool integrated circuits 1262, 1264 and 1266 at lower power.

Figure 15D:
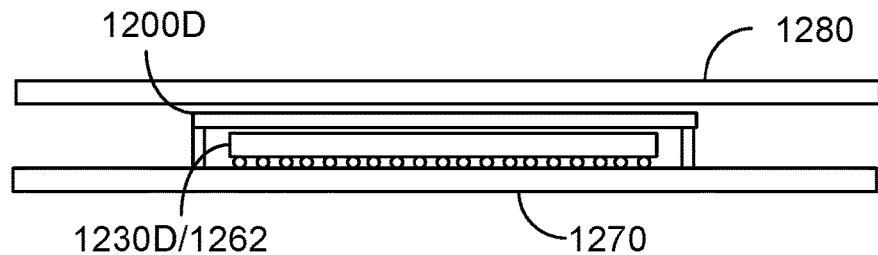
Figure 15E:
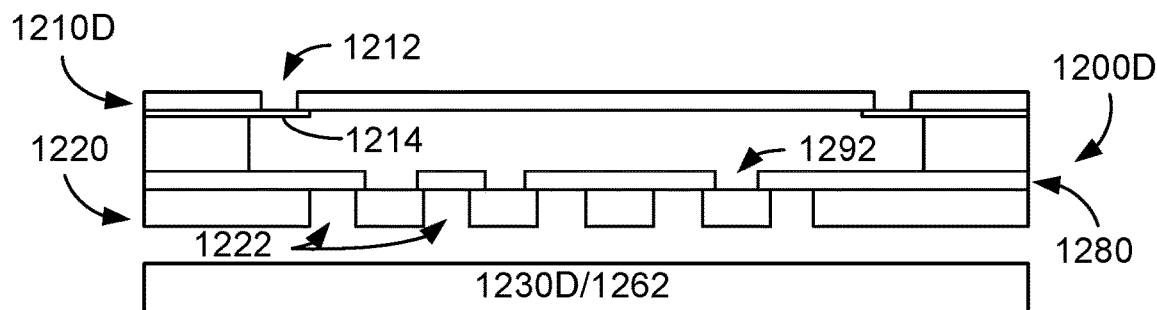

FIGS. 15D and 15E are side and close-up side views of piezoelectric cooling system 1200D used in a device. Piezoelectric cooling system 1200D includes cells, cooling element 1210D, orifice plate 1220 having apertures 1222, entry path 1212, active valve 1280 having apertures 1292 and return path (not explicitly shown) that are analogous to cells and their components described herein. However, for clarity, such structures are not shown.

Structure 1230D is analogous to structures 1230, 1230B and 1230C. Consequently, structure 1230D includes integrated circuit 1262 (e.g. a chip package) residing on substrate 1270. Substrate 1270 may be a printed circuit board. Although not shown, internal and/or external temperature sensors might be employed. Back cover 1280 is also shown. Cooling system 1200D is attached to a frame in proximity to chip package 1262.

Piezoelectric cooling system 1200D operates in a manner analogous to piezoelectric cooling systems described herein. Thus, piezoelectric cooling system 1200D may more efficiently and quietly cool chip package 1262 at lower power. Further, piezoelectric cooling system 1200 may function as an electromagnetic interference (EMI) shield. For example, orifice plate 1220 may function both as a ground and an EMI shield for chip package 1262. Orifices 1222 occupy a small enough fraction of the area of orifice plate 1220 that orifice plate 1220 can perform shielding functions. Thus, performance of chip package 1262 may be improved. Additional piezoelectric cooling systems 1200D can be employed, piezoelectric cooling system 1200D can be increased in size, for example by adding more cells, to cool additional portions of the device. Further, in another embodiment, piezoelectric cooling system 1200D and/or other analogous piezoelectric cooling systems might be oriented perpendicular to what is shown. Thus fluid is driven across and substantially parallel to the top surface of structure 1230D, and substantially perpendicular to side surfaces of structure 1230D.

Figure 15F:
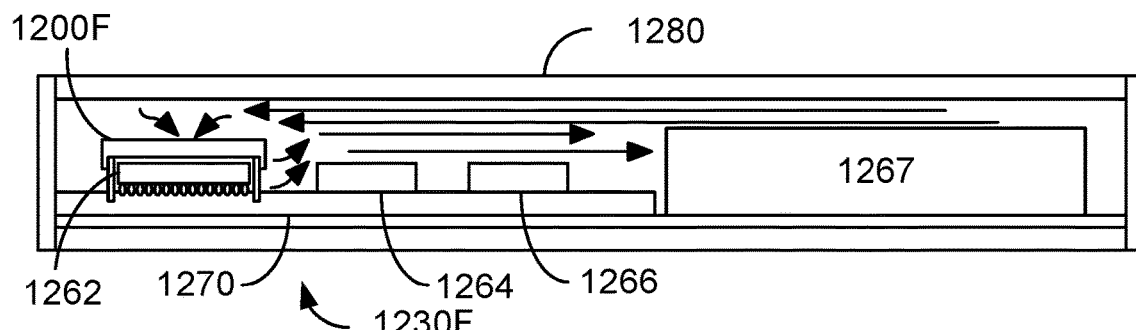

FIG. 15F depicts piezoelectric cooling system 1200F used in a closed device. Piezoelectric cooling system 1200F includes cell(s), cooling element(s), orifice plate(s) having apertures therein, entry path(s), valve(s), return path and other components (not explicitly shown) that are analogous to cells and their components described herein. However, for clarity, such structures are not shown.

Structure 1230F is analogous to structures 1230, 1230B, 1230C and 1230D. Consequently, structure 1230F includes component 1262 (e.g. a chip package) residing on substrate 1270. Substrate 1270 may be a printed circuit board. Also shown are components 1264, 1266 and 1267 which may be integrated circuits or other components. Although not shown, internal and/or external temperature sensors as well as other components including but not limited to a heat spreader might be employed. Cover 1280 is also shown. Cooling system 1200F is attached to a frame in proximity to component 1262.

Piezoelectric cooling system 1200F operates in a manner analogous to piezoelectric cooling systems described herein. As can be seen by arrows in FIG. 15F, cool fluid (e.g. air) near component 1267 is drawn toward piezoelectric cooling device 1200F. Piezoelectric cooling system 1200F drives fluid from its distal to the proximal side. Thus, fluid is driven toward component 1262 as described herein. The fluid exits the region from near the sides of component 1262 carrying heat from component 1262 away. Thus, piezoelectric cooling system 1200F may more efficiently and quietly cool component 1262 at lower power. Thus, performance of component 1262 may be improved. Additional piezoelectric cooling systems can be employed, piezoelectric cooling system 1200F can be increased in size, for example by adding more cells, to cool additional portions of the device, such as components 1264 and 1266. Further, in another embodiment, piezoelectric cooling system 1200F might be oriented perpendicular to what is shown. In such an embodiment, piezoelectric cooling system 1200F may be used to drive fluid flow across components 1262, 1264, 1266 and 1267.

Figure 15G:
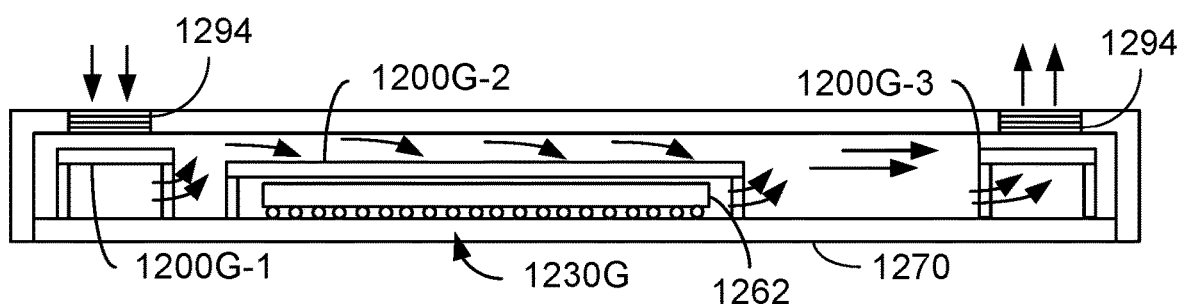

FIG. 15G depict piezoelectric cooling systems 1200G-1, 1200G-2 and 1200G-3 used in a device with vents. Each piezoelectric cooling system 1200G-1, 1200G-2 and 1200G-3 includes cell(s), cooling element(s), orifice plate(s) having apertures therein, entry path(s), valve(s), return path (s) and other components (not explicitly shown) that are analogous to cells and their components described herein. For clarity, such structures are not shown.

Structure 1230G is analogous to structures 1230, 120B, 1230C, 120D and 1230F. Consequently, structure 1230G includes component 1262 (e.g. a chip package) residing on substrate 1270. Substrate 1270 may be a printed circuit board. Also shown are vents 1294. Although not shown, internal and/or external temperature sensors as well as other components including but not limited to a head spreader may be used.

Piezoelectric cooling systems 1200G-1, 1200G-2 and 1200G-3 operate in a manner analogous to piezoelectric cooling systems described herein. As can be seen by arrows in FIG. 15G, cool fluid (e.g. air) outside of the system is drawn in through vent 1294. This occurs because of the piezoelectric cooling system 1200G-1, which operates in a manner analogous to a fan. Fluid travels to the distal side of piezoelectric cooling system 1200G-2, which drives fluid from its distal to the proximal side. Thus, fluid is driven toward component 1262 as described herein. The fluid exits the region from near the sides of component 1262 carrying heat from component 1262 away. Piezoelectric cooling system 1200G-3 drives fluid out of the system through vent 1294. Piezoelectric cooling system, therefore, generates fluid flow throughout the system to better dissipate heat generated by component 1262. Thus, piezoelectric cooling system 1200G may more efficiently and quietly cool component 1262 at lower power. Thus, performance of component1262 may be improved. Additional piezoelectric cooling systems 1200G can be employed, piezoelectric cooling system 1200G can be increased in size, for example by adding more cells, to cool additional portions of the device. Further, piezoelectric cooling system 1200G-2 may be omitted in some embodiments. In such embodiments, piezoelectric cooling systems, such as systems 1200G-1 and 1200G-3, may generate fluid flow through the system. In some such embodiments, additional piezoelectric cooling systems could be oriented as indicated in FIG. 11 (perpendicular to the orientation of piezoelectric cooling system 1200G-2), to drive fluid flow along the surfaces between piezoelectric cooling systems 1200G-1 and 1200G-3.

Figure 15H:
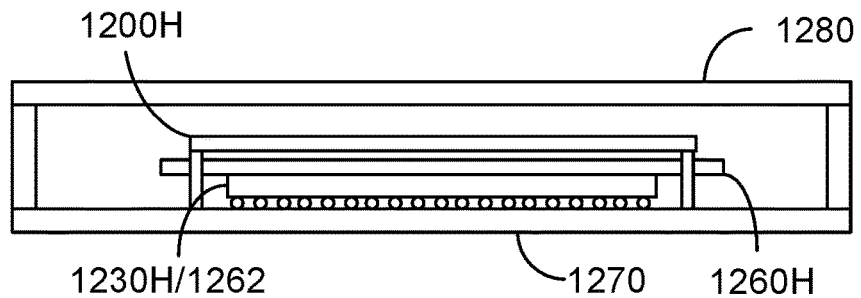

FIG. 15H depicts piezoelectric cooling system 1200H used in cooling a structure. Piezoelectric cooling system 1200H includes cell(s), cooling element(s), orifice plate(s) having apertures therein, entry path(s), valve(s), return path and other components (not explicitly shown) that are analogous to cells and their components described herein. However, for clarity, such structures are not shown.

Structure 1230H is analogous to structures 1230, 1230B, 1230C, 1230D, 1230F and 1230G-1 through 1230G-3. Consequently, structure 1230H includes component 1262 (e.g. a chip package) residing on substrate 1270. Substrate 1270 may be a printed circuit board. Also shown is heat spreader 1260H. Although not shown, internal and/or external temperature sensors as well as other components. Cover 1280 is also shown. Cooling system 1200H is attached to a frame in proximity to heat spreader 1230H. Thus, heat spreader 1260H spreads heat from component 1262 over a larger area and piezoelectric cooling system 1200H cools this larger area of head spreader 1260H.

Piezoelectric cooling system 1200H operates in a manner analogous to piezoelectric cooling systems described herein. Thus, piezoelectric cooling system 1200H may more efficiently and quietly cool component 1262 at lower power.

Figure 15I:
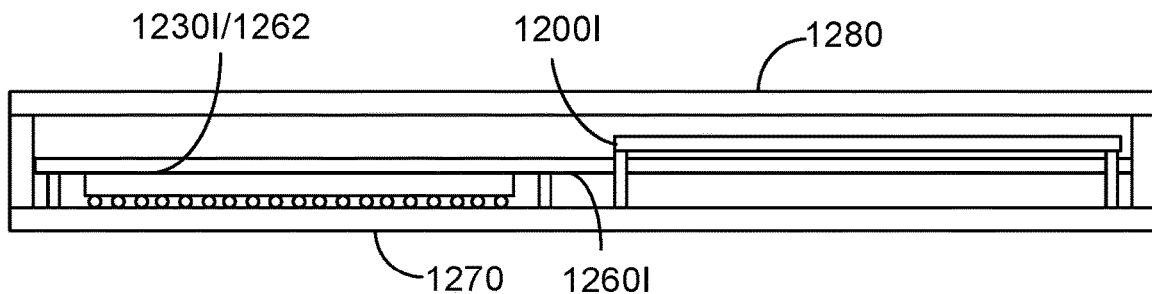

FIG. 15I depicts piezoelectric cooling system 1200I used in cooling a structure. Piezoelectric cooling system 1200I includes cell(s), cooling element(s), orifice plate(s) having apertures therein, entry path(s), valve(s), return path and other components (not explicitly shown) that are analogous to cells and their components described herein. However, for clarity, such structures are not shown.

Structure 1230I is analogous to structures 1230, 1230B, 1230C, 1230D, 1230F, 1230G-1 through 1230G-3 and 1230H. Consequently, structure 1230I includes component 1262 (e.g. a chip package) residing on substrate 1270. Substrate 1270 may be a printed circuit board. Also shown is heat pipe 1260I. Although not shown, internal and/or external temperature sensors as well as other components. Cover 1280 is also shown. Cooling system 1200I is attached to a frame in proximity to heat pipe 1260I. Heat pipe 1260I transfers heat from component 1262. Heat pipe 1260 may carry a liquid that transitions to a vapor phase in order to cool component 1262. The vapor is carried away from component 1262 by heat pipe 1260I. Piezoelectric cooling system 1200I then cools heat pipe 1260I. In some embodiments, this cooling may be sufficient that the vapor transitions back to a liquid phase. Thus, piezoelectric cooling system 1200I may act as part of a heat exchanger.

Piezoelectric cooling system 1200I operates in a manner analogous to piezoelectric cooling systems described herein. Piezoelectric cooling system 1200I cools heat pipe 1260I and, therefore, component 1262. Thus, piezoelectric cooling system 1200I may more efficiently and quietly cool component 1262 at lower power.

Figure 15J:
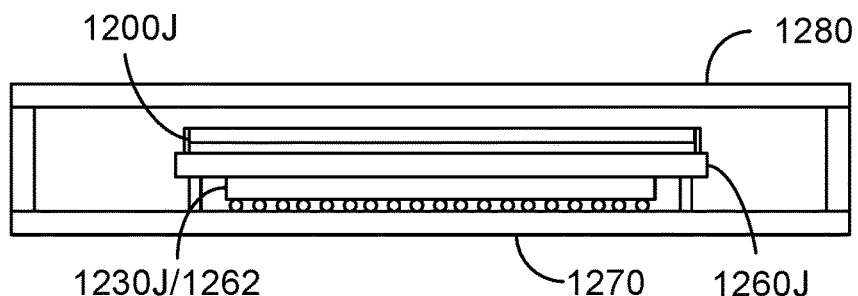

FIG. 15J depicts piezoelectric cooling system 1200J used in cooling a structure. Piezoelectric cooling system 1200J includes cell(s), cooling element(s), orifice plate(s) having apertures therein, entry path(s), valve(s), return path and other components (not explicitly shown) that are analogous to cells and their components described herein. However, for clarity, such structures are not shown.

Structure 1230J is analogous to structures 1230, 1230B, 1230C, 1230D, 1230F, 1230G-1 through 1230G-3, 1230H and 1230I. Consequently, structure 1230J includes component 1262 (e.g. a chip package) residing on substrate 1270. Substrate 1270 may be a printed circuit board. Also shown is vapor chamber 1260J that is analogous to heat pipe 1260I. Although not shown, internal and/or external temperature sensors as well as other components. Cover 1280 is also shown. Cooling system 1200J is attached to a frame in proximity to vapor chamber 1260J. Piezoelectric cooling system 1200J cools vapor chamber 1260J. In some embodiments, this cooling may be sufficient that the vapor transitions back to a liquid phase. Thus, piezoelectric cooling system 1200I may act as part of a heat exchanger.

Piezoelectric cooling system 1200J operates in a manner analogous to piezoelectric cooling systems described herein. Piezoelectric cooling system 1200J cools vapor chamber 1260J and, therefore, component 1262. Thus, piezoelectric cooling system 1200J may more efficiently and quietly cool component 1262 at lower power.

Figure 15K:
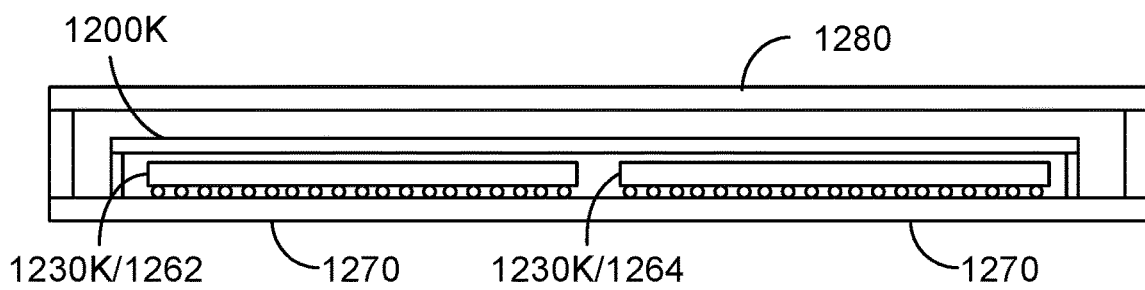

FIG. 15K depicts piezoelectric cooling system 1200K used in cooling a structure. Piezoelectric cooling system 1200K includes cell(s), cooling element(s), orifice plate(s) having apertures therein, entry path(s), valve(s), return path and other components (not explicitly shown) that are analogous to cells and their components described herein. However, for clarity, such structures are not shown.

Structure 1230K is analogous to structures 1230, 1230B, 1230C, 1230D, 1230F, 1230G-1 through 1230G-3, 1230H, 12301 and 1230J. Consequently, structure 1230K includes component 1262 (e.g. a chip package) residing on substrate 1270. Also shown is an additional component 1264 (e.g. an additional chip package) residing on substrate 1270. Although not shown, internal and/or external temperature sensors as well as other components. Substrate 1270 may be a printed circuit board. Cover 1280 is also shown. Cooling system 1200K is attached to a frame in proximity to both components 1262 and 1264. Thus, piezoelectric cooling system 1200K may extend over a large area.

Piezoelectric cooling system 1200K operates in a manner analogous to piezoelectric cooling systems described herein. Thus, piezoelectric cooling system 1200K may more efficiently and quietly cool components 1262 and 1264 at lower power.

Figure 16:
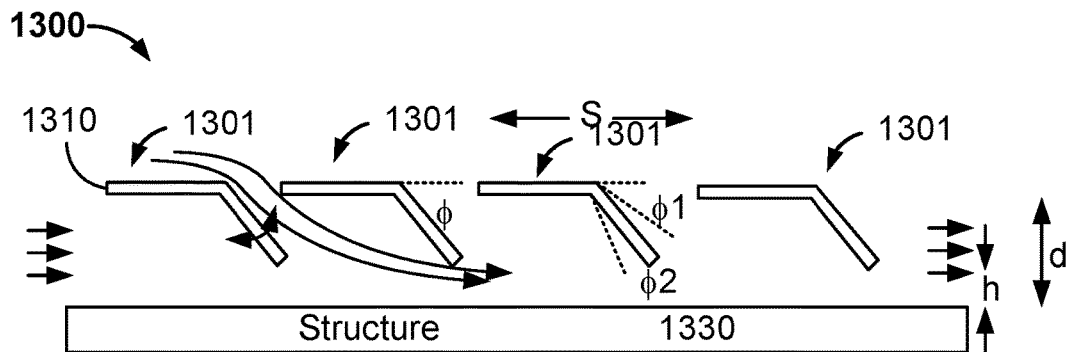
FIG. 16 is a diagram depicting an exemplary embodiment of a cooling system.

FIG. 16 is a diagram depicting an exemplary embodiment of a piezoelectric cooling system 1300 usable with a heat generating structure. For clarity, only certain components are shown and FIG. 16 is not to scale. Piezoelectric cooling system 1300 is used in connection with a structure 1320. Structure 1320 generates heat during operation and is desired to be cooled.

Piezoelectric cooling system 1300 includes multiple cells 1301 each of which includes a piezoelectric blade element 1310. Cells 1301 may have the same size range as described above such that S is at least three millimeters and not more than five millimeters. Piezoelectric blade elements 1310 are oriented at angle φ when quiescent. When actuated, piezoelectric blade elements 510 vibrate between angles φ1 and φ2. In some embodiments, the angle of vibration (φ2-φ1) is at least five degrees and not more than twenty degrees. The lengths of the piezoelectric blade elements 510 may vary depending upon the distance to structure 1330 and the angle of operation. For example, the vibrating portion of blade elements 1310 may be at least one millimeter and not more than five millimeters in length. In some embodiments, the frequency of vibration is nominally 300 Hz. In some embodiments, it, is nominally thirty degrees and h is nominally two hundred fifty microns. The top of each piezoelectric blade element 1310 is a distance, d, above the surface of structure 1320. In some embodiments, d is at least three hundred microns and not more than five hundred microns.

In operation, piezoelectric blade elements 1310 vibrate, drawing fluid from the distal side of one piezoelectric element to the proximal side of another piezoelectric element. This motion of the fluid can be seen by the curved arrows in FIG. 16. Because the fluid is driven along the surface of structure 1330, the fluid can carry heat away from structure 1330. Thus, piezoelectric cooling system 1300 can cool structure 1330 more efficiently than, for example, an electric fan. In some embodiments, cooling cells such as cells 701 (rotated ninety degrees) or 801 might be used. In addition, piezoelectric cooling structure 1300 can be combined with one or more of piezoelectric cooling structures 100, 100A, 200, 1100A, 1100B, 1100C, 1100D, 1200A, 1200B and/or 1200C. In such an embodiment, piezoelectric blade elements 1310 can aid in drawing air along the corresponding heat generating structure. For example, FIG. 1D indicates that fluid is driven not only through orifices 122, but also along the surface of structure 130. This might be accomplished using sets of piezoelectric blade elements 1310. Thus, piezoelectric cooling system 1300 might further improve cooling of piezoelectric cooling structures described herein.

Figure 17A:
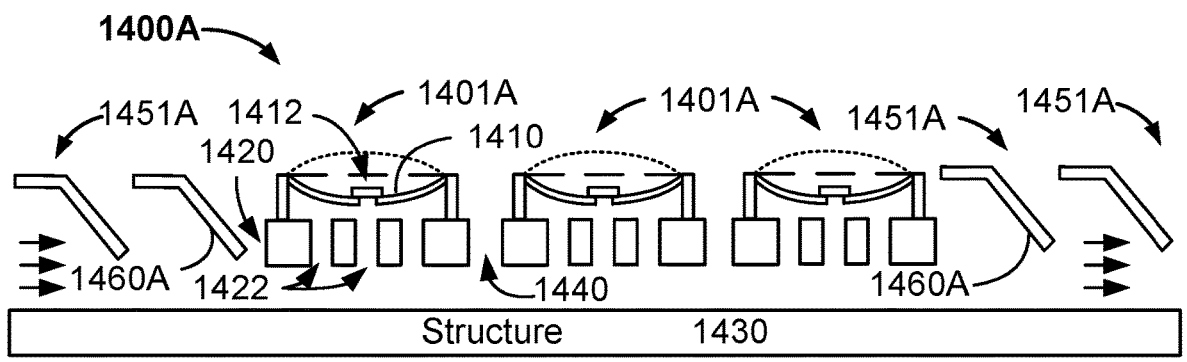
FIGS. 17A-17B are diagrams depicting exemplary embodiments of cooling systems usable with a structure.
Figure 17B:
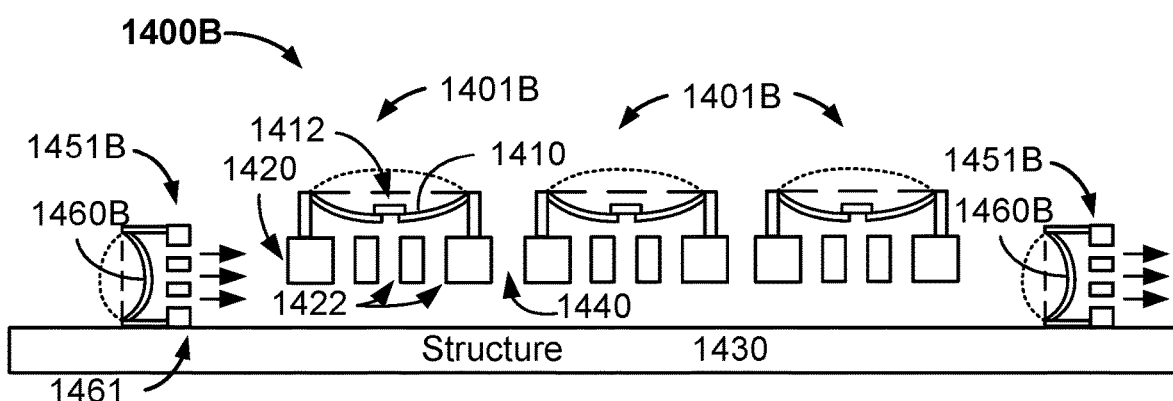

FIGS. 17A-17B are diagrams depicting exemplary embodiments of cooling systems 1400A and 1400B usable with a structure. For clarity, only certain components are shown and FIGS. 17A-17B are not to scale. Cooling systems 1400A and 1400B are used in connection with structure 1430 analogous to structures described above. Cooling systems 1400A and 1400B may be MEMS systems having dimensions in the ranges described above and in proximity to the structures 1430 desired to be cooled as described above.

FIG. 17A depicts piezoelectric cooling system 1400A including cells 1401A and 1451A. Each cell 1401A includes cooling element 1410 and orifice plate 1420 having apertures 1422 that are analogous to cells, piezoelectric cooling elements, and orifice plates having apertures described herein. For simplicity, valve and apertures in cooling element 1410 are represented by entry path 1412. Return path, or chimney 1440, between cells 1401A are also shown. Cells 1451A are analogous to cells 1301 and thus include blades 1460A. Blades 1460A together can move fluid from the distal side to the proximal side of the collection of cells 1451A. Stated differently, blades 1460A may move fluid that has returned from near structure 1430 through chimneys/return paths 1440. In addition, blades 1460A move fluid from the distal side of blades 1460A to the proximal side of blades 1460A.

Cells 1401A operate in an analogous manner to piezoelectric cooling systems described herein. Thus, cooling elements 1410 generate jets of air generally directed toward structure 1430. Cells 1451A move fluid along the surface of structure 1430 in the direction shown by arrows in FIG. 17A. Thus, in addition to cells 1401A cooling structure 1430, cells 1451A may move the fluid to which heat from structure 1430 has been transferred along the surface of structure 1430. Thus, in addition to the benefits of piezoelectric cooling systems described herein, the heat may be more effectively carried away.

FIG. 17B depicts piezoelectric cooling system 1400B including cells 1401B and 1451B. Each cell 1401B includes cooling element 1410 and orifice plate 1420 having apertures 1422 that are analogous to cells, piezoelectric cooling elements, and orifice plates having apertures described herein. For simplicity, valve and apertures in cooling element 1410 are represented by entry path 1412. Return path, or chimney 1440, between cells 1401B are also shown. Cells 1451B are analogous to cells 701 and thus include cooling elements 1460B and orifice plates 1461 having apertures therein.

Cells 1401B operate in an analogous manner to piezoelectric cooling systems described herein. Thus, cooling elements 1410 generate jets of air generally directed toward structure 1430. Cells 1451B move fluid along the surface of structure 1430 in the direction shown by arrows in FIG. 17B. Thus, in addition to cells 1401B cooling structure 1430, cells 1451B may move the fluid to which heat from structure 1430 has been transferred along the surface of structure 1430. Thus, in addition to the benefits of piezoelectric cooling systems described herein, the heat may be more effectively carried away.

Figure 18:
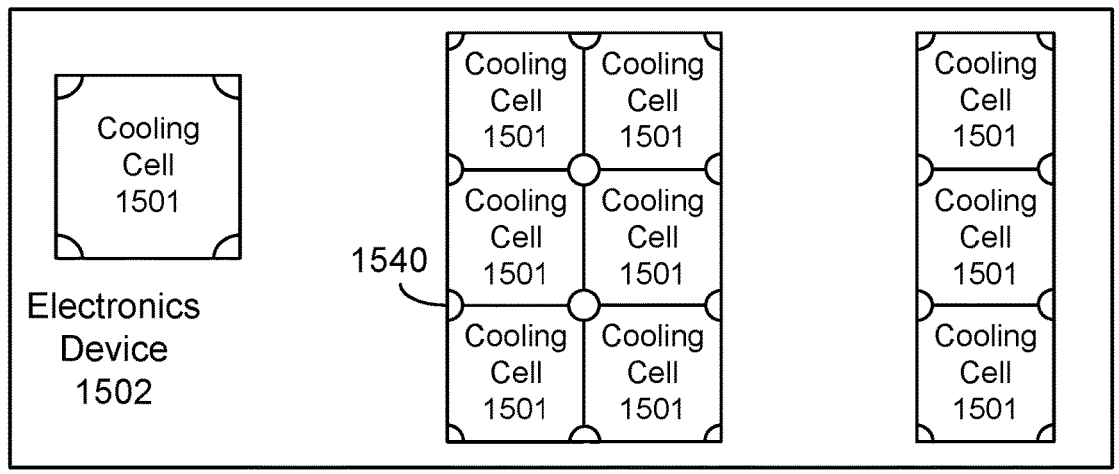
FIG. 18 is a diagram depicting an exemplary embodiment of a cooling system usable with a semiconductor structure.

FIG. 18 is a plan view of an exemplary embodiment of cooling cells 1501 usable with a heat-generating structure. For clarity, only certain components are shown and FIG. 18 is not to scale. Piezoelectric cooling cell 1501 is used in connection with a semiconductor structure or electronic device 1502. Piezoelectric cooling cells 1501 are analogous to one or more of cooling cells described herein having cooling elements that move fluid from a distal to a proximal side of the cooling element. In an alternate embodiment, one or more of cooling cells 1400 may be analogous to cells 1301. Although as including the same cells, one or more of the arrays may include different cells. For example, cells having active valves, cells having passive valves and/or cells not using valves may be mixed within a single array and/or between multiple arrays.

Multiple piezoelectric cooling cells 1501 are distributed across electronic device 1502. In the embodiment shown, three groups of piezoelectric cooling cells 1501 are shown. In particular, a 1×1 rectangular array (shown as having a larger cooling cell 1501), a 3×2 rectangular array and a 3×1 rectangular array of piezoelectric cooling cells 1501 are shown. In some embodiments, each of the arrays is in proximity to a different structure, such as an integrated circuit, that generates heat and is desired to be cooled. Some or all of the arrays are within a semiconductor package in a manner analogous to cooling system 1200C in some embodiments. In other embodiments, some or all of the arrays are outside of a semiconductor package in a manner analogous to cooling system 1200B. Other shapes and sizes of arrays are possible. In some embodiments, the 1×1 array, 3×2 array and 3×1 array may be individually driven. In some embodiments, each individual cell 1501 in one or more of the arrays may be individually driven. Further, in some embodiments, one or more of cells 1501 may be activated to varying amplitudes of deflection of the corresponding cooling elements. Thus, varying sizes, numbers, configurations and activation of piezoelectric cooling cells 1501 can be utilized to cool hot spots of an electronics device.

Figure 19:
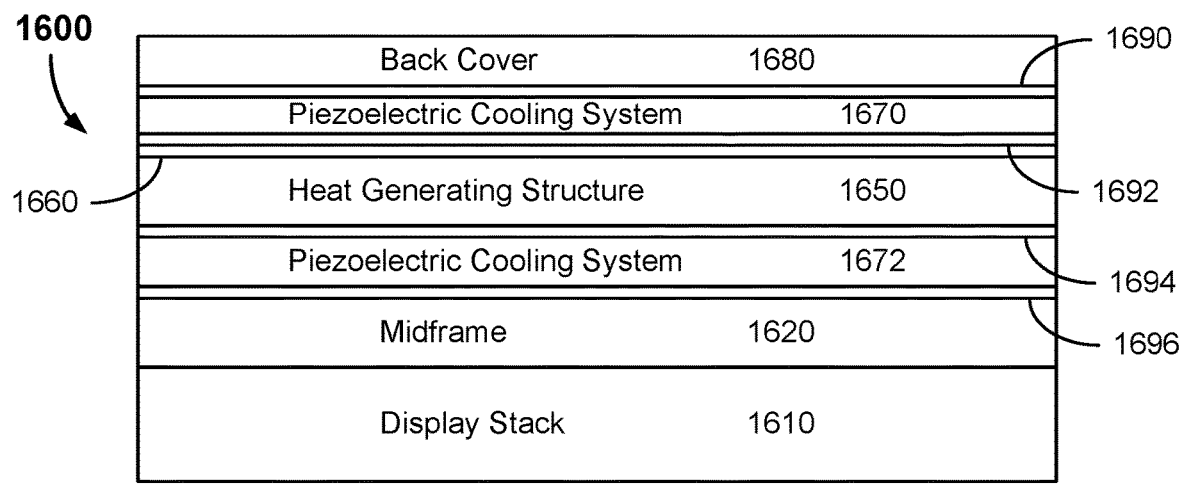
FIG. 19 is a diagram depicting an exemplary embodiment of a mobile device incorporating a piezoelectric cooling system.

FIG. 19 is a diagram depicting an exemplary embodiment of a mobile device 1600 incorporating a piezoelectric cooling system. For clarity, only certain components are shown and FIG. 19 is not to scale. Mobile device 1600 may be a smartphone or other analogous device. Mobile device 1600 includes display stack 1610, midframe 1620, heat generating structure 1650, heat spreader 1660, piezoelectric cooling systems 1670 and 1672 and back cover 1680. For example, heat generating structure 1650 may include one or more chipsets and printed circuit board(s) (PCB). Also shown are airgaps 1690, 1692, 1694 and 1696, which may be one hundred microns or more thick. Components 1610, 1620, 1650, and 1680 already in mobile device 1600 generally range in thickness from 0.5 millimeter through two millimeters. As described above, piezoelectric cooling systems 1670 and 1672 may each be five hundred microns (0.5 millimeter) thick or less. In other embodiments, more or fewer piezoelectric cooling systems may be employed. Thus, piezoelectric cooling systems 1670 and/or 1672 may be incorporated into mobile device 1600 without significantly altering its thickness. Piezoelectric cooling systems 1670 and/or 1672 may have one or more arrays of cooling cells. The arrays and/or cooling cells within the arrays may be selectively driven, as described herein. Piezoelectric cooling system 1670 may and may be used to cool multiple components, such as multiple integrated circuits in chipset (s) 1650, sensors, one or more batteries (not explicitly depicted but which may be coupled to PCB 1640) and/or other components. Further, although two piezoelectric cooling systems 1670 and 1672 are shown as incorporated into mobile device 1600 at a particular location, in other embodiments, one or more piezoelectric cooling systems might be incorporated at other and/or additional locations. In the embodiment shown, chipset 1650 is cooled by corresponding piezoelectric cooling system 1670 and 1672. In other embodiments, more or fewer piezoelectric cooling systems may be used. For example, a particular chipset 1650 may be cooled from both sides. Other configurations are possible. Thus, the benefits of significant cooling that may be quiet and at relatively low power due to resonance may be achieved without substantially increasing the thickness of mobile device 1600.

Figure 20A:
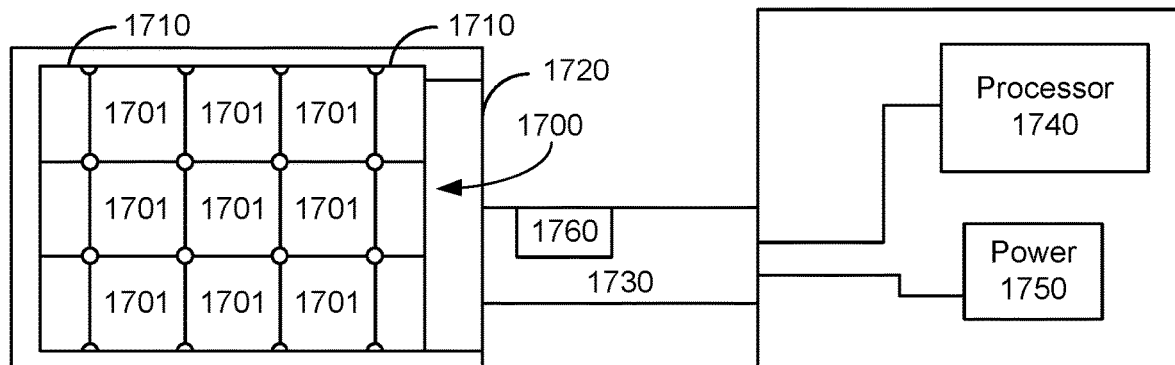
FIGS. 20A-20B are diagrams depicting exemplary embodiments of cooling systems and associated electronics.

FIG. 20A is a diagram depicting an exemplary embodiment of cooling system 1700 and associated electronics. For clarity, only certain components are shown and FIG. 20 is not to scale. Cooling system 1700 is a piezoelectric cooling system analogous to those described herein. In the embodiment shown, piezoelectric cooling system 1700 includes cells 1701 having chimneys (unlabeled circles) between the cells. Cells 1701 are analogous to cells described herein that include a cooling element that moves fluid from the distal to the proximal side of the cooling element and may include an orifice plate having orifices therein. Also included in piezoelectric cooling system are cells 1710 that are analogous to cells 1301, 1451A or 1451B. Thus, piezoelectric cooling system 1700 is analogous to piezoelectric cooling system 1400A or 1400B. In other embodiments, other configurations may be used. Further additional and/or other arrays of cooling cells may be used.

Figure 20B:
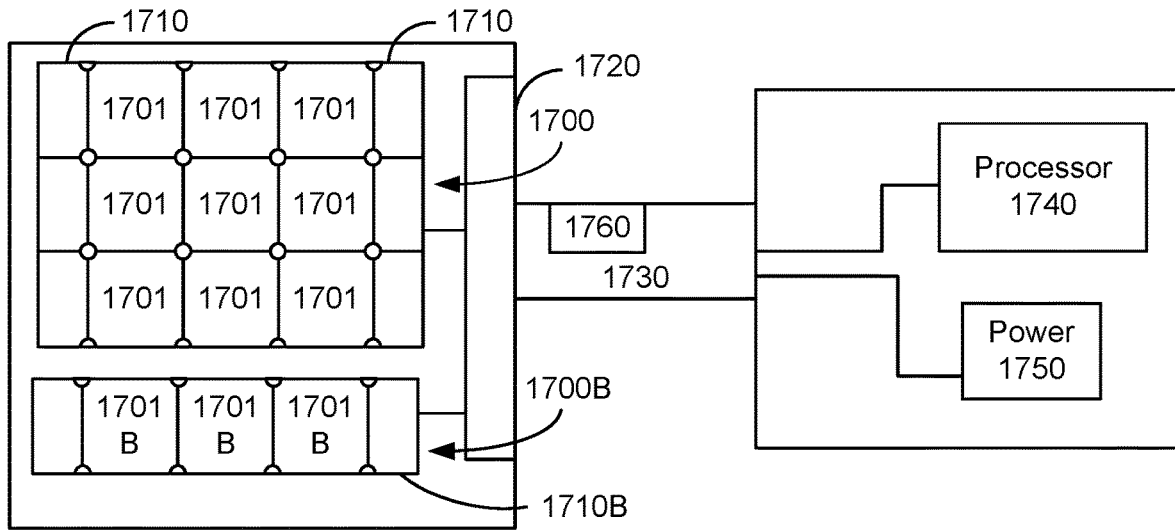

Also shown are processor 1740 and power source 1750 that may be a power management integrated circuit (PMIC) that may be part of the components already present in the mobile or other device in which cooling system 1700 is used. Although shown as distal from cooling system 1700, in some embodiments processor and/or power source 1750 may be cooled using cooling system 1700. Also shown are electronics 1720, interface 1730 and controller 1760. Interface 1730 communicates with processor 1740 and power source 1750, as well as any desired remaining components of the device. For example, interface 1730 may receive signals from temperature sensors located on portions of the device which are desired to be cooled. Power to piezoelectric cooling system 1700 is also provided from power source 1750 via interface 1730. Electronics 1720 includes a communications interface for receiving control signals and addressing circuitry for selectively activating individual cells 1701 or groups of cells 1701. For example, addressing circuitry might include row and column selectors managed by controller 1760. Controller 1760 thus selectively drives cells 1701 via electronics 1720. In some embodiments, software used to control piezoelectric cooling system 1700 is implemented by processor 1740. For example, processor 1740 may implement software used to tune piezoelectric cooling elements to resonance. Thus, individual cells 1701 or groups of cells 1701 can be selectively driven. Further, although a single array 1700 is shown, multiple arrays may be driven using the same electronics 1720, 1730, 1740, 1750 and 1760. Such a system is shown in FIG. 20B, in which array 1700B including cells 1701B is also driven.

Figure 21:
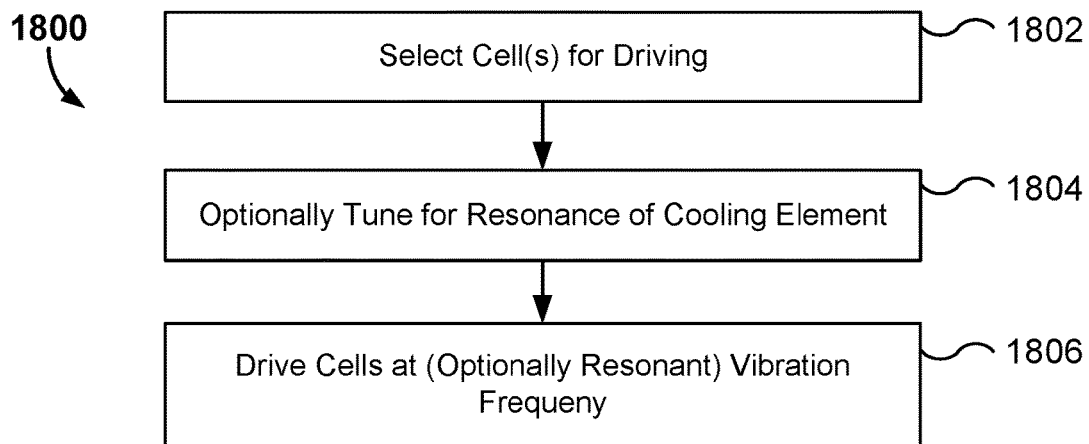
FIG. 21 is a flow chart depicting an exemplary embodiment of a method for operating a cooling system usable with a structure.

FIG. 21 is a flow chart depicting an exemplary embodiment of method 1800 for operating a cooling system. Method 1800 may include steps that are not depicted for simplicity. Method 1800 is described in the context of piezoelectric cooling system 100. However, method 1800 may be used with other cooling systems including but not limited to systems and cells described herein. Method 1800 may be performed using controller 1760 and/or processor 1740.

The cells 101 to be driven are selected for driving at 1802. Thus, some cells in an array may be left dormant or driven at another time. The selection of cells 101 to be driven at 1802 may be based upon heat in a given region, for example as measured by a temperature sensor such as sensor 1263. In some embodiments, an increase in clock speed of a processor is expected to generate heat and thus may be used to proactively select cells 101 in the vicinity of the processor for activation. Thus, the selection of cells 101 to be driven may be based on a clock measurement or a measurement of junction temperature (e.g. a higher junction temperature) that indicates that clock speed is high. Cells 101 selected to be driven may be based upon predicted heat generation for a particular region because of use of certain function(s). For example, in response to a pattern of usage such as video streaming for longer times, daily usage patterns or other activities, processor 1740 may be predicted to generate heat. Based upon this prediction, cells 101 in proximity to the processor may be activated. Accessing certain function(s) which may consume power, use of particular interfaces such as communications interfaces for a mobile or non-mobile device or other activities which have or are expected to generate heat may result in one or more nearby cells 101 being selected for activation at 1802.

If piezoelectric cooling element 110 is to be driven at or near resonance, then the system is optionally tuned for the resonance of cooling element 110, at 1804. In some embodiments, this includes configuring cooling elements 110 to have the appropriate size, material properties, stiffness and robustness to be operated at resonance. In addition, cooling elements 110 are also designed to have a resonance at or around the desired range for driving. For example, if the piezoelectric cooling element is desired to be driven at ultrasonic frequencies (at or above 15 kHz), then piezoelectric cooling element 110 is designed to have a resonance frequency in this range. However, individual piezoelectric cooling elements 110 may have variations in their resonant frequency. As such, 1804 also includes calibrating and adjusting the driving frequency to match a resonant frequency of the piezoelectric cooling elements 110.

One or more of the piezoelectric cooling elements 110 are then driven at the desired frequency, at 1806. At 1806, the amplitude of deflection for cooling elements 110 may be controlled. Thus, a cooling element may but need not be driven at the maximum possible amplitude. Further, if multiple cells 101 are driven, this may be carried out such that certain cells 101 are driven at different phases. For example, adjacent cells may be driven with a particular phase difference including but not limited to being one hundred and eighty degrees out of phase. As part of 1804, power used to drive piezoelectric cooling elements 110 may be reduced once resonance is achieved. The mechanical resonance and under-damping of cooling system 100 may be utilized to reduce, or minimize, power expended in cooling. Thus, sufficient power to maintain vibration of cooling elements 110 at or near the resonance frequency may be maintained. Consequently, piezoelectric cooling elements 110 operate as described above. Method 1800 thus provides for use of piezoelectric cooling systems described herein. Thus, piezoelectric cooling systems may more efficiently and quietly cool semiconductor devices at lower power.

Figure 22:
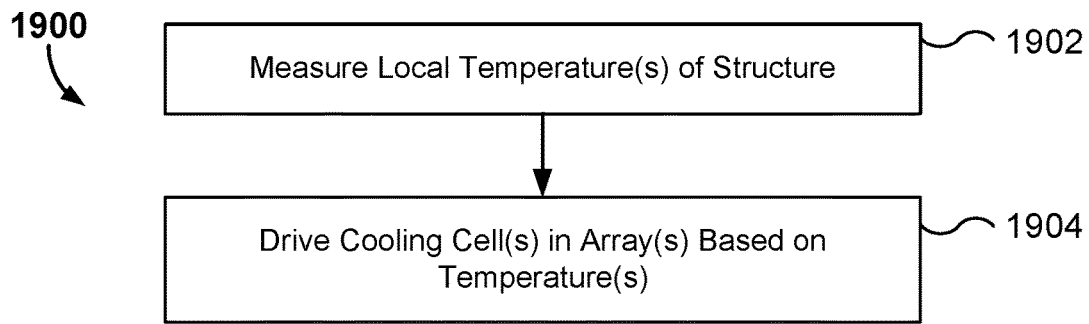
FIG. 22 is a flow chart depicting an exemplary embodiment of a method for operating a cooling system.

FIG. 22 is a flow chart depicting an exemplary embodiment of method 1900 for operating a cooling system. Method 1900 may include steps that are not depicted for simplicity. Method 1900 is described in the context of piezoelectric cooling system 100. However, method 1900 may be used with other cooling systems including but not limited to systems and cells described herein. Method 1900 may also be considered part of method 1800. Method 1900 may be performed using controller 1760 and/or processor 1740.

The local temperatures of portions of the structure/device to be cooled are measured at 1902. For example, the processor subsystems zone temperatures, battery temperature, sensor temperature, active antenna array temperature or other temperature of interest may be measured at 1902.

Based on this temperature, one or more of piezoelectric cooling element 110 in the region is driven at or near resonance, at 1904. At 1904, the amplitude, phase, and other aspects of driving cooling elements 110 may be selected and updated. Further, as piezoelectric cooling system 100 cools the desired structure 130, the voltage, phase, frequency and/or other parameters used in driving cooling elements 110 may be adjusted. Thus, piezoelectric cooling systems may more efficiently and quietly cool semiconductor devices at lower power.

Figure 23:
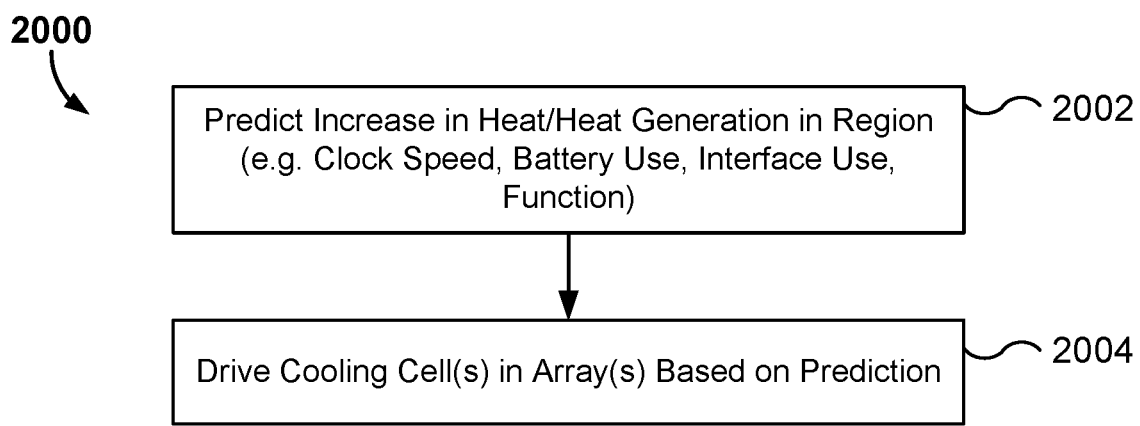
FIG. 23 is a flow chart depicting an exemplary embodiment of a method for operating a cooling system.

FIG. 23 is a flow chart depicting an exemplary embodiment of method 2000 for operating a cooling system. Method 2000 may include steps that are not depicted for simplicity. Method 2000 is described in the context of piezoelectric cooling system 100. However, method 2000 may be used with other cooling systems including but not limited to systems and cells described herein. Method 2000 may be performed using controller 1760 and/or processor 1740.

The cells 101 to be driven are selected for driving based upon heat generated or a prediction of heat generated, at 2002. 2002 may include measuring temperature in the vicinity of the desired components, monitoring processor clock speed, monitoring battery use, monitoring the functions selected for use or other aspects of the device. Based on this information, whether and how to drive cell(s) is determined at 2002. For example, in response to a pattern of video streaming or other activities, heat may be predicted to be generated. Based upon this prediction, cells 101 in proximity to the processor subsystem zones may be activated. Accessing certain function which may consume power, use of particular interfaces such as communications interfaces for a mobile or other device or other activities which have or are expected to generate heat may result in one or more nearby cells 101 being selected for activation at 1802.

The selected piezoelectric cooling element(s) 110 are driven at the desired frequency, at 2004. At 2004, the amplitude of deflection for cooling element(s) 110, driving frequency, phase, and other aspects of operation of piezoelectric cooling system 100 may be controlled. Method 2000 thus provides for use of piezoelectric cooling systems described herein. Thus, piezoelectric cooling systems may more efficiently and quietly cool electronic devices at lower power.

Thus, various embodiments of cooling structures, their components, and method of operations have been disclosed. Various features may be omitted and/or combined in ways not explicitly disclosed herein. As a result, cooling of heat-generating structures may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for cooling a mobile phone comprising:
an active cooling system configured to be disposed in a portion of a mobile phone, the active cooling system including at least one active cooling element configured to drive a fluid using vibrational motion, the fluid being driven at a speed of at least thirty meters per second proximate to at least one heat-generating structure of the mobile phone;
a controller configured to activate the active cooling system in response to heat generated by the at least one heat-generating structure of the mobile phone; and
an interface configured to receive power from a mobile phone power source when the active cooling system is activated;
wherein the active cooling system is not more than five hundred microns thick.

2. The system of claim 1, wherein the at least one heat-generating structure includes at least one of a semiconductor component, a sensor, an antenna and a battery.

3. The system of claim 1, wherein the at least one active cooling element includes a plurality of active cooling elements and wherein the active cooling system includes a plurality of cooling cells including the plurality of active cooling elements.

4. The system of claim 3, wherein the fluid is a liquid and wherein the plurality of active cooling elements directs the liquid toward the at least one heat-generating structure in the mobile phone.

5. The system of claim 3, wherein the fluid is a gas and wherein the plurality of active cooling elements directs the gas toward the at least one heat-generating structure in the mobile phone.

6. A system for cooling a mobile phone comprising:
an active cooling system configured to be disposed in a portion of a mobile phone, the active cooling system including a plurality of active cooling elements configured to drive a fluid at a speed of at least thirty meters per second;
a controller configured to activate the active cooling system in response to heat generated by at least one heat-generating structure of the mobile phone; and
an interface configured to receive power from a mobile phone power source when the active cooling system is activated;
wherein the active cooling system includes a plurality of cooling cells including the plurality of active cooling elements, each of the plurality of active cooling elements having a first side distal from the at least one heat-generating structure and a second side proximal to the at least one heat-generating structure, each of the plurality of active cooling elements being configured to direct the fluid using a vibrational motion from the first side of the cooling element to the second side such that the fluid is incident on a surface for the at least one heat-generating structure to extract heat from the at least one heat-generating structure;
wherein the active cooling system is not more than five hundred microns thick.

7. The system of claim 6 wherein the plurality of cooling cells further includes:
at least one orifice plate having at least one orifice therein, the orifice plate being disposed between the plurality of active cooling elements and the at least one heat-generating structure, wherein the at least one of the plurality of active cooling elements is at least fifty microns and not more than five hundred microns from the orifice plate and wherein the orifice plate is at least fifty microns and not more than five hundred microns from the at least one heat-generating structure.

8. A system for cooling a compute device comprising:
an active cooling system including a plurality of active cooling elements, the active cooling system being not more than five hundred microns thick;
a controller configured to selectively activate at least a portion of the plurality of active cooling elements of the active cooling system in response to heat generated by at least one heat-generating structure of the compute device, the at least a portion of the plurality of active cooling elements using vibrational motion to drive a fluid toward the at least one heat-generating structure at a speed of at least thirty meters per second in response to being activated; and
an interface configured to receive power from a compute device power source when the active cooling system is activated.

9. The system of claim 8, wherein the compute device is a mobile device.

10. The system of claim 8, wherein the compute device is selected from a notebook computer, a tablet, and a mobile phone.

11. A system for cooling a compute device comprising:
an active cooling system including a plurality of active cooling elements, the active cooling system being not more than five hundred microns thick;
a controller configured to selectively activate at least a portion of the plurality of active cooling elements of the active cooling system in response to heat generated by at least one heat-generating structure of the compute device, the at least a portion of the plurality of active cooling elements directing a fluid toward the at least one heat-generating structure at a speed of at least thirty meters per second in response to being activated; and
an interface configured to receive power from a compute device power source when the active cooling system is activated;
wherein each of the plurality of active cooling elements has a first side distal from the at least one heat-generating structure and a second side proximal to the at least one heat-generating structure, each of the plurality of active cooling elements being configured to direct the fluid using the vibrational motion from the first side to the second side such that the fluid is incident on a surface for the at least one heat-generating structure to extract heat from the at least one heat-generating structure.

12. The system of claim 11 wherein the active cooling system further includes:
at least one orifice plate having at least one orifice therein, the at least one orifice plate being disposed between the plurality of active cooling elements and the at least one heat-generating structure, wherein the plurality of active cooling elements is at least fifty microns and not more than five hundred microns from the orifice plate and wherein the orifice plate is at least fifty microns and not more than five hundred microns from the at least one heat-generating structure.

13. A method of cooling a mobile device, comprising:
determining that at least one heat-generating structure of the mobile device generates heat during operation of the mobile device; and
driving an active cooling system in response to a determination that the at least one heat-generating structure generates heat, the active cooling system including a plurality of active cooling elements and configured to be disposed in a portion of the mobile device, the driving including activating at least one of the plurality of active cooling elements to drive a fluid proximate to at least one heat-generating structure of the mobile phone at a speed of at least thirty meters per second using vibrational motion;

wherein the active cooling system is not more than five hundred microns thick.

14. The method of claim 13, wherein the driving further cools the at least one heat-generating structure, the at least one heat-generating structure including at least one of a semiconductor component, a sensor, an antenna and a battery.

15. The method of claim 13, wherein the determining further includes:
predicting that the at least one heat-generating structure will generate heat based upon at least one of a temperature measurement, a clock speed, a usage pattern, and an interface use.

16. The method of claim 13, wherein the determining further includes:
measuring a temperature for the at least one heat-generating structure.

17. A method comprising:
determining that at least one heat-generating structure of the mobile device generates heat during operation of the mobile device; and
driving an active cooling system in response to a determination that the at least one heat-generating structure generates heat, the active cooling system including a plurality of active cooling elements and configured to be disposed in a portion of the mobile device, the driving including activating at least one of the plurality of active cooling elements to drive a fluid at a speed of at least thirty meters per second;

wherein the active cooling system includes a plurality of active cooling elements, each of the plurality of active cooling elements having a first side distal from the at least one heat-generating structure and a second side proximal to the at least one heat-generating structure, each of the plurality of active cooling elements being configured to direct the fluid using the vibrational motion from the first side to the second side such that the fluid is incident on a surface for the heat-generating structure to extract heat from the heat-generating structures;

wherein the active cooling system is not more than five hundred microns thick.

18. The method of claim 17 wherein the mobile device is a mobile phone.

19. The method of claim 17 wherein the piezoelectric cooling system further includes:
at least one orifice plate having at least one orifice therein, the orifice plate being disposed between the plurality of active cooling elements and the at least one heat-generating structure, wherein at least one of the plurality of active cooling elements is at least fifty microns and not more than five hundred microns from the orifice plate and wherein the orifice plate is at least fifty microns and not more than five hundred microns from the at least one heat-generating structure.

* * * * *

UNITED STATES PATENT AND TRADEMARK OFFICE
CERTIFICATE OF CORRECTION

PATENT NO.         : 11,532,536 B2
APPLICATION NO.    : 16/999771
DATED              : December 20, 2022
INVENTOR(S)        : Suryaprakash Ganti and Seshagiri Rao Madhavapeddy It is certified that error appears in the above-identified patent and that said Letters Patent is hereby corrected as shown below:

On the Title Page
In page 3, Column 2, item (56), other publications, cite no. 1, delete "Microsyslems" and insert --Microsystems--, therefor.

In the Specification
In Column 30, Line(s) 18, delete "12301" and insert --1230I--, therefor.
In Column 30, Line(s) 21, delete "12601" and insert --1260I--, therefor.
In Column 31, Line(s) 8, delete "12301" and insert --1230I--, therefor.
In Column 31, Line(s) 45, delete "it," and insert --$\phi$--, therefor.

In the Claims
In Column 37, Line(s) 60, Claim 7, after "claim 6", insert --,--.
In Column 38, Line(s) 50, Claim 12, after "claim 11", insert --,--.
In Column 40, Line(s) 14 & 15, Claim 17, after "heat-generating", delete "structures" and insert --structure--, therefor.
In Column 40, Line(s) 18, Claim 18, after "claim 17", insert --,--.
In Column 40, Line(s) 20, Claim 19, after "claim 17", insert --,--.

Signed and Sealed this
Nineteenth Day of September, 2023

*Katherine Kelly Vidal*

Katherine Kelly Vidal
*Director of the United States Patent and Trademark Office*